(12) United States Patent
Park et al.

(10) Patent No.: US 12,426,461 B2
(45) Date of Patent: Sep. 23, 2025

(54) DISPLAY PANEL AND ELECTRIC APPARATUS

(71) Applicant: Samsung Display Co., Ltd., Yongin-si (KR)

(72) Inventors: Hyunae Park, Yongin-si (KR); Okkyung Park, Yongin-si (KR); Changsik Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 432 days.

(21) Appl. No.: 17/960,677

(22) Filed: Oct. 5, 2022

(65) Prior Publication Data
US 2023/0108100 A1 Apr. 6, 2023

(30) Foreign Application Priority Data
Oct. 6, 2021 (KR) .................. 10-2021-0132690

(51) Int. Cl.
*H10K 59/131* (2023.01)
*H10D 86/40* (2025.01)
(Continued)

(52) U.S. Cl.
CPC ......... *H10K 59/131* (2023.02); *H10D 86/441* (2025.01); *H10D 86/60* (2025.01); *H10K 59/1213* (2023.02); *H10K 59/122* (2023.02); *H10K 2102/101* (2023.02); *H10K 2102/311* (2023.02)

(58) Field of Classification Search
CPC . H10K 59/121; H10K 59/1213; H10K 59/131
See application file for complete search history.

(56) References Cited

U.S. PATENT DOCUMENTS 9,690,967 B1 6/2017 Brundage et al.
11,862,081 B2 * 1/2024 Cheng .................. H10K 59/131
(Continued)

FOREIGN PATENT DOCUMENTS

| CN | 110767720 A | 2/2020 |
|----|-------------|--------|
| CN | 111063719 A | 4/2020 |
| CN | 111180494 A | 5/2020 |

*Primary Examiner* — Mariceli Santiago
(74) *Attorney, Agent, or Firm* — Womble Bond Dickinson (US) LLP

(57) ABSTRACT

A display panel includes: a display area including: a first display area having a plurality of first light-emitting elements; a second display area having a plurality of second light-emitting elements and a transmission area; and a third display area having a plurality of third light-emitting elements; a peripheral area at an outer side of the display area and comprising a bending area; a plurality of first sub-pixel circuits in the first display area and electrically connected to the plurality of first light-emitting elements, respectively; a plurality of second sub-pixel circuits electrically connected to the plurality of second light-emitting elements, respectively; and a plurality of third pixel circuits electrically connected to the plurality of third light-emitting elements, respectively, wherein the plurality of second sub-pixel circuits are in the peripheral area, and the bending area is between the plurality of second sub-pixel circuits and the display area.

25 Claims, 33 Drawing Sheets

(51) Int. Cl.
  *H10D 86/60*  (2025.01)
  *H10K 59/121*  (2023.01)
  *H10K 59/122*  (2023.01)
  *H10K 102/00*  (2023.01)
  *H10K 102/10*  (2023.01)

(56) References Cited

U.S. PATENT DOCUMENTS

2020/0052048 A1* 2/2020 Kuo .................. G06F 1/1605
2021/0327972 A1 10/2021 Lou et al.
2022/0069047 A1* 3/2022 Yang .................. H10K 59/131
2022/0208100 A1* 6/2022 Jung .................. G09G 3/3233
2022/0415996 A1* 12/2022 Jeong .................. H10K 59/123

* cited by examiner

DISPLAY PANEL AND ELECTRIC APPARATUS

CROSS-REFERENCE TO RELATED APPLICATION

The present application claims priority to and the benefit of Korean Patent Application No. 10-2021-0132690, filed on Oct. 6, 2021, in the Korean Intellectual Property Office, the entire disclosure of which is incorporated herein by reference.

BACKGROUND

1. Field

Aspects of some embodiments of the present disclosure relate to a configuration regarding a display panel and an electric apparatus including the same.

2. Description of the Related Art

A display panel is a device that visually displays data, and which may be utilized in various applications. Also, as the thickness and weight of display panels have been reduced, the range of use of the display panels has widened.

To add various functions while increasing areas occupied by display areas, research has been conducted into display panels in which functions other than an image display function may be added to the inside of display areas.

The above information disclosed in this Background section is only for enhancement of understanding of the background and therefore the information discussed in this Background section does not necessarily constitute prior art.

SUMMARY

Aspects of one or more embodiments include a display panel including a transmission area in a display area, and an electric apparatus including the display panel.

However, this is merely an example, and one or more embodiments of the disclosure are not limited thereto.

Additional aspects will be set forth in part in the description which follows and, in part, will be apparent from the description, or may be learned by practice of the presented embodiments of the disclosure.

According to one or more embodiments of the present disclosure, a display panel includes a display area including a first display area, where first light-emitting elements are arranged, a second display area, where second light-emitting elements and a transmission area are arranged, and a third display area, where third light-emitting elements are arranged; a peripheral area arranged on an outer side of the display area and including a bending area; first sub-pixel circuits arranged in the first display area and electrically connected to the first light-emitting elements, respectively; second sub-pixel circuits electrically connected to the second light-emitting elements, respectively, third pixel circuits electrically connected to the third light-emitting elements, respectively, wherein the second sub-pixel circuits are arranged in the peripheral area, and the bending area is located between the second sub-pixel circuits and the display area.

According to some embodiments, the plurality of third pixel circuits may be arranged in the third display area.

According to some embodiments, at least some of the plurality of third pixel circuits may be arranged in the peripheral area.

According to some embodiments, the display panel may further include a buffer layer arranged in the display area and the peripheral area, an inorganic insulating layer arranged on the buffer layer, and a planarization layer arranged on the inorganic insulating layer, wherein the inorganic insulating layer may include a first opening corresponding to the bending area.

According to some embodiments, at least a portion of the planarization layer may be buried in the first opening.

According to some embodiments, the display panel may further include a pixel-defining layer arranged on the planarization layer and including a light-shielding material, wherein the pixel-defining layer may include a second opening corresponding to the bending area.

According to some embodiments, the plurality of second sub-pixel circuits may be electrically connected to the plurality of second light-emitting elements by a plurality of first conductive bus lines crossing the bending area, which is between the peripheral area and the second display area, and the third display area.

According to some embodiments, the plurality of first conductive bus lines may include a first conductive line in the bending area and a second conductive line other than the first conductive line, and the first conductive line may include a different material from the second conductive line.

According to some embodiments, the first conductive line may have a higher conductivity than the second conductive line, and the second conductive line may have a higher light transmittance than the first conductive line.

According to some embodiments, the first conductive line may include a metal material, and the second conductive line may include transparent conducting oxide.

According to some embodiments, the first conductive line may include at least one of aluminum (Al) or titanium (Ti).

According to some embodiments, the first conductive line and the second conductive line may be arranged on different layers with an insulating layer therebetween and be connected to each other through a contact hole defined in the insulating layer in the peripheral area that is adjacent to the bending area.

According to some embodiments, the display panel may further include a notch portion on one side of the peripheral area.

According to some embodiments, when the bending area is bent, the notch portion may correspond to the second display area.

According to some embodiments, the plurality of first sub-pixel circuits may be arranged in the first display area, the plurality of second sub-pixel circuits may be arranged in the third display area, and the plurality of third sub-pixel circuits may be arranged in the peripheral area.

According to some embodiments, the plurality of second sub-pixel circuits may be electrically connected to the plurality of second light-emitting elements by the plurality of first conductive bus lines arranged over the second display area and the third display area.

According to some embodiments, the plurality of third sub-pixel circuits may be electrically connected to the plurality of third light-emitting elements by a plurality of second conductive bus lines crossing the bending area that is between the peripheral area and the third display area.

According to one or more embodiments of the present disclosure, provided is an electric apparatus including a display panel including a first display area, where a plurality of first light-emitting elements are arranged, a second display area, where a plurality of second light-emitting elements and a transmission area are arranged, and a third display area, where a plurality of third light-emitting elements are arranged, and a component overlapping the transmission area of the display panel, wherein the display panel includes a plurality of first sub-pixel circuits arranged in the first display area and electrically connected to the plurality of first light-emitting elements, respectively, a plurality of second sub-pixel circuits electrically connected to the plurality of second light-emitting elements, respectively, and a plurality of third sub-pixel circuits electrically connected to the plurality of third light-emitting elements, respectively, wherein the plurality of second sub-pixel circuits are arranged in the peripheral area, and the bending area is between the plurality of second sub-pixel circuits and the display area.

According to some embodiments, the electric apparatus may further include a buffer layer in the display area and the peripheral area, an inorganic insulating layer arranged on the buffer layer, and a planarization layer arranged on the inorganic insulating layer, wherein the inorganic insulating layer may include a first opening corresponding to the bending area.

According to some embodiments, at least a portion of the planarization layer may be buried in the first opening.

According to some embodiments, the electric apparatus may further include a pixel-defining layer arranged on the planarization layer and including a light-shielding material, wherein the pixel-defining layer may include a second opening corresponding to the bending area.

According to some embodiments, the plurality of second light-emitting elements may be electrically connected to the plurality of second sub-pixel circuits by a plurality of first conductive bus lines crossing the bending area that is between the peripheral area and the second display area.

According to some embodiments, the plurality of first conductive bus lines may include a first conductive line in the bending area and a second conductive line other than the first conductive line, and the first conductive line may include a different material from the second conductive line.

According to some embodiments, the first conductive line may have a higher conductivity than the second conductive line, and the second conductive line may have a higher light transmittance than the first conductive line.

According to some embodiments, the first conductive line may include a metal material, and the second conductive line may include transparent conducting oxide.

Other aspects, features, and characteristics other than those described above will become more apparent from the following detailed description, claims and drawings for carrying out the disclosure.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
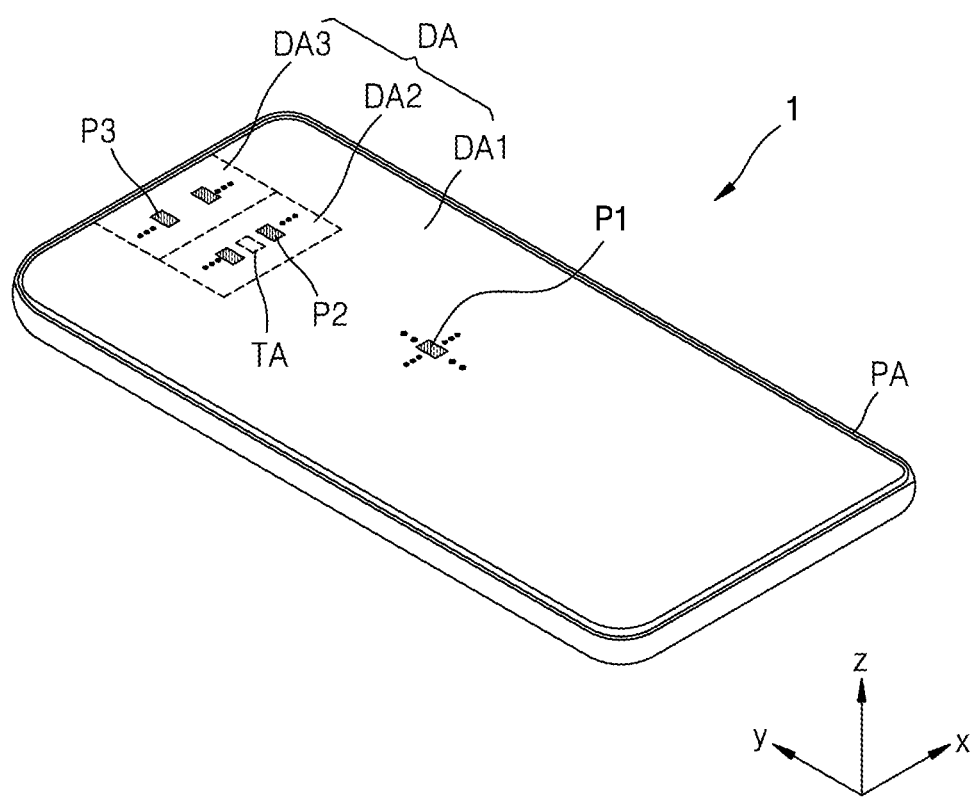
FIG. 1 is a schematic perspective view of an electric apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating aspects of some embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, the present invention will be described in more detail by explaining aspects of some embodiments of the invention with reference to the attached drawings. Like reference numerals in the drawings denote like elements, and thus their description will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

It will be understood that when a layer, region, or component is referred to as being connected to another layer, region, or component, it can be directly and/or indirectly connected to the other layer, region, or component. That is, for example, intervening layers, regions, or components may be present. It will be understood that when a layer, region, or component is referred to as being electrically connected to another layer, region, or component, it can be electrically and directly and/or indirectly connected to the other layer, region, or component. That is, for example, intervening layers, regions, or components may be present.

In the present specification, the expression "A and/or B" indicates A, B, or both A and B. The expression "at least one of A and B" indicates A, B, or both A and B.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. In other words, since sizes and thicknesses of components in the drawings are arbitrarily illustrated for convenience of explanation, the following embodiments are not limited thereto.

FIG. 1 is a schematic perspective view of an electric apparatus, according to some embodiments.

Referring to FIG. 1, an electric apparatus 1 may include a display area DA and a peripheral area PA on an outer side our outside (e.g., outside a footprint) of the display area DA. In the display area DA, images may be displayed through sub-pixels. The peripheral area PA may be on the outer side of the display area DA and may operate as a non-display area where no images are displayed. The peripheral area PA may entirely surround the display area DA. In the peripheral area PA, a driver, etc. for providing an electrical signal or power to the display area DA may be arranged. A pad may be arranged in the peripheral area PA, wherein the pad is an area where an electrical element, a printed circuit board, etc. may be electrically connected.

Hereinafter, a case where the electric apparatus 1 is a smartphone is described for convenience of explanation, but the electric apparatus 1 is not limited thereto. The electric apparatus 1 may be applied to various products, for example, a portable electric apparatus such as a mobile phone, a smartphone, a tablet Personal Computer (PC), a mobile communication terminal, a personal digital assistant, an e-book terminal, a Portable Multimedia Player (PMP), a navigation device, or an Ultra Mobile PC (UMPC), a television (TV), a laptop, a monitor, a billboard, an Internet of Things (IoT) device, and the like. Also, the electric apparatus 1 according to some embodiments may be applied to a wearable device such as a smartwatch, a watch phone, an eyewear display, or a head-mounted display (HMD). Also, the electric apparatus 1 may be applied to a display screen in an instrument cluster of a vehicle, a Center Information Display (CID) mounted on a center fascia or a dashboard of a vehicle, a room mirror display replacing a side-view mirror of a vehicle, or a car headrest monitor provided for rear-seat entertainment.

The display area DA may include a first display area DA1, a second display area DA2, and a third display area DA3. An image may be displayed using a plurality of first sub-pixels P1, which are two-dimensionally arranged, in the first display area DA1, an image may be displayed using a plurality of second sub-pixels P2 in the second display area DA2, an image may be displayed using a plurality of third sub-pixels P3 in the third display area DA3.

According to some embodiments, a first image may be provided using light emitted from the first sub-pixels P1 in the first display area DA1, a second image may be provided using light emitted from the second sub-pixels P2 in the second display area DA2, and a third image may be provided using light emitted from the third sub-pixels P3 in the third display area DA3. The first image, the second image, and the third image may be portions of any one image provided by the electric apparatus 1. According to some embodiments, at least any one of the first to third images may be provided as an image different from the others of the first to third images.

That is, according to some embodiments, pixels in the first display area DA1, the second display area DA2, and the third display area DA3 may work in coordination to display portions of an image, where the portion displayed in the first display area DA1, the portion displayed in the second display area DA2, and the portion displayed in the third display area DA3 collectively form a single or cohesive image. Additionally, the pixels in the first display area DA1, the second display area DA2, and the third display area DA3 may operate independently from the pixels in the other display area, such that different or distinct (i.e., independent) images are displayed in the different display areas.

The first display area DA1 may occupy most of the display area DA. The second display area DA2 may be arranged inside the display area DA. The third display area DA3 may be adjacent to the second display area DA2 and between the peripheral area PA and the second display area DA2. According to some embodiments, FIG. 1 illustrates that the second display area DA2 is arranged on an upper center portion of the display area DA, and the third display area DA3 is arranged between the second display area DA2 and the peripheral area PA in one direction (e.g., a +y direction).

Areas of the second display area DA2 and the third display area DA3 may be less than that of the first area DA1, and the second display area DA2 and the third display area DA3 may be partially surrounded by the first display area DA1. For example, the first display area DA1 may have a notch shape that is substantially U-shaped, and because the second display area DA2 and the third display area DA3 are arranged in the notch portion of the first display area DA1, a shape of the display area DA may be substantially a rectangle.

FIG. 1 illustrates that, when viewed in a direction substantially perpendicular to an upper surface of the electric apparatus 1 (e.g., in a plan view), the second display area DA2 and the third display area DA3 are arranged on the upper center portion of the display area DA having a substantially rectangular shape, but one or more embodiments are not limited thereto. The second display area DA2 may be, for example, arranged on an upper right portion or an upper left portion of the display area DA, and even in this case, the third display area DA3 may be between the second display area DA2 and the peripheral area PA.

The second display area DA2 may include a transmission area TA. The transmission area TA may be between the second sub-pixels P2 and an area where light and/or sound may penetrate, and in the second display area DA2, a component 20 (of FIG. 2) may be arranged as illustrated in FIG. 2.

Because the second display area DA2 includes the transmission area TA, a resolution of the first display area DA1 may be different from that of the second display area DA2. According to some embodiments, the second display area DA2 may have a lower resolution than the first display area DA1. The number of second sub-pixels P2, which may be arranged in the same area in the second display area DA2, may be less than the number of first sub-pixels P1, which are arranged in the same area in the first display area DA1. For example, the resolution of the second display area DA2 may be about ½, ⅜, ⅓, ¼, ⅔, ⅛, ⅑, 1/16, or the like of the resolution of the first display area DA1. For example, the resolution of the first display area DA1 may be equal to or greater than about 450 ppi, and the resolution of the second display area DA2 may be between about 100 ppi and about 200 ppi.

A resolution of the third display area DA3 may be the same as that of the second display area DA2. Alternatively, the resolution of the third display area DA3 may be greater than that of the second display area DA2 and less than that of the first display area DA1. For example, the resolution of the third display area DA3 may be between about 100 ppi and about 200 ppi or between about 200 ppi and about 400 ppi.

Figure 2A:
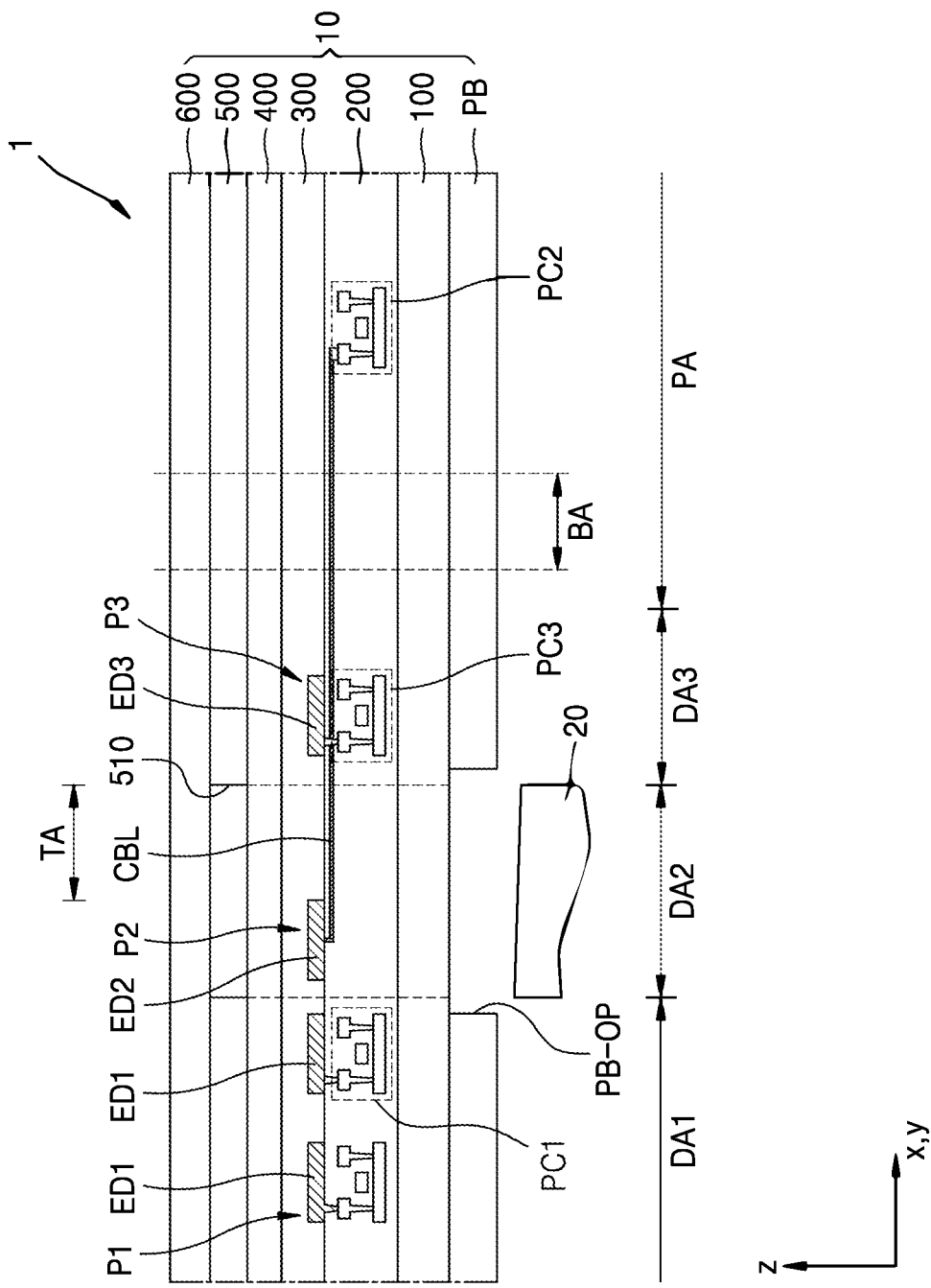
FIGS. 2A to 2C are schematic cross-sectional views of an electric according to some embodiments.
Figure 2B:
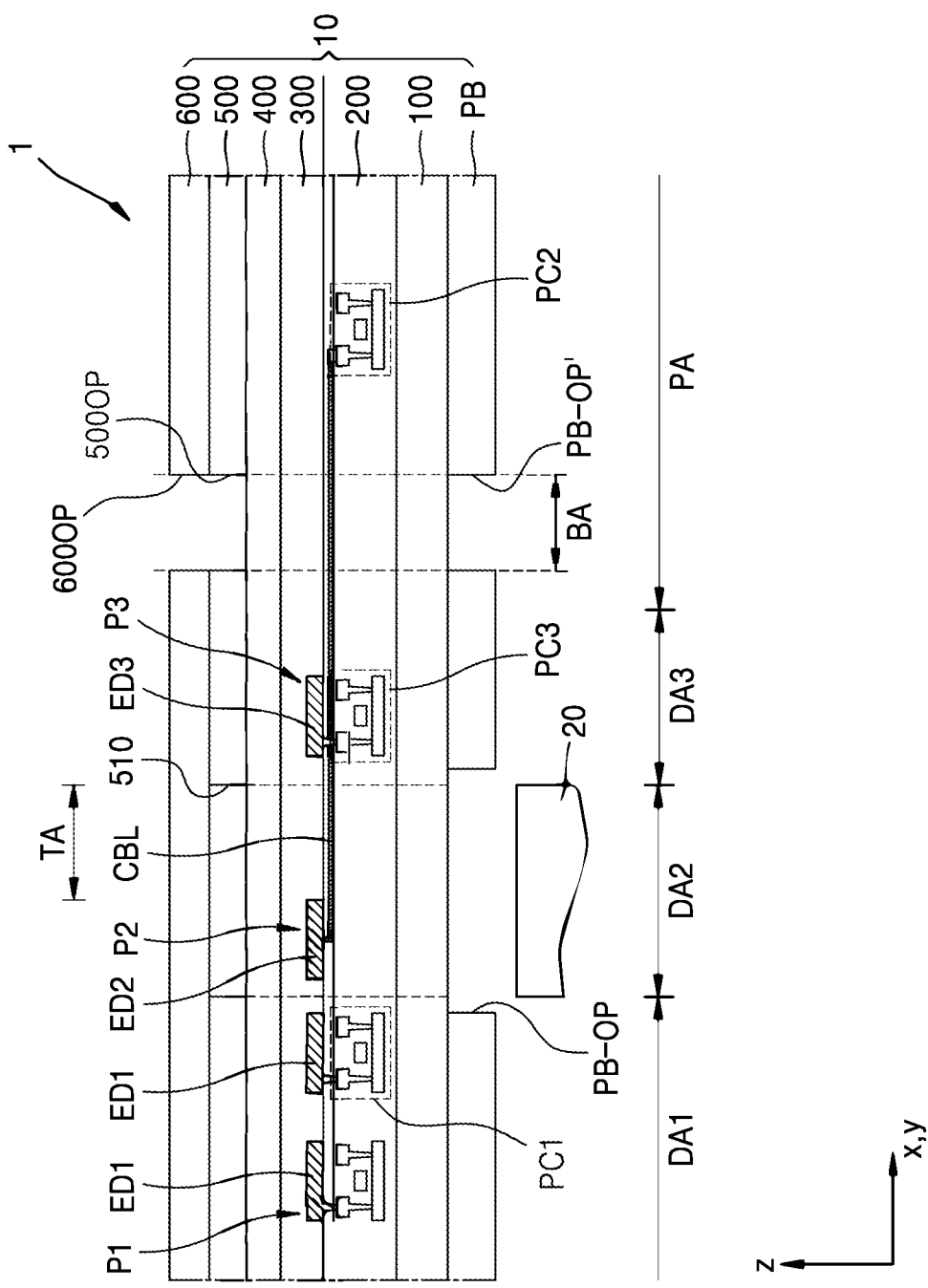
Figure 2C:
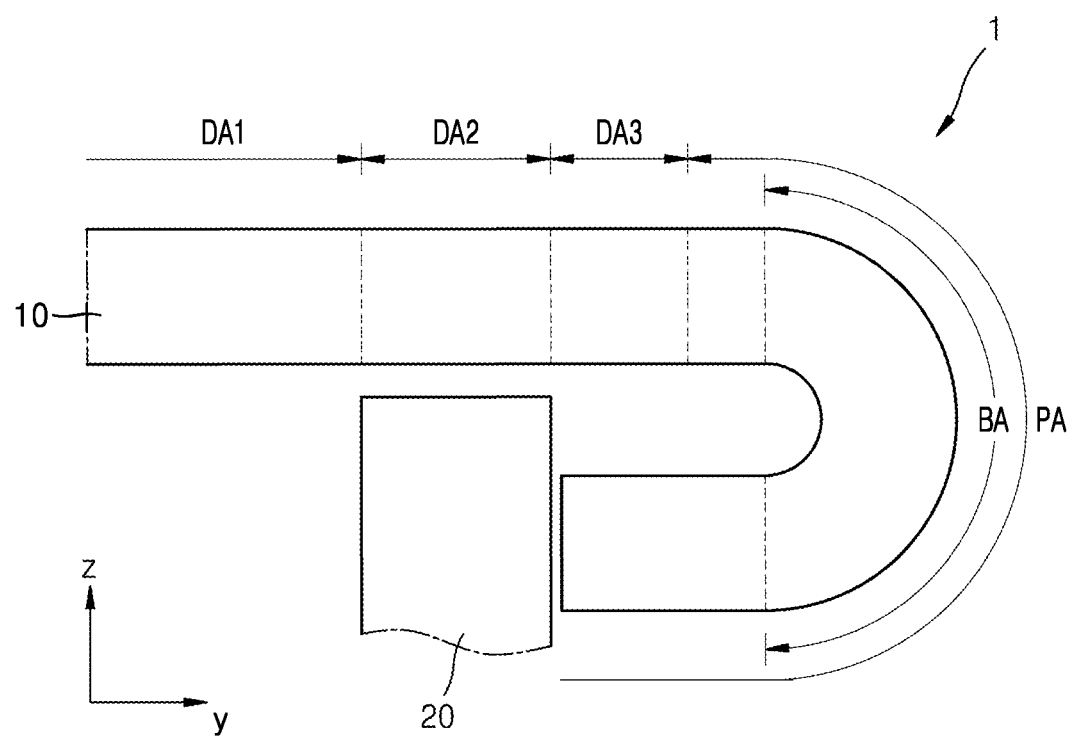

FIGS. 2A to 2C are schematic cross-sectional views of an electric apparatus according to some embodiments.

Referring to FIGS. 2A and 2B, the electric apparatus 1 may include a display panel 10 and the component 20 overlapping the display panel 10. The component 20 may be arranged in the second display area DA2. FIGS. 2A and 2B illustrate a state before at least a portion of the display panel 10 is bent. FIG. 2C illustrates a state after at least a portion of the display panel 10 is bent in a bending area BA.

The component 20 may be an electronic component using light or sound. For example, an electronic component may be a sensor, e.g., a proximity sensor, which measures a distance, a sensor for recognizing a body part of a user (e.g., fingerprints, an iris, faces, etc.), a small lamp for outputting light, an image sensor (e.g., a camera) for capturing images, or the like. An electronic component using light may use light in various wavelength bands, for example, visible rays, infrared rays, ultraviolet rays, and the like. An electronic component using sound may use ultrasound or light in a different frequency band.

To make the component 20 smoothly work, the second display area DA2 may include the transmission area TA where light and/or sound output to the outside from the component 20 or traveling towards the component 20 from the outside may penetrate. According to some embodiments, the transmission area TA may be an area where light may penetrate and no sub-pixels P are arranged. In the case of the electric apparatus 1, when light penetrates through the second display area DA2 including the transmission area TA, the transmittance of the light may be equal to or greater than about 10%, more preferably, equal to or greater than about 25%, 40%, 50%, 85%, or 90%.

Each of the first to third sub-pixels P1 to P3 described above with reference to FIG. 1 may emit light by using a light-emitting element (or a light-emitting diode), and each light-emitting element may be arranged in the display area DA (of FIG. 1) of the display panel 10. FIGS. 2A and 2B illustrate that a first light-emitting element ED1 corresponding to the first sub-pixel P1, a second light-emitting element ED2 corresponding to the second sub-pixel P2, and a third light-emitting element ED3 corresponding to the third sub-pixel P3 are arranged on the substrate 100.

The substrate 100 may include an insulating material such as a glass material or polymer resin, and a protective film PB may be arranged on a rear surface of the substrate 100. The substrate 100 may be a rigid substrate or a flexible substrate that is bendable, foldable, or rollable. The protective film PB may include an opening PB-OP in the second display area DA2 to improve the transmittance of the transmission area TA.

The first light-emitting element ED1 is arranged in the first display area DA1 and electrically connected to the first sub-pixel circuit PC1 arranged in the first display area DA1. The first sub-pixel circuit PC1 may include transistors and a storage capacitor electrically connected to the transistors.

The second light-emitting element ED2 is arranged in the second display area DA2. The second light-emitting element ED2 is electrically connected to the second sub-pixel circuit PC2, but the second sub-pixel circuit PC2 is not arranged in the second display area DA2 to improve the transmittance of the transmission area TA arranged in the second display area DA2 and to increase a light transmission area of the transmission area TA. According to some embodiments, the second sub-pixel circuit PC2 may be arranged in the peripheral area PA, and the second light-emitting element ED2 may be electrically connected to the second sub-pixel circuit PC2 through a conductive bus line CBL.

The conductive bus line CBL may extend to connect the second sub-pixel circuit PC2 in the peripheral area PA to the second light-emitting element ED2 in the second display area DA2. Because the conductive bus line CBL passes the transmission area TA in the second display area DA2, the conductive bus line CBL may include a material with high light transmittance. The conductive bus line CBL may include a light-transmissive material, for example, Transparent Conducting Oxide (TCO).

The third light-emitting element ED3 is arranged in the third display area DA3 and electrically connected to the third sub-pixel circuit PC3 in the third display area DA3. The third sub-pixel circuit PC3 may include transistors and a storage capacitor electrically connected to the transistors. According to some embodiments, some portions of the third sub-pixel circuit PC3 electrically connected to the third light-emitting element ED3 may be in the third display area DA3, and other portions of the third sub-pixel circuit PC3 may be in the peripheral area PA.

The first to third light-emitting elements ED1 to ED3 may each be a light-emitting element that emits light of a certain color and include an organic light-emitting diode. According to some embodiments, the first to third light-emitting elements ED1 to ED3 may include inorganic light-emitting diodes or light-emitting diodes including quantum dots.

The first to third light-emitting elements ED1 to ED3 may be covered by an encapsulation layer 300. The encapsulation layer 300 may include an inorganic encapsulation layer including an inorganic insulating material and an organic encapsulation layer including an organic insulating material. According to some embodiments, the encapsulation layer 300 may include first and second inorganic encapsulation layers and an organic encapsulation layer therebetween.

The encapsulation layer 300 may be an encapsulation substrate such as a glass material. A sealant including frit, etc. may be arranged between the substrate 100 and the encapsulation substrate. The sealant may be arranged in the peripheral area PA and extend to surround the display area DA (see FIG. 1). Thus, the sealant may prevent moisture from penetrating the first to third light-emitting elements ED1 to ED3 through side surfaces of the display panel.

An input detection layer 400 may be formed on the encapsulation layer 300. The input detection layer 400 may obtain coordinate information according to an external input, for example, a touch event from an object such as a finger or a stylus pen. The input detection layer 400 may include a touch electrode and trace lines connected to the touch electrode. The input detection layer 400 may detect an external input in a mutual cap manner and/or a self-cap manner.

An optical functional layer 500 may include a reflection prevention layer. The reflection prevention layer may decrease the reflectivity of light (external light) that is incident to the display panel 10 from the outside through a cover window 600. The reflection prevention layer may include a retarder and a polarizer. As the optical functional layer 500 includes an opening 510 in the second display area DA2, the transmittance of the transmission area TA may be improved.

According to some embodiments, the reflection prevention layer may include a black matrix and color filters. The color filters may be arranged by considering colors of light respectively emitted from the first to third light-emitting elements ED1 to ED3. According to some embodiments, the reflection prevention layer may include a destructive interference structure. The destructive interference structure may include a first reflection layer and a second reflection layer arranged on different layers. First reflection light and second reflection light, which are respectively reflected from the first reflection layer and the second reflection layer, may destructively interfere with each other, and the reflectivity of external light may decrease accordingly.

The cover window 600 may be arranged on the optical functional layer 500. The cover window 600 may adhere to the optical functional layer 500 by an adhesive layer such as an optically clear adhesive located between the cover window 600 and the optical functional layer 500. The cover window 600 may include a glass material or a plastic material. The plastic material may include polyethersulfone, polyacrylate, polyether imide, polyethylene naphthalate, polyethylene terephthalate, polyphenylene sulfide, polyarylate, polyimide, polycarbonate, cellulose acetate propionate, or the like.

The cover window 600 may include a flexible cover window. For example, the cover window 600 may include a polyimide cover window or an ultra-thin glass cover window.

The peripheral area PA adjacent to the third display area DA3 may include the bending area BA. The bending area BA may be between the third display area DA3 and the second sub-pixel circuit PC2 in the peripheral area PA. The bending area BA may be understood as an area where a portion of the substrate 100 corresponding to the peripheral area PA is bent.

FIG. 2C illustrates a shape of the display panel 10 in which the bending area BA of FIGS. 2A and 2B is bent. As illustrated in FIG. 2C, as the display panel 10 is bent with respect to the bending area BA, a width of the peripheral area PA, which is viewed by a user, may decrease. As described above, because the second sub-pixel circuit PC2 for allowing the emission of the second light-emitting element ED2 is arranged in the peripheral area PA, the width of the peripheral area PA adjacent to the third display area DA3 may increase. According to some embodiments, as the peripheral area PA adjacent to the third display area DA3 is bent along the bending area BA, the width of the peripheral area PA may greatly decrease. In this case, in some embodiments, a portion of the peripheral area PA may overlap, for example, the third display area DA3.

As illustrated in FIG. 2A, the protective film PB, the optical functional layer 500, and the cover window 600 may be arranged corresponding to the bending area BA. Alternatively, to improve the bending flexibility in the bending area BA, the protective film PB, the optical functional layer 500, and the cover window 600 may respectively include open portions PB-OP', 500OP, and 600OP, from which at least some portions of the protective film PB, the optical functional layer 500, and the cover window 600 are removed, as illustrated in FIG. 2B. According to some embodiments, there may be only some of the open portions PB-OP', 500OP, and 600OP of the protective film PB, the optical functional layer 500, and the cover window 600.

Figure 3:
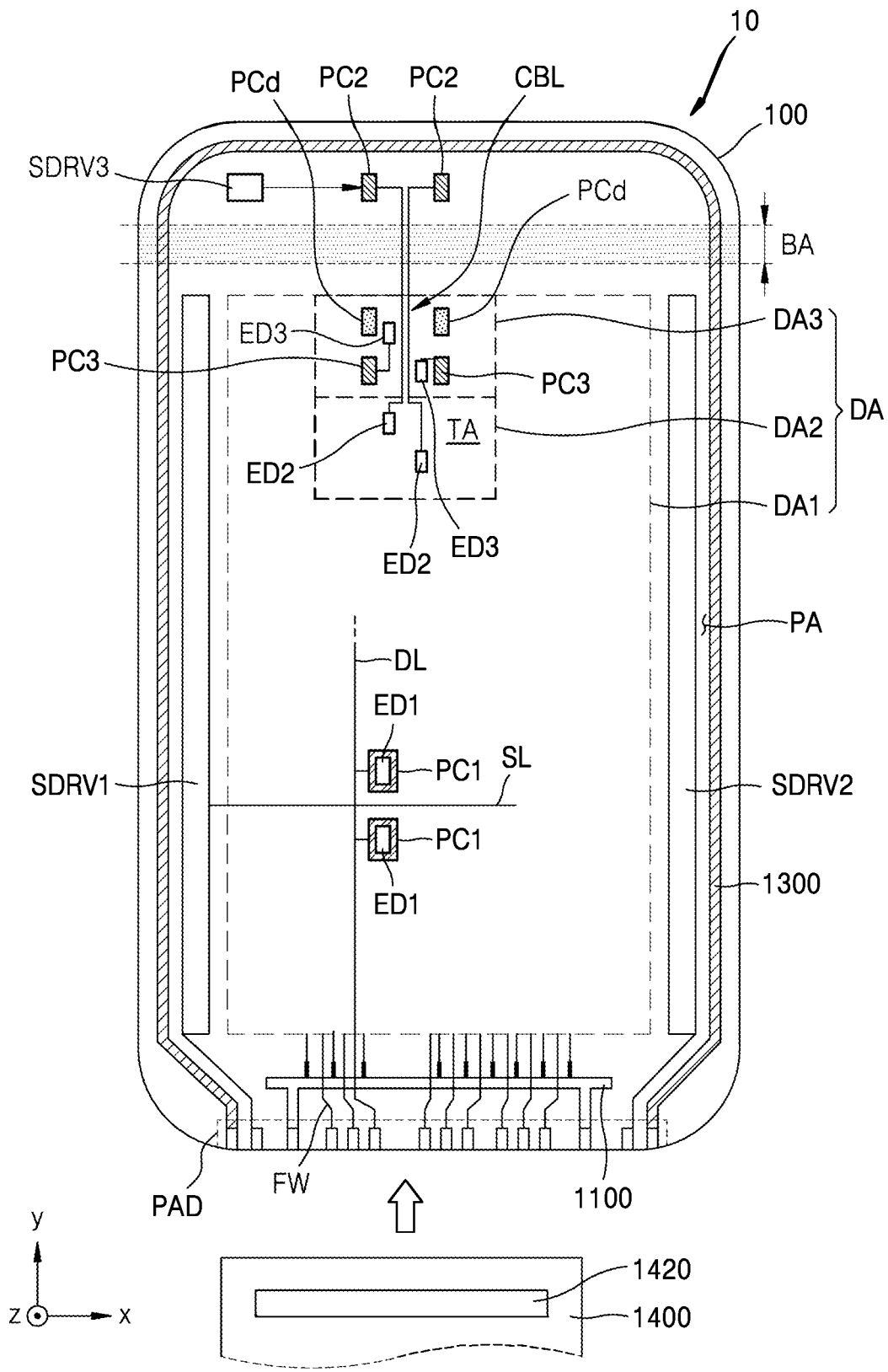
FIG. 3 is a schematic plan view of a display panel according to some embodiments.

FIG. 3 is a schematic plan view of a display panel according to some embodiments.

Referring to FIG. 3, the first light-emitting element ED1 is arranged in the first display area DA1. Light emitted from the first light-emitting element ED1 may correspond to light from the first sub-pixel P1 (of FIG. 1) described with reference to FIG. 1, and a location of the first light-emitting element ED1 may be that of the first sub-pixel P1 (of FIG. 1). The first light-emitting element ED1 may emit, for example, red, green, or blue light. The first sub-pixel circuit PC1 for driving the first light-emitting element ED1 may be arranged in the first display area DA1 and electrically connected to the first light-emitting element ED1.

The first sub-pixel circuit PC1 may be electrically connected to a scan line SL extending in a first direction (e.g., an x direction) and a data line DL extending in a second direction (e.g., a y direction). In the peripheral area PA, a first scan driving circuit SDRV1 and a second scan driving circuit SDRV2 for providing signals to the first sub-pixel circuit PC1 may be arranged.

The first scan driving circuit SDRV1 may be configured to apply a scan signal to each first sub-pixel circuit PC1 through the scan line SL. The second scan driving circuit SDRV2 may be arranged on an opposite side to the first scan driving circuit SDRV1 with respect to the first display area DA1. Some of the first sub-pixel circuits PC1 in the first display area DA1 may be electrically connected to the first scan driving circuit SDRV1, and others thereof may be electrically connected to the second scan driving circuit SDRV2.

A pad PAD may be arranged on a side of the substrate 100. The pad PAD may not be covered by an insulating layer and exposed and thus may be connected to a circuit board 1400. On the circuit board 1400, a control driver 1420 including a data driving circuit may be arranged.

The control driver 1420 may generate control signals transmitted to the first scan driving circuit SDRV1 and the second scan driving circuit SDRV2. The control driver 1420 may include the data driving circuit, and the data driving circuit may generate data signals. The generated data signals may be transmitted to the first sub-pixel circuits PC1 through a fanout line FW arranged in the peripheral area PA of the display panel 10 and the data line DL connected to the fanout line FW.

The second light-emitting element ED2 is arranged in the second display area DA2. Light emitted from the second light-emitting element ED2 may correspond to light from the second sub-pixel P2 (of FIG. 1) described with reference to FIG. 1, and a location of the second light-emitting element ED2 may be that of the second sub-pixel P2 (of FIG. 1). The second light-emitting element ED2 may emit, for example, red, green, or blue light. As described above with reference to FIG. 1, the resolution of the second display area DA2 may be less than that of the first display area DA1, and thus, the number of second light-emitting elements ED2 arranged in the same area in the second display area DA2 may be less than the number of first light-emitting elements ED1 arranged in the same area in the first display area DA1.

The transmission area TA may be between the second light-emitting elements ED2. According to some embodiments, a portion of the second display area DA2, in which the second light-emitting elements ED2 are not arranged, may correspond to the transmission area TA. To increase an area and the transmittance of the transmission area TA, the second sub-pixel circuit PC2 for driving the second light-emitting elements ED2 may be arranged in the peripheral area PA outside the display area DA. FIG. 3 illustrates that the second sub-pixel circuits PC2 are arranged on a portion of the peripheral area PA that is on an upper portion of the display area DA.

The second sub-pixel circuit PC2 may be electrically connected to a third scan driving circuit SDRV3. A scan signal generated by the third scan driving circuit SDRV3 may be applied to the second sub-pixel circuit PC2 through a scan line electrically connected to the second sub-pixel circuit PC2. The second sub-pixel circuit PC2 may be electrically connected to any one of data lines connected to the first sub-pixel circuit PC1 arranged in the first display area DA1, which is described below with reference to FIGS. 20 and 21.

The third light-emitting element ED3 is arranged in the third display area DA3. Light emitted from the third light-emitting element ED3 may correspond to light from the third sub-pixel P3 (of FIG. 1) described with reference to FIG. 1, and a location of the third light-emitting element ED3 may be that of the third sub-pixel P3 (of FIG. 1). The third light-emitting element ED3 may emit, for example, red, green, or blue light. As described above with reference to FIG. 1, the resolution of the third display area DA3 may be the same as that of the second display area DA2, and in this case, the number of third light-emitting elements ED3 arranged in the same area in the third display area DA3 may be the same as the number of second light-emitting elements ED2 arranged in the same area in the second display area DA2. According to some embodiments, the resolution of the third display area DA3 may be greater than that of the second display area DA2 and less than that of the first display area DA1. In this case, the number of third light-emitting elements ED3 arranged in the same area in the third display area DA3 may be greater than the number of second light-emitting elements ED2 arranged in the same area in the second display area DA2 and less than the number of first light-emitting elements ED1 arranged in the same area in the first display area DA1.

The third sub-pixel circuit PC3 for driving the third light-emitting element ED3 is arranged in the third display area DA3. The third sub-pixel circuit PC3 may be electrically connected to the third light-emitting element ED3 and may drive the same.

The third sub-pixel circuit PC3 may be electrically connected to the first scan driving circuit SDRV1 and/or the second scan driving circuit SDRV2. The third sub-pixel circuit PC3 may share scan lines with the first sub-pixel circuits PC1 arranged in the same row. For example, the first scan driving circuit SDRV1 and/or the second scan driving circuit SDRV2 may be configured to respectively transmit, through the scan lines SL, scan signals to the first sub-pixel circuits PC1 and the third sub-pixel circuits PC3 arranged in the same row in the first direction. The third sub-pixel circuit PC3 may be electrically connected to any one of the data lines connected to the first sub-pixel circuit PC1 arranged in the first display area DA1, which is described below with reference to FIG. 20.

In the third display area DA3, dummy sub-pixel circuits PCd may be arranged. The dummy sub-pixel circuits PCd may be formed to reduce a deviation in the quality of images in the first to third display areas DA1 to DA3 while maintaining the continuity of lines (e.g., the scan lines, the data lines, etc.) shared between other pixel circuits (e.g., the first and second sub-pixel circuits PC1 and PC2).

Because the third display area DA3 is between the peripheral area PA, where the second sub-pixel circuits PC2 are arranged, and the second display area DA2, the conductive bus line CBL configured to electrically connect the second sub-pixel circuit PC2 to the second light-emitting element ED2 may pass the third display area DA3. The conductive bus line CBL may extend by passing between two third sub-pixel circuits PC3 that are adjacent to each other in the first direction (e.g., the x direction) and/or two dummy sub-pixel circuits PCd that are adjacent to each other in the first direction (e.g., the x direction).

At least a portion of the conductive bus line CBL may include a transparent material. For example, the conductive bus line CBL may be arranged to sequentially pass the bending area BA of the peripheral area PA, the third display area DA3, and the second display area DA2. The conductive bus line CBL may include TCO. According to some embodiments, a portion of the conductive bus line CBL that corresponds to the bending area BA may include a metal material by considering the conductivity and elongation.

In the peripheral area PA, a driving voltage supply line 1100 and a common voltage supply line 1300 may be arranged. The driving voltage supply line 1100 may be configured to apply a driving voltage to a sub-pixel circuit, for example, each of the first to third sub-pixel circuits PC1 to PC3, and the common voltage supply line 1300 may be configured to apply a common voltage to a cathode (an opposite electrode 230 of FIG. 6) of a light-emitting element, for example, each of the first to third light-emitting elements ED1 to ED3.

The driving voltage supply line 1100 may be between the pad PAD and one side of the display area DA, and the common voltage supply line 1300 may have a loop shape having one open side and may partially surround the display area DA on a plane.

Figure 4:
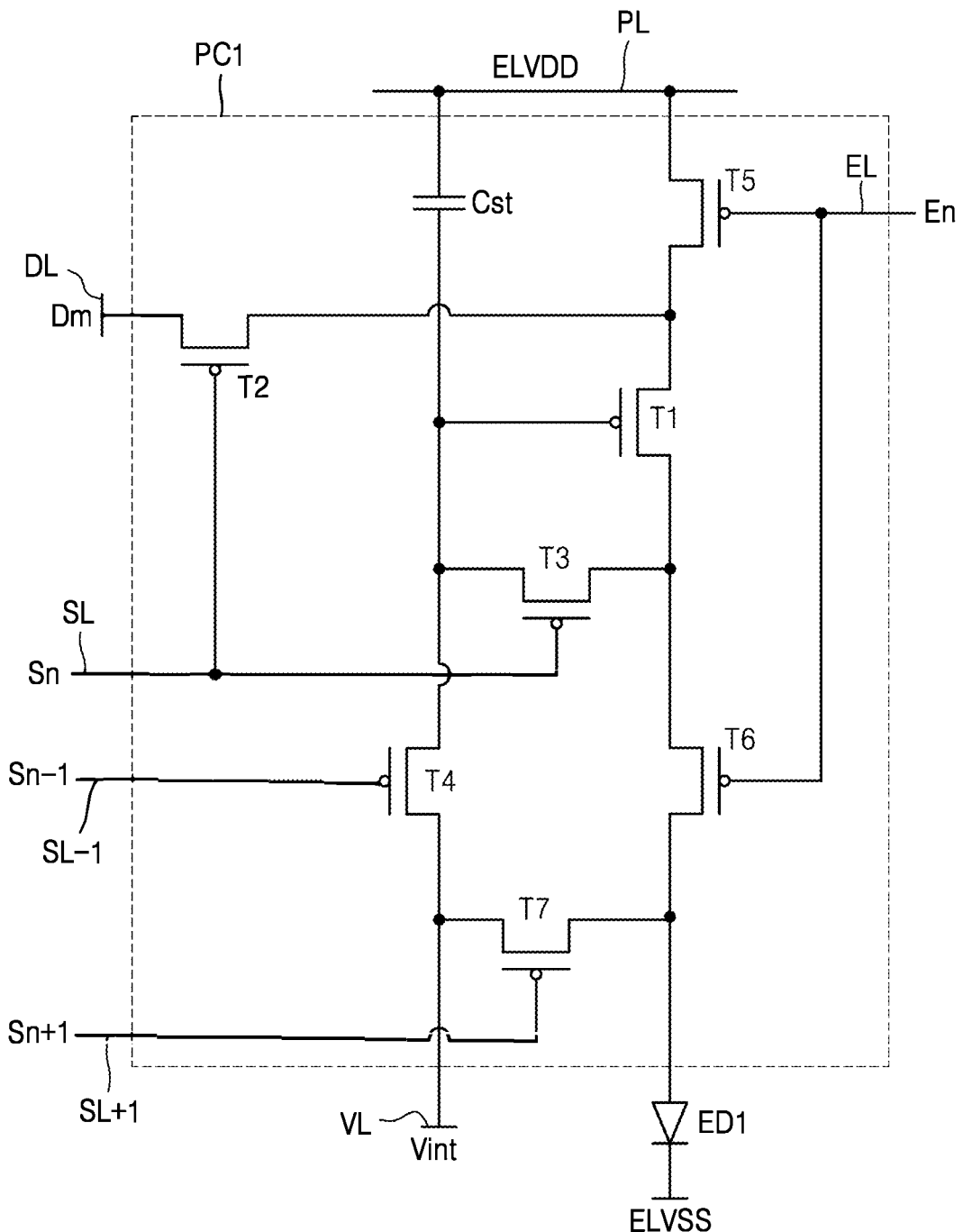
FIG. 4 is a schematic equivalent circuit diagram of a sub-pixel circuit electrically connected to a light-emitting element of a display panel, according to some embodiments.

FIG. 4 is a schematic equivalent circuit diagram of a sub-pixel circuit electrically connected to a light-emitting element of a display panel, according to some embodiments. Hereinafter, it is assumed that the sub-pixel circuit of FIG. 4 is the first sub-pixel circuit PC1. The sub-pixel circuit of FIG. 4 may also be applied to the second and third sub-pixel circuits PC2 and PC3.

Referring to FIG. 3, the first sub-pixel circuit PC1 may include a driving thin film transistor T1, a switching thin film transistor T2, a compensation thin film transistor T3, a first initialization thin film transistor T4, a driving control thin film transistor T5, an emission control thin film transistor T6, a second initialization thin film transistor T7, and a storage capacitor Cst.

FIG. 4 illustrates that each of the first sub-pixel circuits PC1 includes signal lines SL, SL−1, SL+1, EL, and DL, an initialization voltage line VL, and a driving voltage line PL, but one or more embodiments are not limited thereto. According to some embodiments, at least any one of the signal lines SL, SL−1, SL+1, EL, and DL and/or the initialization voltage line VL may be shared between neighboring first sub-pixel circuits PC1.

A drain electrode of the driving thin film transistor T1 may be electrically connected to the first light-emitting element ED1 via the emission control thin film transistor T6. The driving thin film transistor T1 is configured to provide a driving current to the first light-emitting element ED1 by receiving a data signal Dm, according to a switching operation of the switching thin film transistor T2.

A gate electrode of the switching thin film transistor T2 is connected to the scan line SL, and a source electrode of the switching thin film transistor T2 is connected to the data line DL. A drain electrode of the switching thin film transistor T2 may be connected to a source electrode of the driving thin film transistor T1 and connected to the driving voltage line PL via the driving control thin film transistor T5.

The switching thin film transistor T2 is turned on in response to the scan signal Sn transmitted through the scan line SL and configured to perform a switching operation in which the data signal Dm, which is transmitted through the data line DL, is transmitted to the source electrode of the driving thin film transistor T1.

A gate electrode of the compensation thin film transistor T3 may be connected to the scan line SL. A source electrode of the compensation thin film transistor T3 may be connected to the drain electrode of the driving thin film transistor T1 and connected to a pixel electrode of the first light-emitting element ED1 via the emission control thin film transistor T6. A drain electrode of the compensation thin film transistor T3 may be connected to any one electrode of the storage capacitor Cst, a source electrode of the first initialization thin film transistor T4, and the gate electrode of the driving thin film transistor T1. The compensation thin film transistor T3 is turned on in response to the scan signal Sn transmitted through the scan line SL and configured to connect the gate electrode and the drain electrode of the driving thin film transistor T1 to each other to diode-connect the driving thin film transistor T1.

A gate electrode of the first initialization thin film transistor T4 may be connected to a previous scan line SL−1. A drain electrode of the first initialization thin film transistor T4 may be connected to the initialization voltage line VL. The source electrode of the first initialization thin film transistor T4 may be connected to any one electrode of the storage capacitor Cst, the drain electrode of the compensation thin film transistor T3, and the gate electrode of the driving thin film transistor T1. The first initialization thin film transistor T4 may be turned on in response to a previous scan signal Sn−1 transmitted through the previous scan line SL−1 and may perform an initialization operation in which an first initialization voltage Vint is transmitted to the gate electrode of the driving thin film transistor T1 to initialize a voltage of the gate electrode of the driving thin film transistor T1.

A gate electrode of the driving control thin film transistor T5 may be connected to an emission control line EL. A source electrode of the driving control thin film transistor T5 may be connected to the driving voltage line PL. A drain electrode of the driving control thin film transistor T5 is connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the first light-emitting element ED1. The driving control thin film transistor T5 and the emission control thin film transistor T6 are simultaneously turned on in response to an emission control signal En transmitted through the emission control line EL, and thus, a driving current flows in the first light-emitting element ED1.

A gate electrode of the second initialization thin film transistor T7 may be connected to a next scan line SL+1. A source electrode of the second initialization thin film transistor T7 may be connected to the pixel electrode of the first light-emitting element ED1. A drain electrode of the second initialization thin film transistor T7 may be connected to the initialization voltage line VL. The second initialization thin film transistor T7 may be turned on in response to a next scan signal Sn+1 transmitted through the next scan line SL+1 and configured to initialize the pixel electrode of the first light-emitting element ED1.

FIG. 4 illustrates that the first initialization thin film transistor T4 and the second initialization thin film transistor T7 are connected to the previous scan line SL−1 and the next scan line SL+1, respectively, but one or more embodiments are not limited thereto. According to some embodiments, both the first initialization thin film transistor T4 and the second initialization thin film transistor T7 may be connected to the previous scan line SL−1 and driven according to the previous scan signal Sn−1.

Another electrode of the storage capacitor Cst may be connected to the driving voltage line PL. Any one of the electrodes of the storage capacitor Cst may be connected to the gate electrode of the driving thin film transistor T1, the drain electrode of the compensation thin film transistor T3, and the source electrode of the first initialization thin film transistor T4.

A second electrode (e.g., a cathode) of the first light-emitting element ED1 may be configured to receive a common voltage ELVSS. The first light-emitting element ED1 emits light by receiving the driving current from the driving thin film transistor T1.

The first sub-pixel circuit PC1 is not limited to the number of thin film transistors, the number of storage capacitors, and a circuit design described with reference to FIG. 4, and the numbers and the circuit design may vary.

Figure 5:
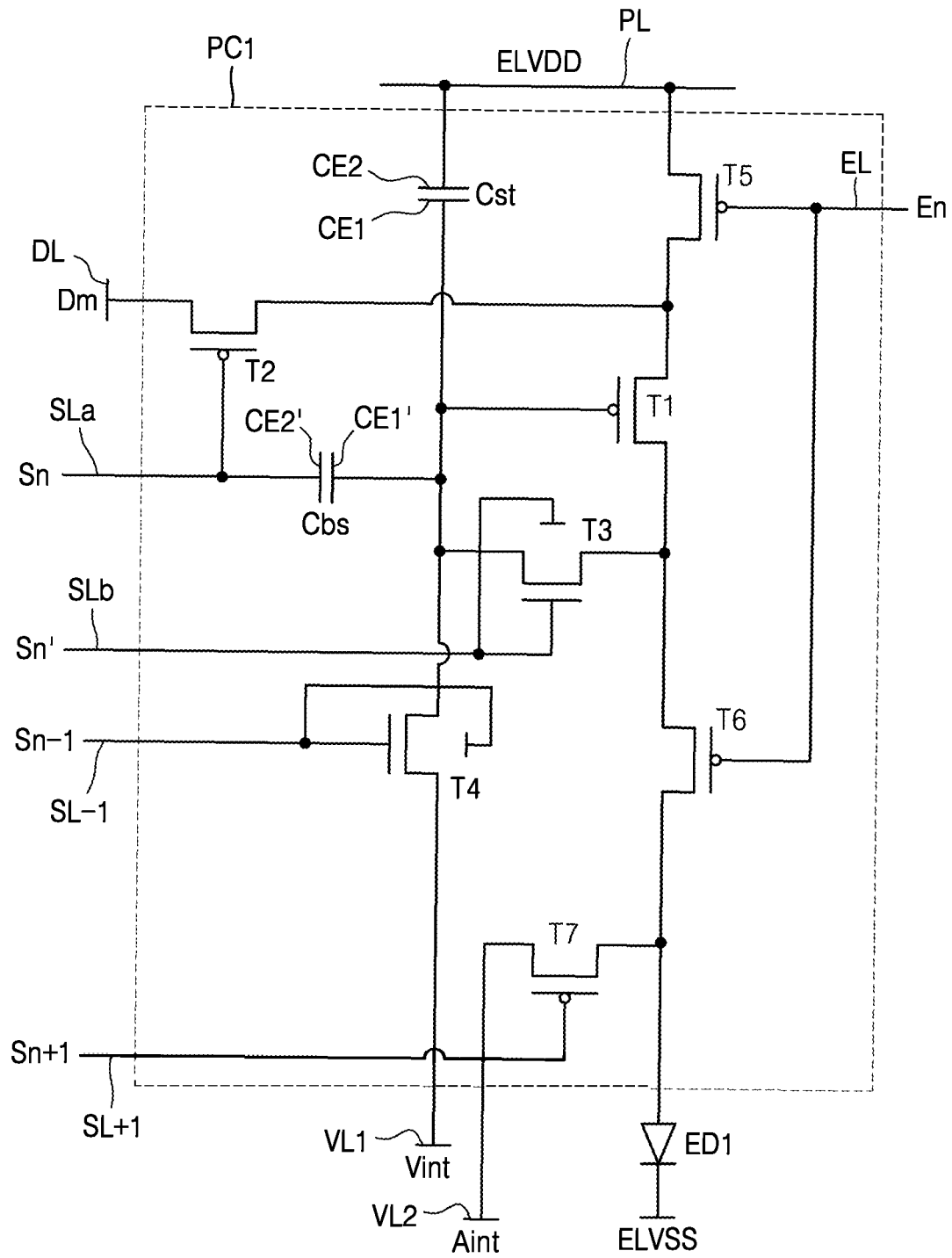
FIG. 5 is an equivalent circuit diagram of a sub-pixel circuit electrically connected to a light-emitting element of a display panel, according to some embodiments.

FIG. 5 is an equivalent circuit diagram of a sub-pixel circuit electrically connected to a light-emitting element of a display panel, according to some embodiments. Hereinafter, it is assumed that the sub-pixel circuit of FIG. 5 is the first sub-pixel circuit PC1. The sub-pixel circuit of FIG. 5 may also be applied to the second and third sub-pixel circuits PC2 and PC3.

Referring to FIG. 5, the first sub-pixel circuit PC1 may be electrically connected to the first light-emitting element ED1. The first sub-pixel circuit PC1 may include the driving thin film transistor T1, the switching thin film transistor T2, the compensation thin film transistor T3, the first initialization thin film transistor T4, the driving control thin film transistor T5, the emission control thin film transistor T6, and the second initialization thin film transistor T7. Hereinafter, functions of the thin film transistors T1 to T7 are described, but it is considered that the descriptions of the functions are provided above with reference to FIG. 4. A difference between FIGS. 4 and 5 will be mainly described.

Some of the thin film transistors T1 to T7 may each be an n-channel MOSFET (NMOS), and the others thereof may each be a p-channel MOSFET (PMOS). For example, the compensation thin film transistor T3 and the first initialization thin film transistor T4 from among the thin film transistors T1 to T7 may each be an NMOS, and the others thereof may each be a PMOS.

According to some embodiments, the compensation thin film transistor T3, the first initialization thin film transistor T4, and the second initialization thin film transistor T7 from among the thin film transistors T1 to T7 may each be an NMOS, and the others thereof may each be a PMOS. Alternatively, one of the thin film transistors T1 to T7 may be an NMOS, and the others thereof may each be a PMOS. Alternatively, all of the thin film transistors T1 to T7 may each be an NMOS.

The signal lines may include: a first scan line SLa configured to transmit the first scan signal Sn; a second scan line SLb configured to transmit the second scan signal Sn'; the previous scan line SL−1 configured to transmit the previous scan signal Sn−1 to the first initialization transistor T4; the emission control line EL configured to transmit the emission control signal En to the driving control thin film transistor T5 and the emission control thin film transistor T6; the next scan line SL+1 configured to transmit the next scan signal Sn+1 to the second initialization transistor T7; and the data line DL crossing the first scan line SLa and configured to transmit the data signal Dm.

A gate electrode of the switching thin film transistor T2 is connected to the first scan line SLa configured to transmit the first scan signal Sn. The switching thin film transistor T2 may be turned on in response to the first scan signal Sn transmitted through the first scan line SLa and may perform a switching operation in which the data signal Dm transmitted through the data line DL is transmitted to a source electrode of the driving thin film transistor T1.

The gate electrode of the compensation thin film transistor T3 is connected to the second scan line SLb. The compensation thin film transistor T3 may be turned on in response to the second scan signal Sn' transmitted through the second scan line SLb and may electrically connect the gate electrode of the driving thin film transistor T1 to a drain electrode thereof to diode-connect the driving thin film transistor T1.

The sub-pixel circuit of FIG. 5 may further include a boosting capacitor Cbs. The boosting capacitor Cbs may include a first electrode CE1' and a second electrode CE2'. The first electrode CE1' of the boosting capacitor Cbs may be connected to the lower electrode CE1 of the storage capacitor Cst, and the second electrode CE2' of the boosting capacitor Cbs may be configured to receive the first scan signal Sn. The boosting capacitor Cbs may be configured to compensate for a voltage drop of a gate terminal of the driving thin film transistor T1 by increasing a voltage of the gate terminal of the driving thin film transistor T1 at a point in time when the first scan signal Sn stops being provided.

The gate electrode of the first initialization thin film transistor T4 may be connected to the previous scan line SL−1. The source electrode of the first initialization thin film transistor T4 may be connected to the source electrode of the second initialization thin film transistor T7 and a first initialization voltage line VL1. The drain electrode of the first initialization thin film transistor T4 may be connected to the lower electrode CE1 of the storage capacitor Cst, the source electrode of the compensation thin film transistor T3, and the gate electrode of the driving thin film transistor T1. The first initialization thin film transistor T4 may be turned on in response to the previous scan signal Sn−1 transmitted through the previous scan line SL−1 and may perform an initialization operation in which the first initialization voltage Vint is transmitted to the gate electrode of the driving thin film transistor T1 and a voltage of the gate electrode of the driving thin film transistor T1 is initialized.

The gate electrode of the second initialization thin film transistor T7 may be connected to the next scan line SL+1. The source electrode of the second initialization thin film transistor T7 may be connected to the pixel electrode of the first light-emitting element ED1, and the drain electrode of the second initialization thin film transistor T7 may be connected to a second initialization voltage line VL2. The second initialization thin film transistor T7 may be turned on in response to the next scan signal Sn+1 transmitted through the next scan line SL+1 and configured to initialize the pixel electrode of the first light-emitting element ED1 by applying a second initialization voltage Aint to the pixel electrode.

Figure 6:
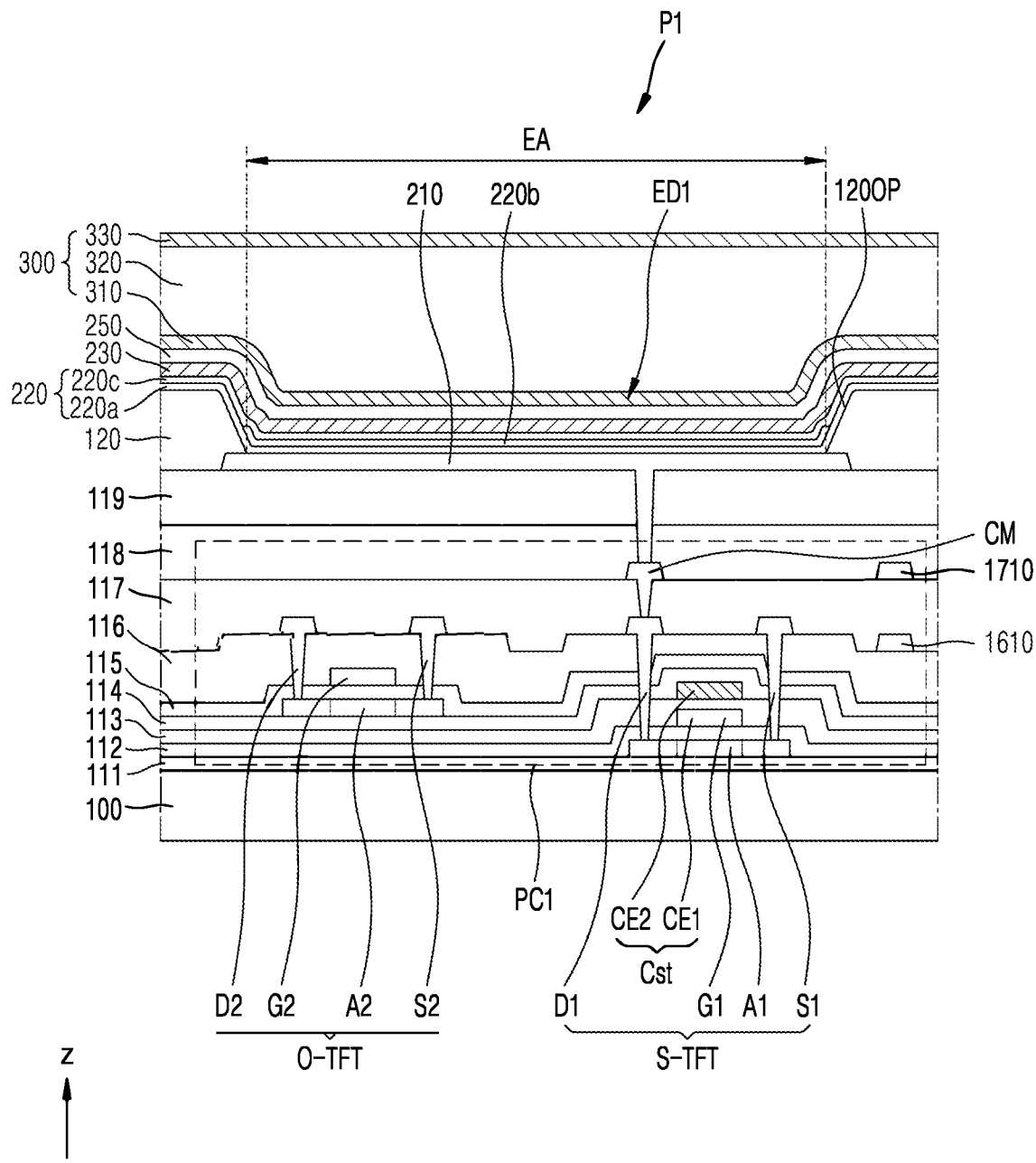
FIG. 6 is a schematic cross-sectional view of a portion of a display panel, according to some embodiments.

FIG. 6 is a schematic cross-sectional view of a portion of a display panel, according to some embodiments.

FIG. 6 is a schematic cross-sectional view illustrating a stack structure of the sub-pixel circuit described with reference to FIG. 5. FIG. 6 illustrates an example of a structure of the first sub-pixel circuit PC1 of the first sub-pixel P1, but the second and third sub-pixel circuits PC2 and PC3 may also have structures similar to the structure of the first sub-pixel circuit PC1. Arrangements and stack structures of conductive patterns (e.g., thin film transistors, a storage capacitor, and/or various lines) of the second and third sub-pixel circuits PC2 and PC3 may be different from those illustrated in FIG. 6.

Referring to FIG. 6, the first sub-pixel circuit PC1 may include at least one silicon thin film transistor S-TFT and at least one oxide thin film transistor O-TFT.

A buffer layer 111 of the substrate 100 may be on the substrate 100. The buffer layer 111 may prevent metal atoms or impurities from diffusing from the substrate 100 to a first active pattern A1. Also, the buffer layer 111 may adjust the heat transmission speed during a crystallization process of forming the first active pattern A1, and thus, the first active pattern A1 may be evenly formed. For example, the buffer layer 111 may include silicon oxide, silicon nitride, silicon oxynitride, or the like.

The first active pattern A1 may be on the buffer layer 111. According to some embodiments, the first active pattern A1 may include a silicon semiconductor. For example, the silicon semiconductor may include amorphous silicon, polycrystalline silicon, or the like. For example, the first active pattern A1 may include low temperature polysilicon (LTPS).

According to some embodiments, ions may be injected into the first active pattern A1. For example, when the driving thin film transistor T1, the switching thin film transistor T2, the driving control thin film transistor T5, the emission control thin film transistor T6, and the second initialization thin film transistor T7, which are described above with reference to FIG. 4, are PMOS transistors, ions such as boron may be injected into the first active pattern A1.

A first gate insulating layer 112 may cover the first active pattern A1 and may be on the substrate 100. The first gate insulating layer 112 may include an insulating material. For example, the first gate insulating layer 112 may include silicon oxide, silicon nitride, silicon oxynitride, or aluminum oxide.

A first gate electrode G1 may be on the first gate insulating layer 112. The first gate electrode G1 may include metal, an alloy, conductive metal oxide, a transparent conductive material, or the like. For example, the first gate electrode G1 may include silver (Ag), an alloy including Ag, molybdenum (Mo), an alloy including Mo, aluminum (Al), an alloy including Al, aluminum nitride (AlN), tungsten (W), tungsten nitride (WN), copper (Cu), titanium (Ti), indium tin oxide (ITO), indium zinc oxide (IZO), or the like and may be a layer or layers. For example, the first gate electrode G1 may be a Mo layer or layers of Mo/Al/Mo.

According to some embodiments, the first gate electrode G1 may be integrally formed with a lower electrode CE1 of the storage capacitor Cst.

A second gate insulating layer 113 may cover the first gate electrode G1 and may be on the first gate insulating layer 112. For example, the second gate insulating layer 113 may include silicon oxide, silicon nitride, silicon oxynitride, or aluminum oxide.

An upper electrode CE2 of the storage capacitor Cst may be on the second gate insulating layer 113. The upper electrode CE2 may include, for example, metal, an alloy, conductive metal oxide, a transparent conductive material, or the like. For example, the upper electrode CE2 may include Ag, an alloy including Ag, Mo, an alloy including Mo, Al, an alloy including Al, AlN, W, WN, Cu, Ti, ITO, IZO, or the like and may be a layer or layers. For example, the upper electrode CE2 may be a Mo layer or layers of Mo/Al/Mo. The upper electrode CE2 may overlap the first gate electrode G1, that is, the lower electrode CE1 of the storage capacitor Cst.

A first interlayer insulating layer 114 may cover the upper electrode CE2 and may be on the second gate insulating layer 113. The first interlayer insulating layer 114 may include an insulating material. For example, the first interlayer insulating layer 114 may include silicon oxide, silicon nitride, silicon oxynitride, or aluminum oxide.

A second active pattern A2 may be on the first interlayer insulating layer 114. According to some embodiments, the second active pattern A2 may include an oxide semiconductor. The second active pattern A2 may be on a different layer from the first active pattern A1 and may not overlap the first active pattern A1.

A third gate insulating layer 115 may cover the second active pattern A2 and may be on the first interlayer insulating layer 114. For example, the third gate insulating layer 115 may include silicon oxide, silicon nitride, silicon oxynitride, or aluminum oxide.

According to some embodiments, unlike the illustration of FIG. 6, the third gate insulating layer 115 may be patterned to cover some portions of the second active pattern A2 and expose other portions thereof. In more detail, the third gate insulating layer 115 may have the same pattern as a second gate electrode G2 described below. In this case, a source area and a drain area of the second active pattern A2 may be exposed except for a channel area of the second active pattern A2 that overlaps the second gate electrode G2. The source area and the drain area may directly contact a second interlayer insulating layer 116.

The second gate electrode G2 may be arranged on the third gate insulating layer 115. The second gate electrode G2 may include, for example, metal, an alloy, conductive metal oxide, a transparent conductive material, or the like. For example, the second gate electrode G2 may include Ag, an alloy including Ag, Mo, an alloy including Mo, Al, an alloy including Al, AlN, W, WN, Cu, Ti, ITO, IZO, or the like and may be a layer or layers. For example, the second gate electrode G2 may be a Mo layer or layers of Mo/Al/Mo.

The second interlayer insulating layer 116 may cover at least a portion of the second gate electrode G2. The second interlayer insulating layer 116 may include an insulating material. For example, the second interlayer insulating layer 116 may include silicon oxide, silicon nitride, silicon oxynitride, or aluminum oxide.

A first source electrode S1, a first drain electrode D1, a second source electrode S2, and a second drain electrode D2 may be on the second interlayer insulating layer 116. The first source electrode S1, the first drain electrode D1, the second source electrode S2, and the second drain electrode D2 may each include, for example, metal, an alloy, conductive metal oxide, a transparent conductive material, or the like. For example, the first source electrode S1 and the first drain electrode D1 may include a conductive material including Mo, Al, Cu, or Ti and may be a layer or layers including the above material. For example, the source electrode S1 and the drain electrode D1 may each have a multilayered structure of Ti/Al/Ti.

A first conductive layer 1610 may be on the second interlayer insulating layer 116. For example, the data signal Dm described with reference to FIGS. 4 and 5 may be provided to the first conductive layer 1610. The first conductive layer 1610 may include, for example, metal, an alloy, conductive metal oxide, a transparent conductive material, or the like. For example, the first conductive layer 1610 may include a conductive material including Mo, Al, Cu, or Ti and may be a layer or layers including the above material. For example, the first conductive layer 1610 may have a multilayered structure of Ti/Al/Ti.

A first planarization layer 117 may cover the first conductive layer 1610, etc. and may be on the second interlayer insulating layer 116.

A contact metal CM and a second conductive layer 1710 may be on the first planarization layer 117. The contact metal CM may electrically connect the silicon thin film transistor S-TFT to a pixel electrode 210. For example, the driving voltage EVLDD described with reference to FIGS. 4 and 5 may be provided to the second conductive layer 1710. The contact metal CM and the second conductive layer 1710 may include, for example, metal, an alloy, conductive metal oxide, a transparent conductive material, or the like. For example, the contact metal CM and the second conductive layer 1710 may include a conductive material including Mo, Al, Cu, or Ti and may be a layer or layers including the above material. For example, the contact metal CM and the second conductive layer 1710 may each have a multilayered structure of Ti/Al/Ti.

A second planarization layer 118 may cover the contact metal CM and the second conductive layer 1710. A third planarization layer 119 may be on the second planarization layer 118. The first to third planarization layers 117 to 119 may each include, for example, a general-purpose polymer such as benzocyclobutene (BCB), polyimide, hexamethyldisiloxane (HMDSO), polymethylmethacrylate (PMMA), or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

On the third planarization layer 119, the first light-emitting element ED1 is arranged as a display element. The first light-emitting element ED1 includes the pixel electrode 210, an intermediate layer 220 including an organic emission layer, and an opposite electrode 230.

The pixel electrode 210 may be a (semi-)light-transmissive electrode or a reflection electrode. According to some embodiments, the pixel electrode 210 may include a reflection layer including Ag, Mg, Al, Pt, Pd, Au, Ni, Nd, Ir, Cr, or a compound thereof, and a transparent or translucent electrode layer arranged on the reflection layer. The transparent or translucent electrode layer may include at least one selected from the group consisting of ITO, IZO, zinc oxide (ZnO), indium oxide ($In_2O_3$), indium gallium oxide (IGO), and aluminum zinc oxide (AZO). For example, the pixel electrode 210 may include ITO/Ag/ITO.

A pixel-defining layer 120 may be on the third planarization layer 119. The pixel-defining layer 120 may prevent arcs, etc. from being generated at edges of the pixel electrode 210 by increasing a distance between the edges of the pixel electrode 210 and the opposite electrode 230 above the pixel electrode 210. A spacer may be arranged on the pixel-defining layer 120.

The pixel-defining layer 120 may include at least one organic insulating material selected from the group consisting of polyimide, polyamide, acryl resin, BCB, and phenol resin.

The intermediate layer 220 of the first light-emitting element ED1 may be in an opening 120OP formed by the pixel-defining layer 120. An emission area EA of the first light-emitting element ED1 may be defined by the opening 120OP.

The intermediate layer 220 may include an organic emission layer 220b. The organic emission layer 220b may include an organic material including a fluorescent or phosphorescent material emitting red light, green light, or blue light. The organic emission layer 220b may include a low-molecular-weight or a high-molecular-weight organic material, and a first functional layer 220a including a hole transport layer (HTL) and a hole injection layer (HIL) and a second functional layer 220c including an electron transport layer (ETL) and an electron injection layer (EIL) may be selectively arranged under and on the organic emission layer 220b.

The opposite electrode 230 may be a light-transmissive electrode or a reflection electrode. For example, the opposite electrode 230 may be a transparent or translucent electrode and may include a metal thin-film having a low work function and including Li, Ca, LiF/Ca, LiF/Al, Al, Ag, Mg, and a compound thereof. Also, a TCO layer including ITO, IZO, ZnO, or $In_2O_3$ may be further arranged on the metal thin-film. The opposite electrode 230 may be integrally formed in the entire display area DA and arranged on the intermediate layer 220 and the pixel-defining layer 120.

On the opposite electrode 230, an upper layer 250 including an organic material may be formed. The upper layer 250 may be prepared to protect the opposite electrode 230 and increase the light extraction efficiency at the same time. The upper layer 250 may include an organic material having a greater refractive index than that of the opposite electrode 230. Alternatively, the upper layer 250 may be prepared as layers having different refractive indices are stacked. For example, the upper layer 250 may be formed as a high refractive layer/a low refractive layer/a high refractive layer are stacked. In this case, a refractive index of the high refractive layer may be equal to or greater than about 1.7, and a refractive index of the low refractive layer may be less than or equal to about 1.3. The upper layer 250 may additionally include LiF. Alternatively, the upper layer 250 may additionally include an inorganic insulating material such as silicon oxide, silicon nitride, silicon oxynitride, or aluminum oxide.

The encapsulation layer 300 may include at least one inorganic encapsulation layer and at least one organic encapsulation layer. For example, the encapsulation layer 300 may include a first inorganic encapsulation layer 310, a second inorganic encapsulation layer 330, and an organic encapsulation layer 320 therebetween.

The first inorganic encapsulation layer 310 and the second inorganic encapsulation layer 330 may include at least one inorganic insulating material such as silicon oxide, silicon nitride, silicon oxynitride, or aluminum oxide. The organic encapsulation layer 320 may include a polymer-based material. The polymer-based material may include silicon-based resin, acryl-based resin, epoxy-based resin, polyimide, and polyethylene. The first inorganic encapsulation layer 310, the organic encapsulation layer 320, and the second inorganic encapsulation layer 330 may entirely cover the display area.

According to some embodiments, the input detection layer, the optical functional layer, the cover window, and the like, which are described with reference to FIG. 2, may be further arranged on the encapsulation layer 300.

Figure 7:
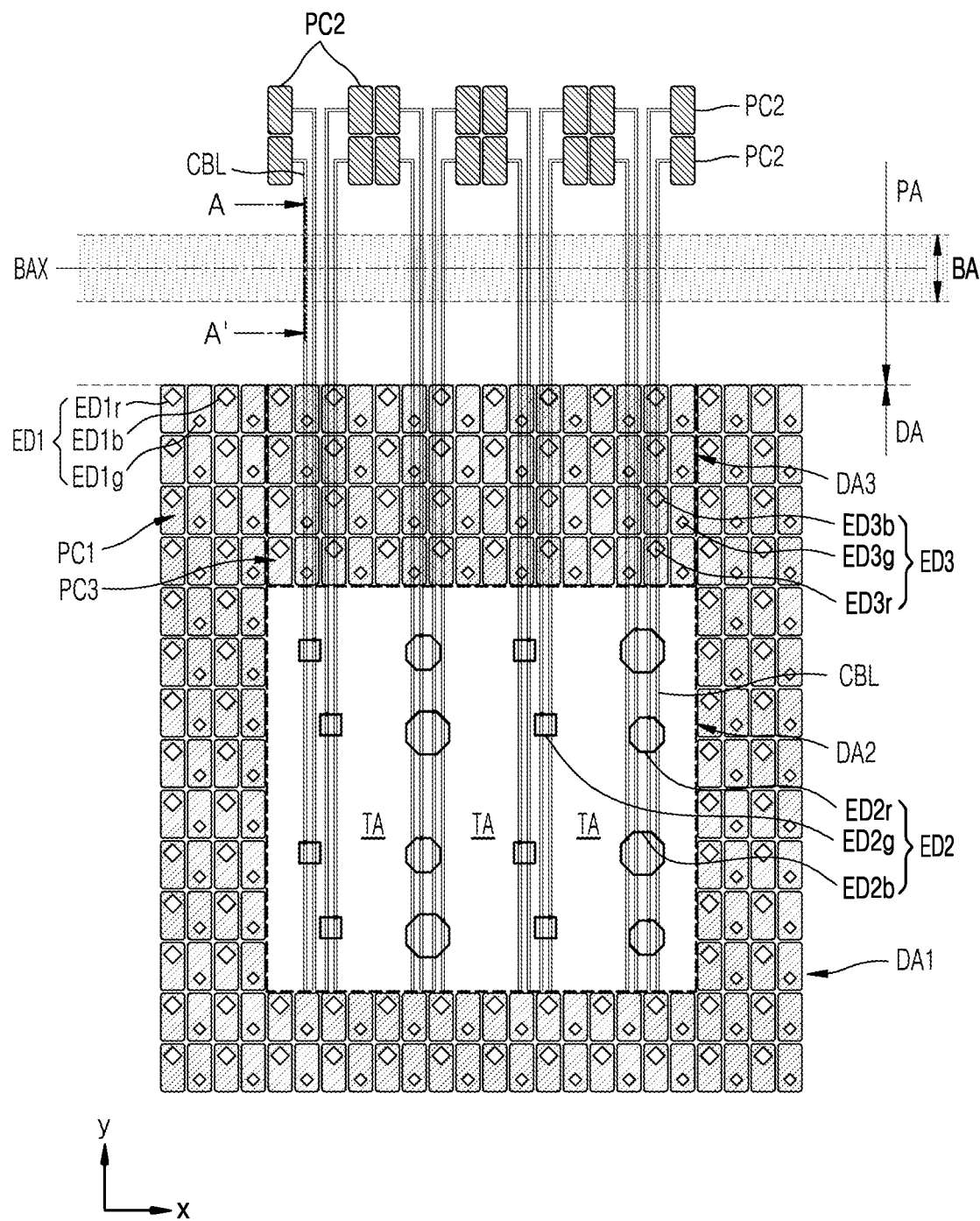
FIG. 7 is a plan view of a portion of a display panel, according to some embodiments.
Figure 8:
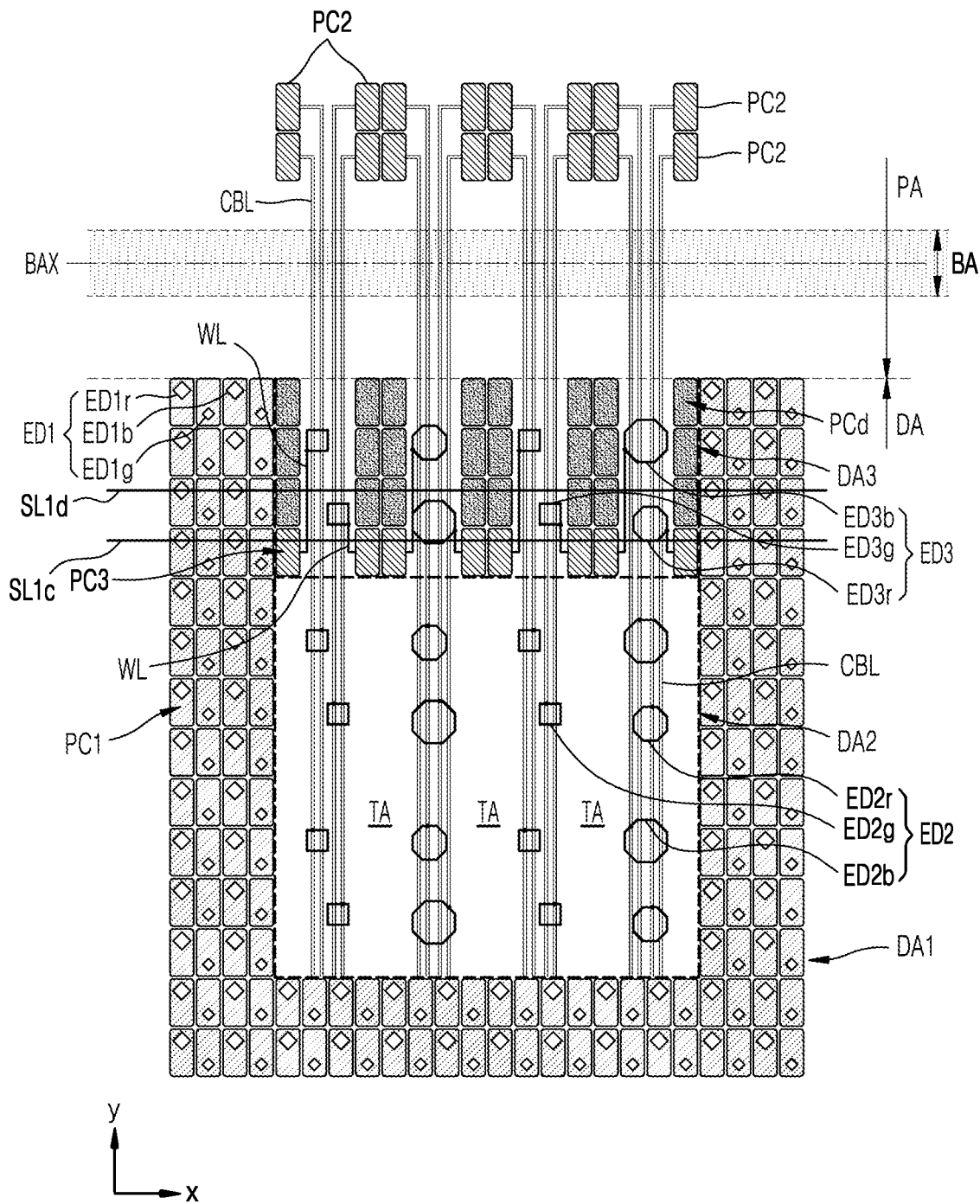
FIG. 8 is a plan view of a portion of a display panel, according to some embodiments.

FIG. 7 is a plan view of a portion of a display panel, according to some embodiments, and FIG. 8 is a plan view of a portion of a display panel, according to some embodiments. FIG. 7 illustrates arrangements of the first to third sub-pixel circuits PC1 to PC3 and the first to third light-emitting elements ED1 to ED3 connected thereto.

Referring to FIG. 7, the first light-emitting elements ED1 may be arranged in the first display area DA1, and the first light-emitting elements ED1 may include first red light-emitting elements ED1r, first green light-emitting elements ED1g, and first blue light-emitting elements ED1b. Because the first sub-pixel P1 (of FIG. 1) described with reference to FIG. 1 corresponds to a discharge area where light is emitted from the first light-emitting elements ED1, an emission area of the first red light-emitting element ED1r corresponds to a first red sub-pixel, an emission area of the first green light-emitting element ED1g corresponds to a first green sub-pixel, and an emission area of the first blue light-emitting element ED1b corresponds to a first blue sub-pixel. Locations of the first red light-emitting element ED1r, the first green light-emitting element ED1g, and the first blue light-emitting element ED1b may correspond to the first red sub-pixel, the first green sub-pixel, and the first blue sub-pixel, respectively.

The first red sub-pixel, the first green sub-pixel, and the first blue sub-pixel (e.g., the first red light-emitting element ED1r, the first green light-emitting element ED1g, and the first blue light-emitting element ED1b) may be arranged in various forms. For example, as illustrated in FIG. 8, the first red sub-pixel, the first green sub-pixel, and the first blue sub-pixel (e.g., the first red light-emitting element ED1r, the first green light-emitting element ED1g, and the first blue light-emitting element ED1b) may be arranged in a Pentile® form.

For example, two first red sub-pixels (e.g., the first red light-emitting elements ED1r) are arranged, in a diagonal direction, on vertices of a virtual square having the first green sub-pixel (e.g., the first green light-emitting element ED1g) as the center, and the first blue sub-pixels (e.g., the first blue light-emitting elements ED1b) may be arranged on the other two vertices. A high resolution may be realized using the above arrangement. According to some embodiments, the first red sub-pixel, the first green sub-pixel, and the first blue sub-pixel may be arranged in various forms such as a stripe form, a mosaic form, and a delta form.

In the first display area DA1, the first sub-pixel circuits PC1 may be arranged. The first sub-pixel circuits PC1 may, for example, form rows and columns in the x direction and the y direction and be arranged in a matrix form.

The second light-emitting elements ED2 may be arranged in the second display area DA2, and the second light-emitting elements ED2 may include second red light-emitting elements ED2r, second green light-emitting elements ED2g, and second blue light-emitting elements ED2b. Because the second sub-pixel P2 (of FIG. 1) described with reference to FIG. 1 corresponds to a discharge area where light is emitted from the second light-emitting elements ED2, an emission area of the second red light-emitting element ED2r corresponds to a second red sub-pixel, an emission area of the second green light-emitting element ED2g corresponds to a second green sub-pixel, and an emission area of the second blue light-emitting element ED2b corresponds to a second blue sub-pixel. Locations of the second red light-emitting element ED2r, the second green light-emitting element ED2g, and the second blue light-emitting element ED2b may correspond to the second red sub-pixel, the second green sub-pixel, and the second blue sub-pixel, respectively.

The second red sub-pixel, the second green sub-pixel, and the second blue sub-pixel (e.g., the second red light-emitting element ED2r, the second green light-emitting element ED2g, and the second blue light-emitting element ED2b) may be arranged in various forms. For example, the second red sub-pixel, the second green sub-pixel, and the second blue sub-pixel (e.g., the second red light-emitting element ED2r, the second green light-emitting element ED2g, and the second blue light-emitting element ED2b) may be arranged in various forms such as a Pentile® form, a stripe form, a mosaic form, and a delta form.

The second sub-pixels (e.g., the second light-emitting elements ED2) may be distributed in the second display area DA2. For example, a distance between the second sub-pixels may be greater than that between the first sub-pixels. Therefore, a distance between adjacent second light-emitting elements ED2 may be greater than a distance between adjacent first light-emitting elements ED1, and a region of the second display area DA2, where the second light-emitting elements ED2 are not arranged, may correspond to the transmission area TA having the high light transmittance.

Resolutions of the second red sub-pixel, the second green sub-pixel, and the second blue sub-pixel may be different from those of the first red sub-pixel, the first green sub-pixel, and the first blue sub-pixel For example, the number of each of the second red light-emitting elements ED2r, the second green light-emitting elements ED2g, and the second blue light-emitting elements ED2b arranged in the same area in the second display area DA2 may be less than the number of each of the first red light-emitting elements ED1r, the first green light-emitting elements ED1g, and the first blue light-emitting elements ED1b arranged in the same area in the first display area DA1.

The second sub-pixel circuits PC2 may be arranged in the peripheral area PA and may not overlap the second light-emitting elements ED2. Because the second sub-pixel circuits PC2 are not arranged in the second display area DA2, the second display area DA2 may secure a greater transmission area TA. Also, because lines (e.g., scan lines, data lines, driving voltage lines, initialization voltage lines, etc.) configured to apply a voltage and/or signals to the second sub-pixel circuits PC2 are not arranged in the second display area DA2, the second sub-pixels, e.g., the second light-emitting elements ED2, may be freely arranged.

The second sub-pixel circuits PC2 may be connected to the second light-emitting elements ED2 by the conductive bus lines CBL to enable the second sub-pixel circuits PC2 arranged in the peripheral area PA to drive the second light-emitting elements ED2 in the second display area DA2.

The conductive bus lines CBL may extend towards the second display area DA2 via the third display area DA3 while being electrically connected to the second sub-pixel circuits PC2. An end of the conductive bus line CBL is in the peripheral area PA (in detail, a portion of a peripheral area PA adjacent to the third display area DA3), and the other end thereof is in the second display area DA2.

At least a portion of the conductive bus line CBL may include a transparent conductive material. The conductive bus line CBL may include TCO. For example, the conductive bus line CBL may include conductive oxide such as ITO, IZO, ZnO, $In_2O_3$, IGO, indium zinc gallium oxide (IZGO), or AZO. Therefore, a decrease in the light transmittance of the transmission area TA may be reduced.

The third light-emitting elements ED3 may be arranged in the third display area DA3, and the third light-emitting elements ED3 may include third red light-emitting elements ED3r, third green light-emitting elements ED3g, and third blue light-emitting elements ED3b. Because the third sub-pixel P3 (of FIG. 1) described with reference to FIG. 1 corresponds to a discharge area where light is emitted from the third light-emitting elements ED3, an emission area of the third red light-emitting element ED3r corresponds to a third red sub-pixel, an emission area of the third green light-emitting element ED3g corresponds to a third green sub-pixel, and an emission area of the third blue light-emitting element ED3b corresponds to a third blue sub-pixel. Locations of the third red light-emitting element ED3r, the third green light-emitting element ED3g, and the third blue light-emitting element ED3b may correspond to the third red sub-pixel, the third green sub-pixel, and the third blue sub-pixel, respectively.

The third red sub-pixel, the third green sub-pixel, and the third blue sub-pixel (e.g., the third red light-emitting element ED3r, the third green light-emitting element ED3g, and the third blue light-emitting element ED3b) may be arranged in various forms. For example, the third red sub-pixel, the third green sub-pixel, and the third blue sub-pixel (e.g., the third red light-emitting element ED3r, the third green light-emitting element ED3g, and the third blue light-emitting element ED3b) may be arranged in various forms such as a Pentile® form, a stripe form, a mosaic form, and a delta form.

The third sub-pixels (e.g., the third light-emitting elements ED3) may be distributed in the third display area DA3. For example, a distance between the third sub-pixels may be greater than that between the first sub-pixels. Therefore, a distance between adjacent third light-emitting elements ED3 may be greater than the distance between adjacent first light-emitting elements ED1.

FIG. 7 illustrates that arrangements of the third sub-pixels (e.g., the third light-emitting elements ED3) are substantially the same as those of the first sub-pixels (e.g., the first light-emitting elements ED1). According to some embodiments, the number of each of the third red light-emitting elements ED3r, the third green light-emitting elements ED3g, and the third blue light-emitting elements ED3b arranged in the same area in the third display area DA3 may be substantially the same as the number of each of the first red light-emitting elements ED1r, the first green light-emitting elements ED1g, and the first blue light-emitting elements ED1b arranged in the same area in the first display area DA1.

The conductive bus line CBL may overlap some of the third sub-pixel circuits PC3 and extend in the second direction (e.g., the y direction).

According to some embodiments, as illustrated in FIG. 8, the number of each of the third red light-emitting elements ED3r, the third green light-emitting elements ED3g, and the third blue light-emitting elements ED3b arranged in the same area in the third display area DA3 may be less than the number of each of the first red light-emitting elements ED1r, the first green light-emitting elements ED1g, and the first blue light-emitting elements ED1b arranged in the same area in the first display area DA1.

Referring to FIG. 8, when the arrangements of the third sub-pixels (e.g., the third light-emitting elements ED3) are different from those of the first sub-pixels (e.g., the first light-emitting elements ED1), the dummy sub-pixel circuits PCd may be further arranged on the third sub-pixel circuits PC3. The third sub-pixel circuits PC3 and the dummy sub-pixel circuits PCd may be arranged to form rows and columns.

The dummy sub-pixel circuit PCd may maintain the continuity of a process of forming the third sub-pixel circuits PC3 and the continuity of lines configured to provide signals or voltages, and thus, a quality deviation in respective areas of the display panel may decrease. The dummy sub-pixel circuit PCd may have the same planar shape as the third sub-pixel circuit PC3. For example, the dummy sub-pixel circuit PCd may have substantially the same structure as the third sub-pixel circuit PC3.

A distance between two third sub-pixel circuits PC3, which are adjacent to each other in the first direction (e.g., the x direction), may be greater than a distance between the first sub-pixel circuits PC1, which are adjacent to each other in the first direction (e.g., the x direction). The conductive bus line CBL may extend between two adjacent third sub-pixel circuits PC3, which are apart from each other, in the second direction (e.g., the y direction).

Each third sub-pixel circuit PC3 may be apart from a corresponding third light-emitting element ED3 and may be electrically connected thereto by a wire WL. On a plane of FIG. 8, any one of two third sub-pixel circuits PC3, which are arranged on both sides with respect to the conductive bus lines CBL, may be connected to any one of the third light-emitting elements ED3 through the wire WL, and the other of two third sub-pixel circuits PC3 may be connected to another third light-emitting element ED3 through the wire WL. In this case, the wires WL may extend in parallel with the conductive bus lines CBL and may be between the third sub-pixel circuits PC3 that are apart from each other like the conductive bus lines CBL.

As illustrated in FIGS. 7 and 8, at least a portion of the peripheral area PA may include the bending area BA. The bending area BA may be in the peripheral area PA that is adjacent to the third display area DA3. In detail, the bending area BA may be between the third display area DA3 and the second sub-pixel circuit PC2. The bending area BA may be bent with respect to a bending axis BAX extending in the first direction (e.g., the x direction).

The conductive bus lines CBL may extend to the display area DA via the bending area BA. A stack structure of the bending area BA will be described in detail with reference to FIG. 9.

FIGS. 9A to 9F are schematic cross-sectional views of a peripheral area including the bending area of FIGS. 7 and 8, taken along line A-A' of FIG. 7.

Figure 9A:
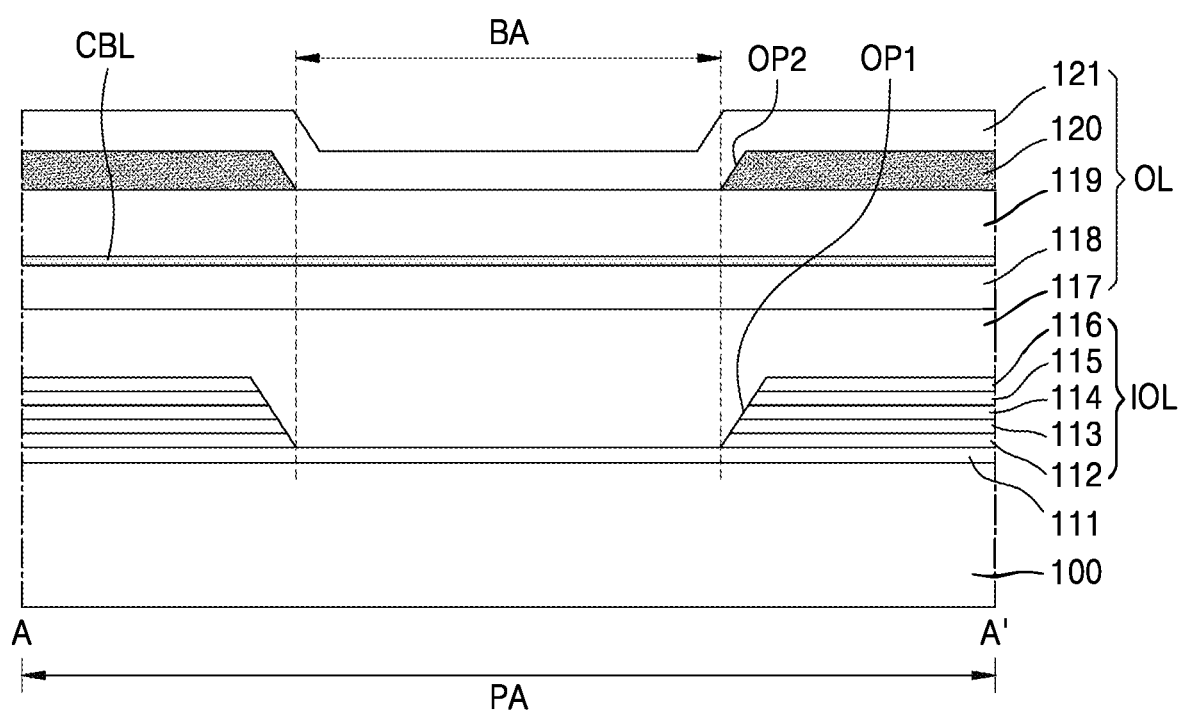
FIGS. 9A to 9F are schematic cross-sectional views of a display panel, taken along the line A-A' of FIG. 7.

Referring to FIG. 9A, on the substrate 100 corresponding to the peripheral area PA including the bending area BA, the buffer layer 111, the first gate insulating layer 112, the second gate insulating layer 113, the first interlayer insulating layer 114, the third gate insulating layer 115, the second interlayer insulating layer 116, the first planarization layer 117, the second planarization layer 118, the third planarization layer 119, the pixel-defining layer 120, and a spacer 121, which are described above with reference to FIG. 6, may be sequentially arranged. The above layers may be in the display area DA and extend to the peripheral area PA. According to some embodiments, some of the layers may be omitted from the peripheral area PA.

The conductive bus line CBL may be between the second planarization layer 118 and the third planarization layer 119. The conductive bus line CBL may pass the bending area BA.

The buffer layer 111 corresponding to the peripheral area PA including the bending area BA may entirely be on the substrate 100. On the buffer layer 111, an inorganic insulating layer IOL including the first gate insulating layer 112, the second gate insulating layer 113, the first interlayer insulating layer 114, the third gate insulating layer 115, the second interlayer insulating layer 116 may be arranged. According to some embodiments, some of the first gate insulating layer 112, the second gate insulating layer 113, the first interlayer insulating layer 114, the third gate insulating layer 115, the second interlayer insulating layer 116 may be omitted from the inorganic insulating layer IOL.

The inorganic insulating layer IOL may have a first opening OP1 corresponding to the bending area BA, which means that the inorganic insulating layer IOL is removed corresponding to the bending area BA. Thus, the inorganic insulating layer IOL may not be arranged in the bending area BA. As the inorganic insulating layer IOL is removed corresponding to the bending area BA, cracks, which may be generated by the inorganic insulating layer IOL, may be prevented while the bending area BA is bent.

FIG. 9A illustrates that an upper surface of the buffer layer 111 is exposed through the first opening OP1 as the first opening OP1 penetrates the entire inorganic insulating layer IOL, but one or more embodiments are not limited thereto.

Figure 9B:
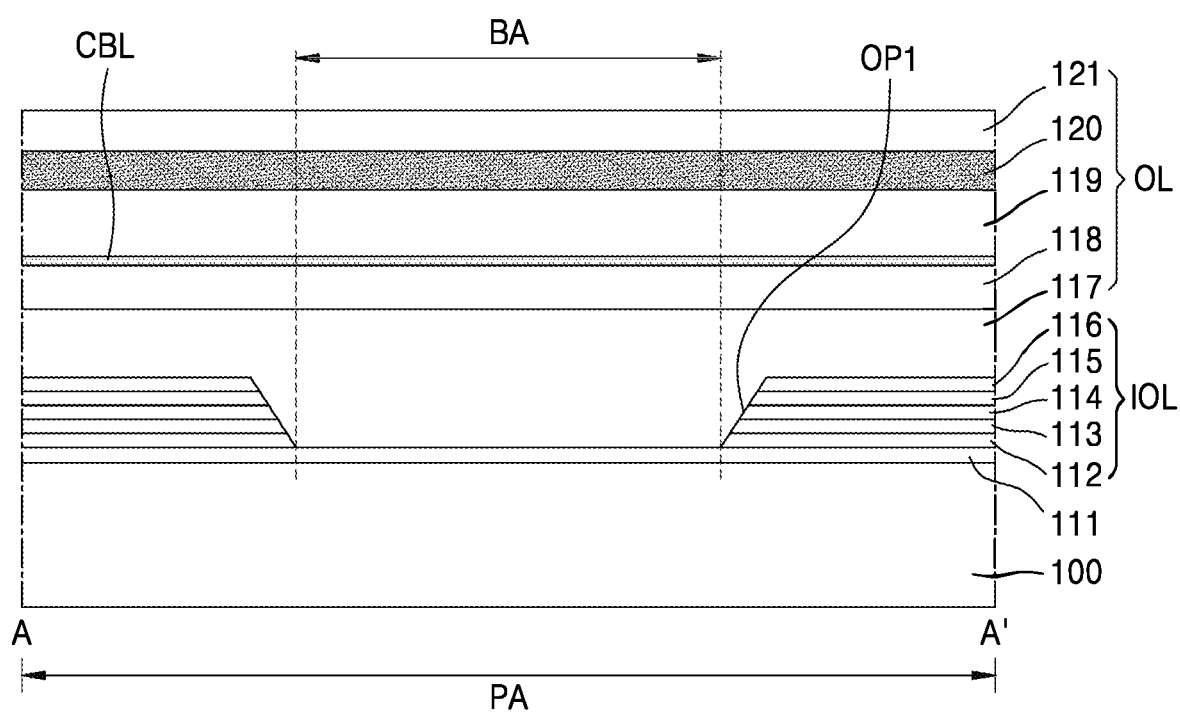
Figure 9C:
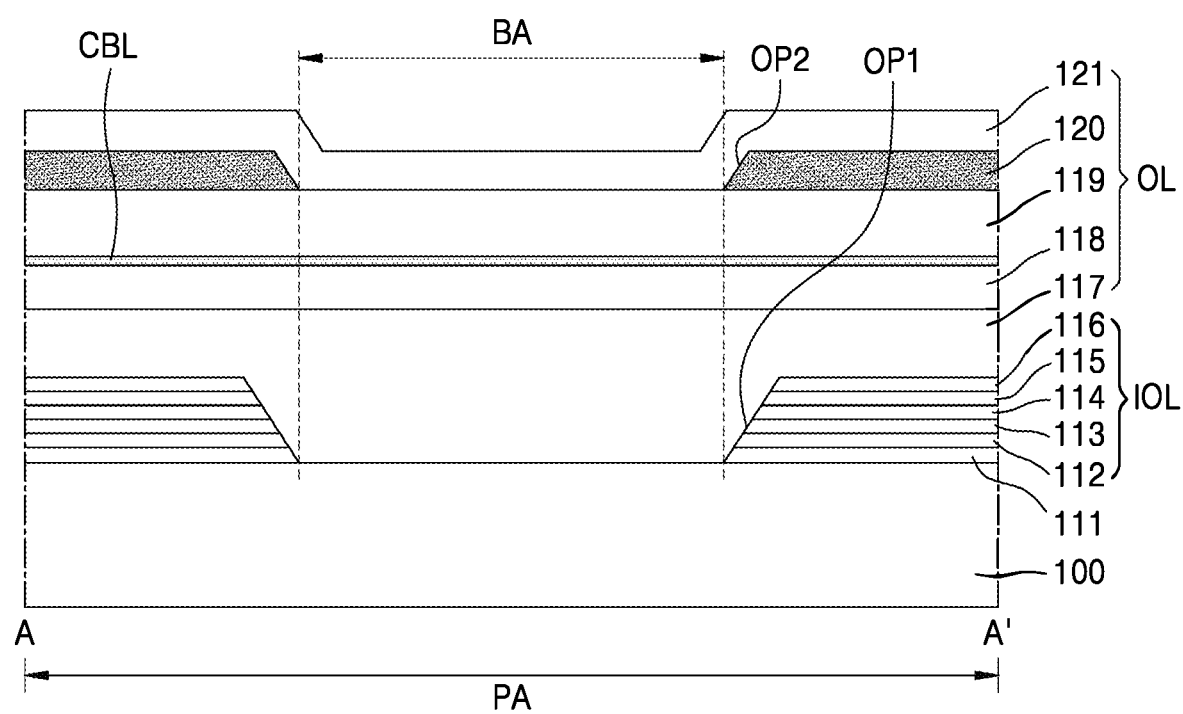
Figure 9D:
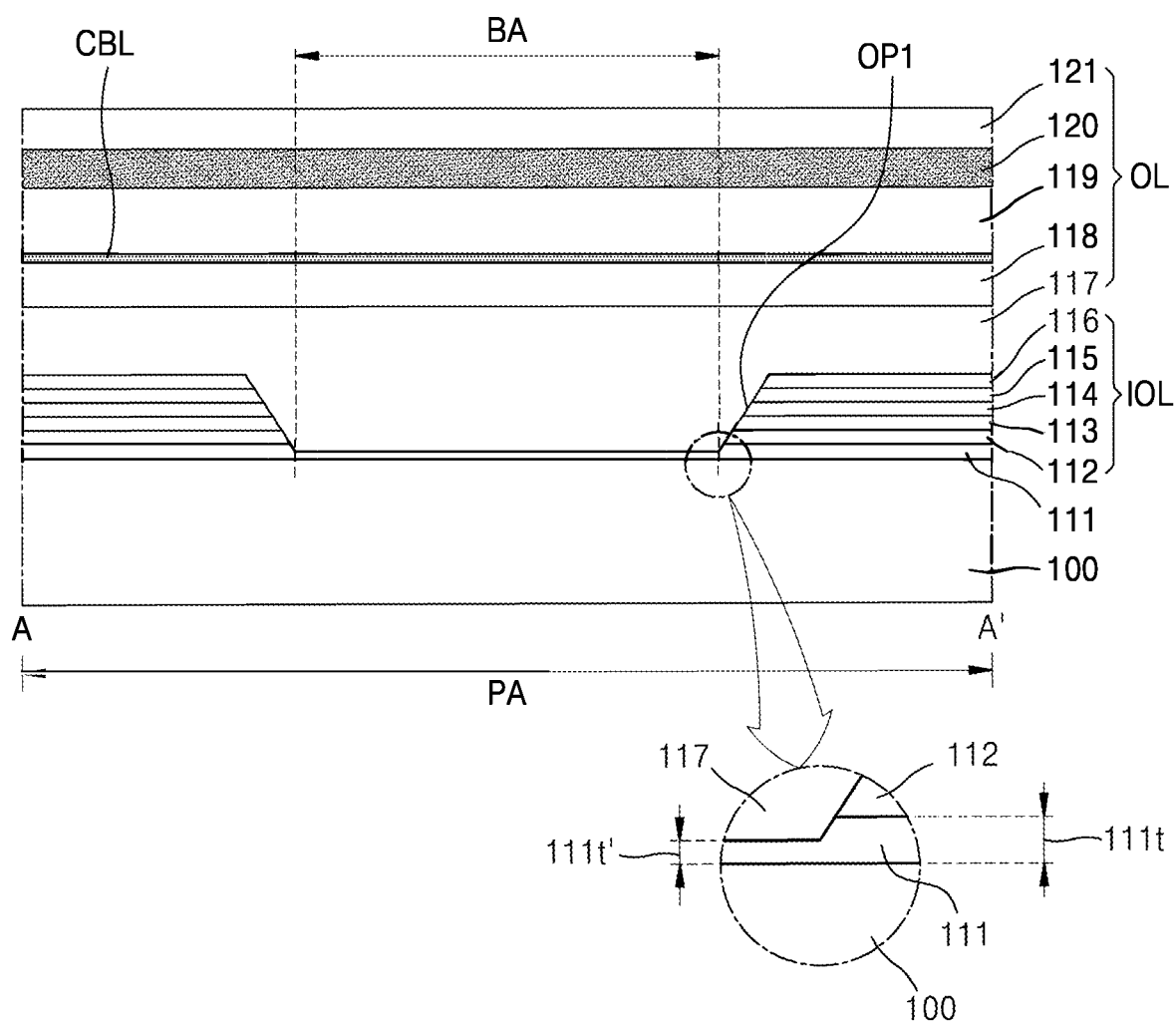

According to some embodiments, as illustrated in FIG. 9C, the first opening OP1 extends to the buffer layer 111, and thus, the upper surface of the substrate 100 may be exposed through the first opening OP1. The extension of the first opening OP1 to the buffer layer 111 may indicate that the buffer layer 111 in the first opening OP1 is removed. According to some embodiments, during an etching process of forming the first opening OP1, a portion of the buffer layer 111 in the first opening OP1 may also be removed and thus may remain in the first opening OP1. In this case, a thickness 111t' of the buffer layer 111 in the first opening OP1 may be less than a thickness 111t of the buffer layer 111 on portions other than the first opening OP1.

Figure 9E:
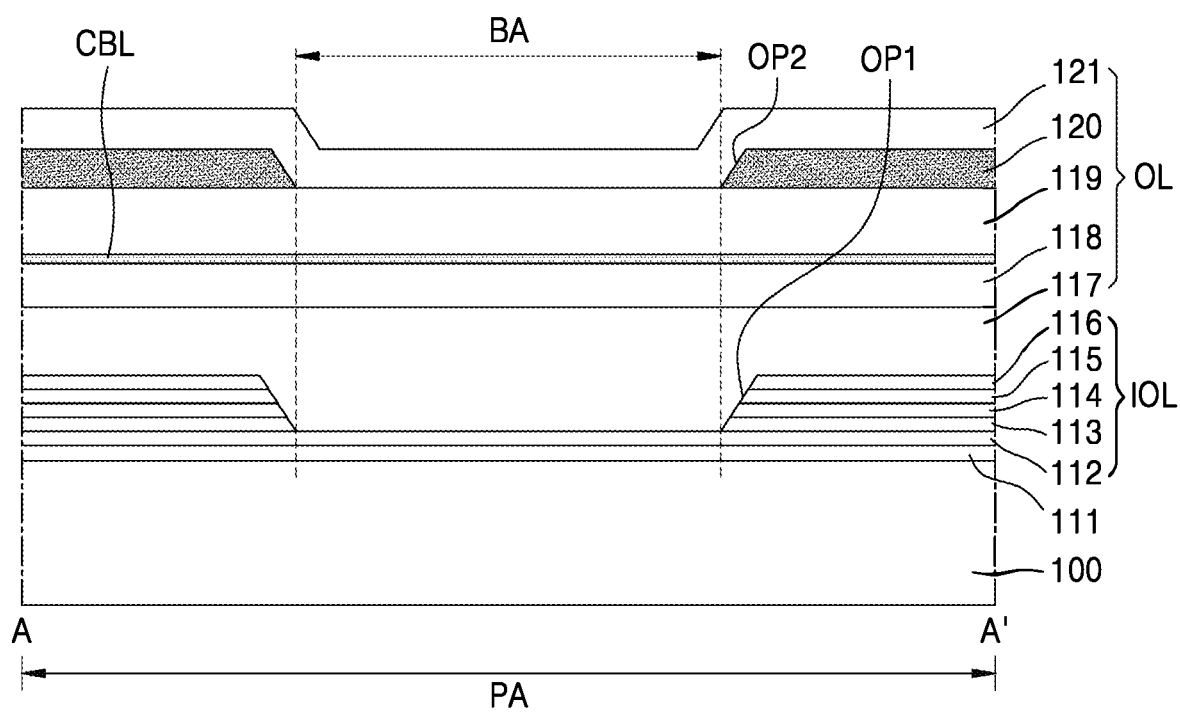
Figure 9F:
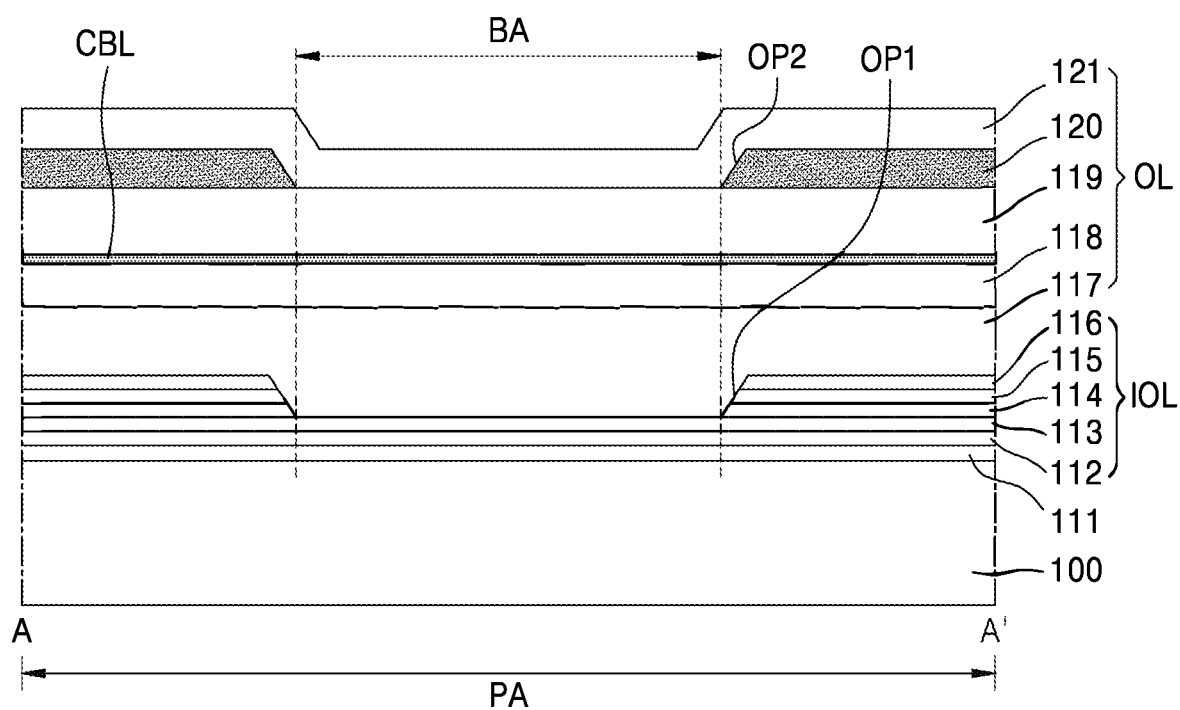

FIG. 9A, etc. illustrate that the first opening OP1 entirely penetrates the inorganic insulating layer IOL, but the first opening OP1 may penetrate some layers of the inorganic insulating layer IOL. According to some embodiments, as illustrated in FIG. 9E, the first opening OP1 may penetrate the second gate insulating layer 113, the first interlayer insulating layer 114, the third gate insulating layer 115, and the second interlayer insulating layer 116 of the inorganic insulating layer IOL, and in this case, the first gate insulating layer 112 may be exposed through the first opening OP1. Also, as illustrated in FIG. 9F, the first opening OP1 may penetrate the first interlayer insulating layer 114, the third gate insulating layer 115, and the second interlayer insulating layer 116 of the inorganic insulating layer IOL, and in this case, the second gate insulating layer 113 may be exposed through the first opening OP1.

On the inorganic insulating layer IOL, an organic insulating layer OL may be arranged as a planarization layer. The organic insulating layer OL may include the first planarization layer 117, the second planarization layer 118, the third planarization layer 119, the pixel-defining layer 120, and the spacer 121. According to some embodiments, some of the first planarization layer 117, the second planarization layer 118, the third planarization layer 119, the pixel-defining layer 120, and the spacer 121 may be omitted from the organic insulating layer OL. At least a portion of the organic insulating layer OL may be buried in the first opening OP1. For example, as illustrated in FIG. 9A, a portion of the first planarization layer 117 may be buried in the first opening OP1. An upper surface of the first planarization layer 117, which corresponds to the first opening OP1, may be substantially flat.

According to some embodiments, the pixel-defining layer 120 may include a second opening OP2 corresponding to the bending area BA. The first opening OP1 of the inorganic insulating layer IOL may overlap the second opening OP2 of pixel-defining layer 120. The overlapping may indicate that the pixel-defining layer 120 is removed corresponding to the bending area BA, and thus, the pixel-defining layer 120 may not be arranged in the bending area BA.

According to some embodiments, as illustrated in FIG. 9B, the pixel-defining layer 120 may keep being flat in the bending area BA like other organic insulating layers.

According to some embodiments, the pixel-defining layer 120 may include a light-shielding material. For example, the pixel-defining layer 120 may include an insulating material (e.g., an organic insulating material) including a black pigment or a black dye. The pixel-defining layer 120 including a light-shielding film may prevent a color mixture between adjacent pixels and may improve the visibility by absorbing light reflected from the component 20. The pixel-defining layer 120 including a black pigment or a black dye may be applied to the first sub-pixel P1 described above with reference to FIG. 6.

As described, when the pixel-defining layer 120 includes the light-shielding material, the pixel-defining layer 120 arranged in the second display area DA2 may be patterned in each of the second light-emitting elements ED2. Therefore, the pixel-defining layer 120 may be isolated in each of the second light-emitting elements ED2 and apart from each other in island shapes. A region of the second display area DA2, where the second light-emitting elements ED2 and the pixel-defining layer 120 are not arranged, may function as the transmission area TA.

Figure 10:
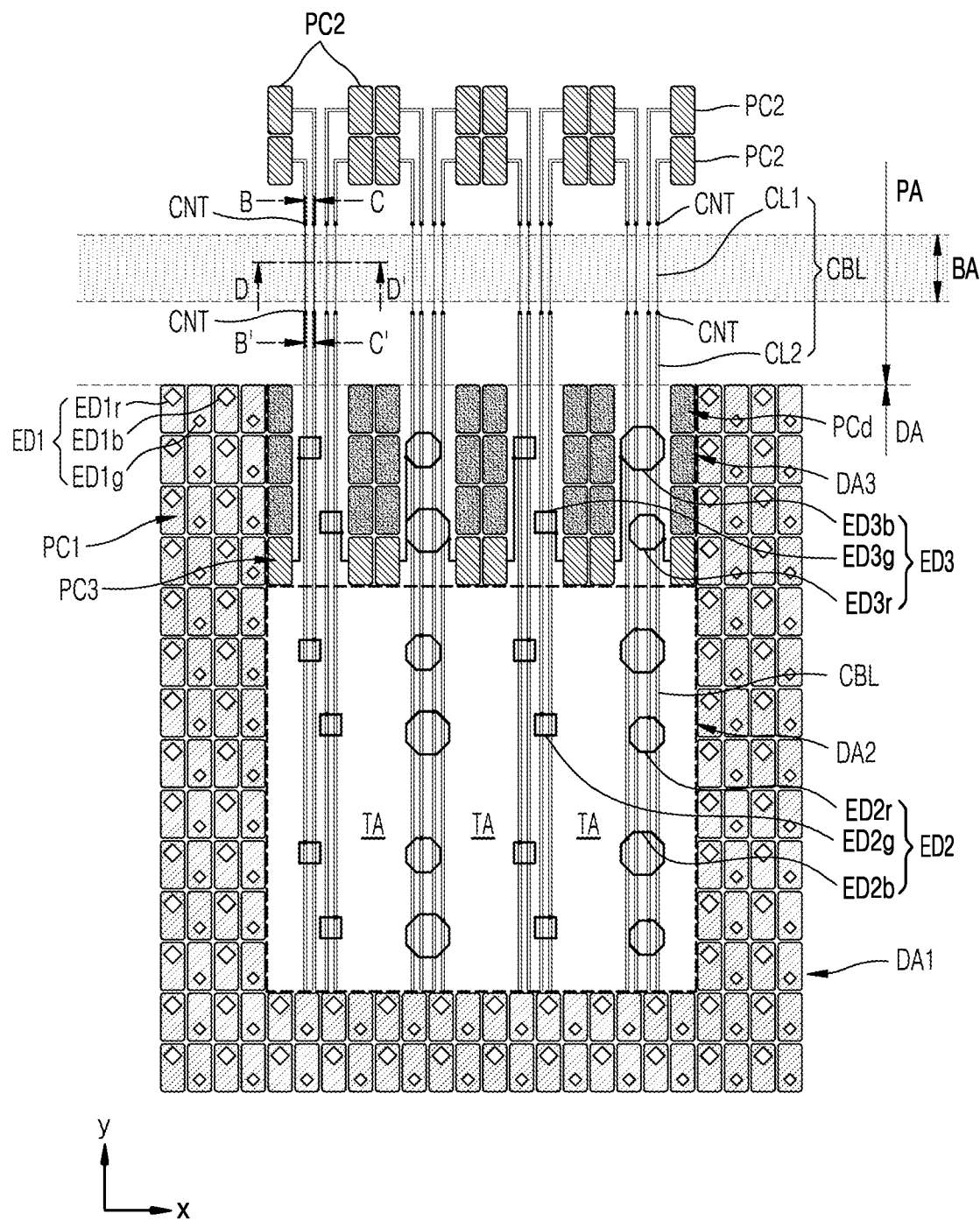
FIG. 10 is a plan view of a portion of a display panel, according to some embodiments.
Figure 11A:
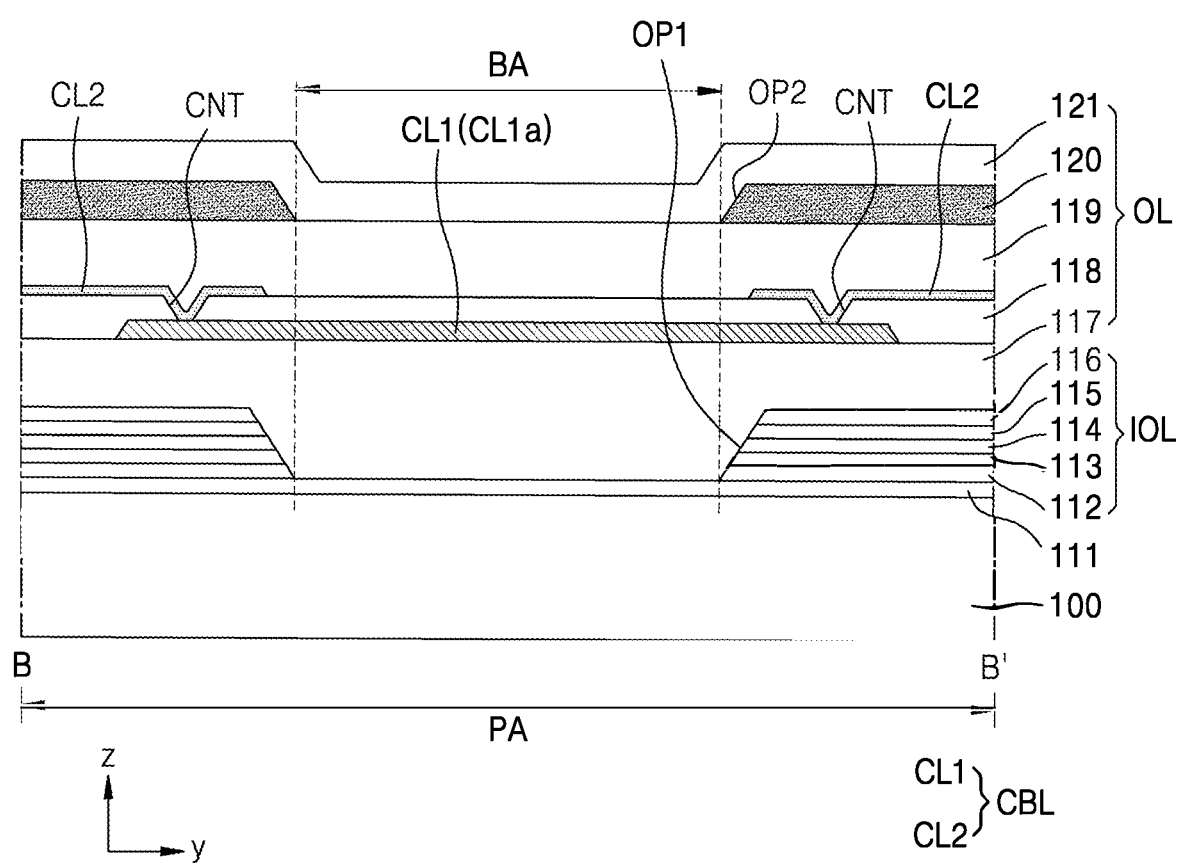
FIG. 11A is a schematic cross-sectional view of a display panel, taken along the line B-B' of FIG. 10, FIGS. 11B and 11C are schematic cross-sectional views of a display panel, taken along the line C-C' of FIG. 10.
Figure 11B:
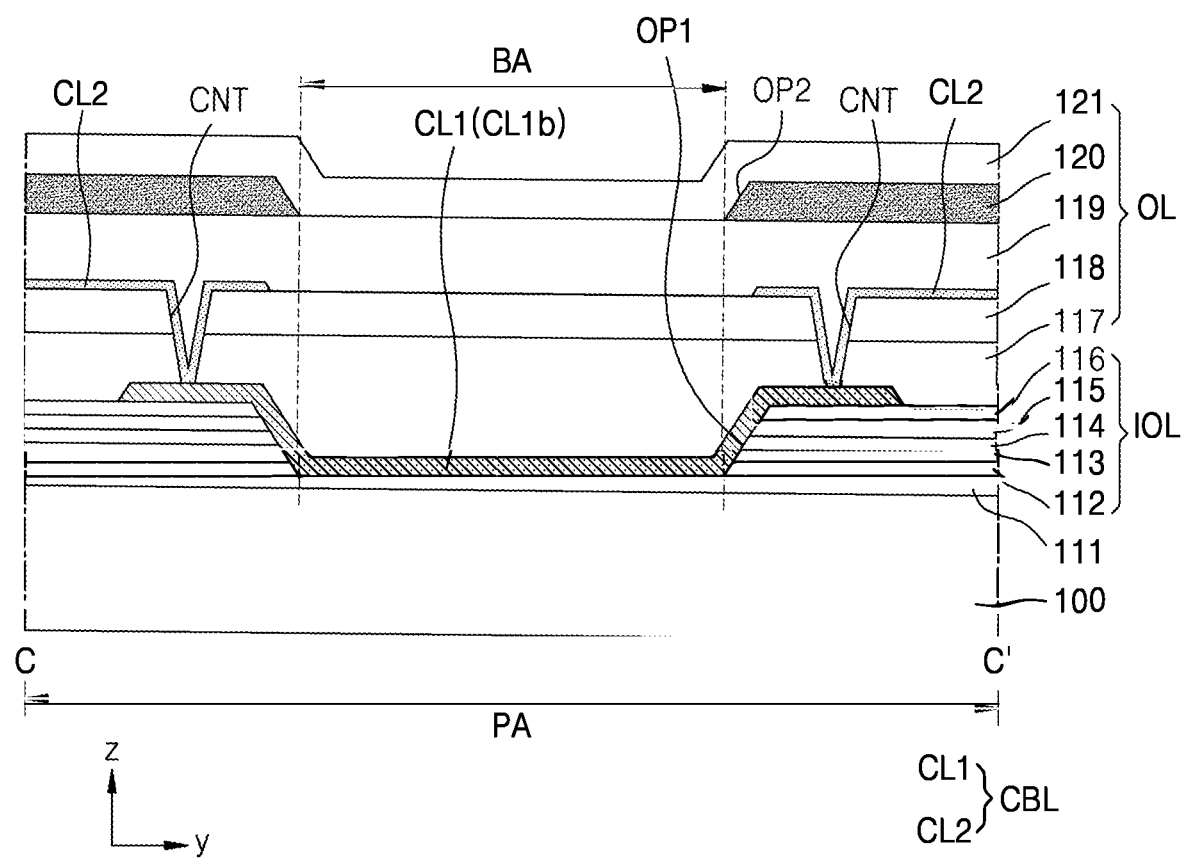
FIG. 11D is a schematic cross-sectional view of a display panel, taken along the line D-D' of FIG. 10.
Figure 11C:
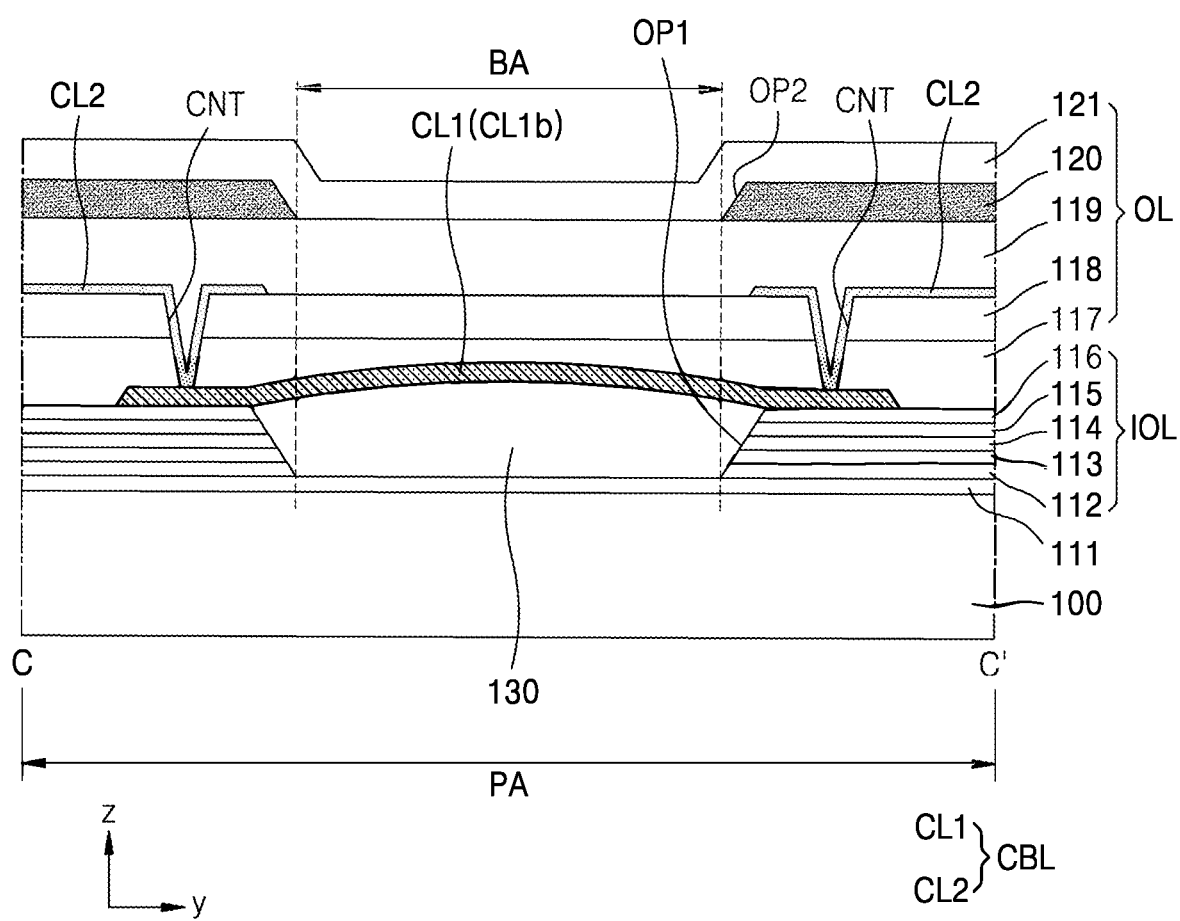
Figure 11D:
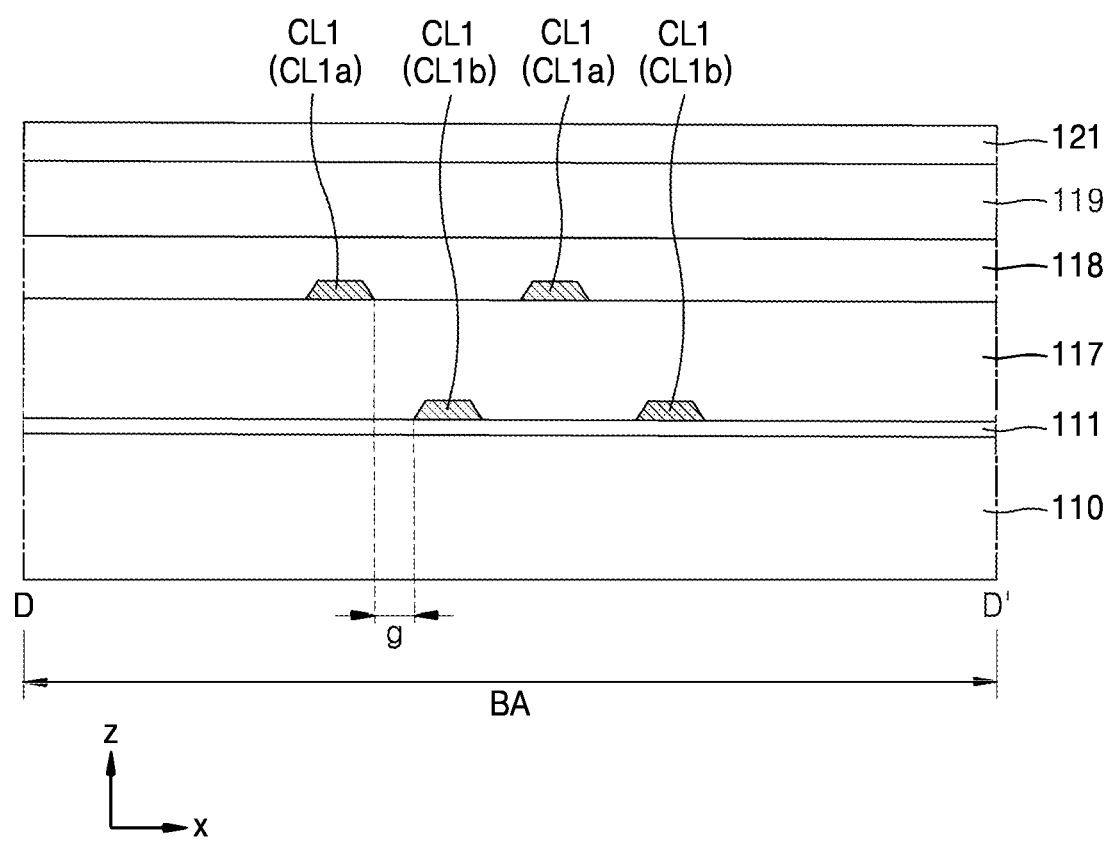

FIG. 10 is a plan view of a portion of a display panel, according to some embodiments, FIG. 11A is a schematic cross-sectional view of a display panel, taken along line B-B' of FIG. 10, FIGS. 11B and 11C are schematic cross-sectional views of a display panel, taken along line C-C' of FIG. 10, and FIG. 11D is a schematic cross-sectional view of a display panel, taken along line D-D' of FIG. 10.

The display panel of FIG. 10 is the same as that of FIG. 8 except for a structure of the conductive bus line CBL in the peripheral area PA. Hereinafter, the repeated descriptions are replaced with the descriptions of FIG. 8, and a difference between FIGS. 8 and 10 is mainly described.

Referring to FIGS. 10 and 11A, the conductive bus line CBL may be arranged in the peripheral area PA via the bending area BA and may extend to the display area DA in the second direction (e.g., the y direction). According to some embodiments, the conductive bus line CBL may include a first conductive line CL1 and a second conductive line CL2.

The first conductive line CL1 may be in the bending area BA, and the second conductive line CL2 may be in the peripheral area PA other than the bending area BA. The second conductive line CL2 may be in the peripheral area PA other than the bending area BA, but may extend to the display area DA. The first conductive line CL1 may be connected to the second conductive line CL2 through a contact hole CNT. According to some embodiments, the first conductive line CL1 may partially extend from the bending area BA to the peripheral area PA, and the contact hole CNT may be in the peripheral area PA that is adjacent to the bending area BA.

According to some embodiments, the first conductive line CL1 and the second conductive line CL2 may be on different layers. As illustrated in FIG. 11A, the first conductive line CL1 may be on the first planarization layer 117, and the second conductive line CL2 may be on the second planarization layer 118. The first conductive line CL1 may include the same material as the contact metal CM and the second conductive layer 1710 arranged on the first planarization layer 117 described above with reference to FIG. 6.

According to some embodiments, as illustrated in FIG. 11B, the first conductive line CL1 may be on the second interlayer insulating layer 116. The arrangement of the first conductive line CL1 on the second interlayer insulating layer 116 may indicate that the first conductive line CL1 includes the same material as other lines or electrodes arranged on the second interlayer insulating layer 116. When the first conductive line CL1 is arranged on the second interlayer insulating layer 116, the first conductive line CL1 may include the same material as the first source electrode S1, etc. described above with reference to FIG. 6.

A portion of the first conductive line CL1, which corresponds to the bending area BA, may extend along an inner side surface of the first opening OP1 and may be on the buffer layer 111 exposed through the first opening OP1.

According to some embodiments, as illustrated in FIG. 11C, an organic layer 130 may be buried in the first opening OP1, and the first conductive line CL1 may be arranged on the organic layer 130. As the organic layer 130 is buried in the first opening OP1 and the first conductive line CL1 is arranged directly on the organic layer 130, the stress applied to the first conductive line CL1 from the bending area BA may decrease.

According to some embodiments, the first conductive line CL1 and the second conductive line CL2 may include different materials. At least a portion of the conductive bus line CBL may include a transparent conductive material. The second conductive line CL2 of the conductive bus line CBL, that is, a portion arranged in the peripheral area PA and the display area DA other than the bending area BA, may include TCO. For example, the second conductive line CL2 may include conductive oxide such as ITO, IZO, ZnO, $In_2O_3$, IGO, IZGO, or AZO. Therefore, the decrease in the light transmittance of the transmission area TA may be reduced.

The first conductive line CL1 of the conductive bus line CBL, that is, a portion corresponding to the bending area BA, may include an opaque metal material. For example, the first conductive line CL1 may include a material having higher conductivity than the TCO described above. The first conductive line CL1 may include a conductive material such as Mo, Al, Cu, or Ti and may be a layer or layers including the above material. For example, the first conductive line CL1 may have a multilayered structure of Ti/Al/Ti. The first conductive line CL1 may have greater elongation than the second conductive line CL2. That is, the metal material included in the first conductive line CL1 may be more flexible than the second conductive line CL2 in the bending area BA. Therefore, as the first conductive line CL1 is arranged corresponding to the bending area BA, the stress applied to the conductive bus line CBL in the bending area BA may effectively decrease.

The first conductive line CL1 may have the structure illustrated in FIG. 11A or the structure illustrated in FIG. 11B (or 11C). Alternatively, the first conductive line CL1 may complexly have the structures illustrated in FIG. 11A and FIG. 11B (or 11C). In this case, the first conductive lines CL1 adjacent to each other may be on different layers.

FIG. 11D illustrates the first conductive lines CL1 to which the structures of FIGS. 11A and 11B are complexly applied. Hereinafter, the first conductive line CL1 of FIG. 11A is described as a 1-1 conductive line CL1a, and the first conductive line CL1 of FIG. 11B is described as a 1-2 conductive line CL1b.

Referring to FIG. 11D, the first conductive lines CL1, which are adjacent to each other, may be formed as the 1-1 conductive line CL1a and the 1-2 conductive line CL1b are alternately arranged. The 1-1 conductive line CL1a and the 1-2 conductive line CL1b may be arranged adjacent to each other, may be on different layers, and may not overlap each other. According to some embodiments, the 1-1 conductive line CL1a may be on the first planarization layer 117 and may include the same material as the contact metal CM on the first planarization layer 117 described above with reference to FIG. 6. The 1-2 conductive line CL1b may be on the second interlayer insulating layer 116 and may include the same material as the first source electrode S1, etc. described above with reference to FIG. 6. Because the 1-1 conductive line CL1a and the 1-2 conductive line CL1b, which are adjacent to each other, are arranged on different layers, a gap g between the 1-1 conductive line CL1a and the 1-2 conductive line CL1b may be relatively small, and thus, a space where the first conductive lines CL1 are arranged may be effectively used.

Figure 12:
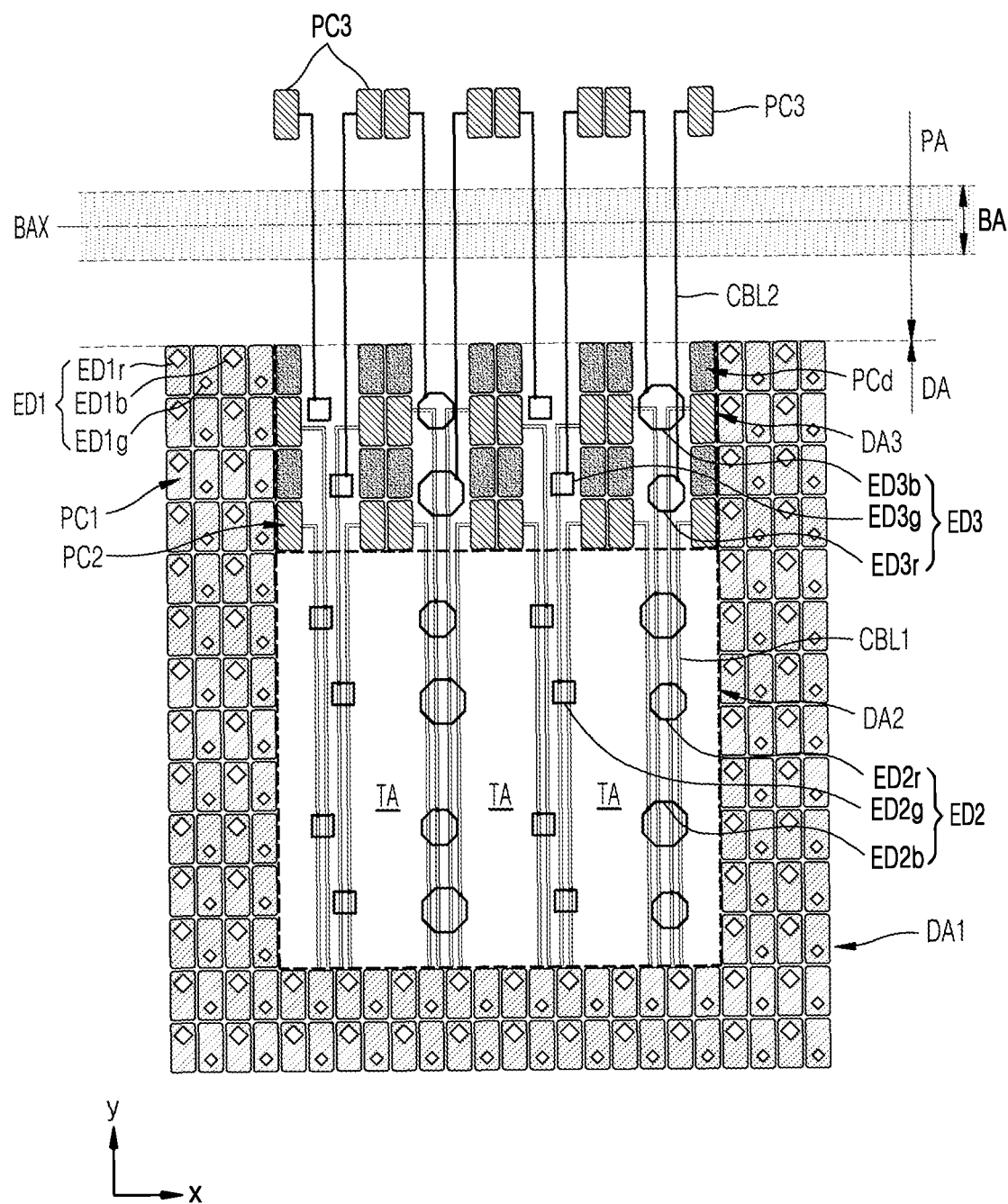
FIGS. 12 and 13 are plan views of a portion of a display panel, according to some embodiments.
Figure 13:
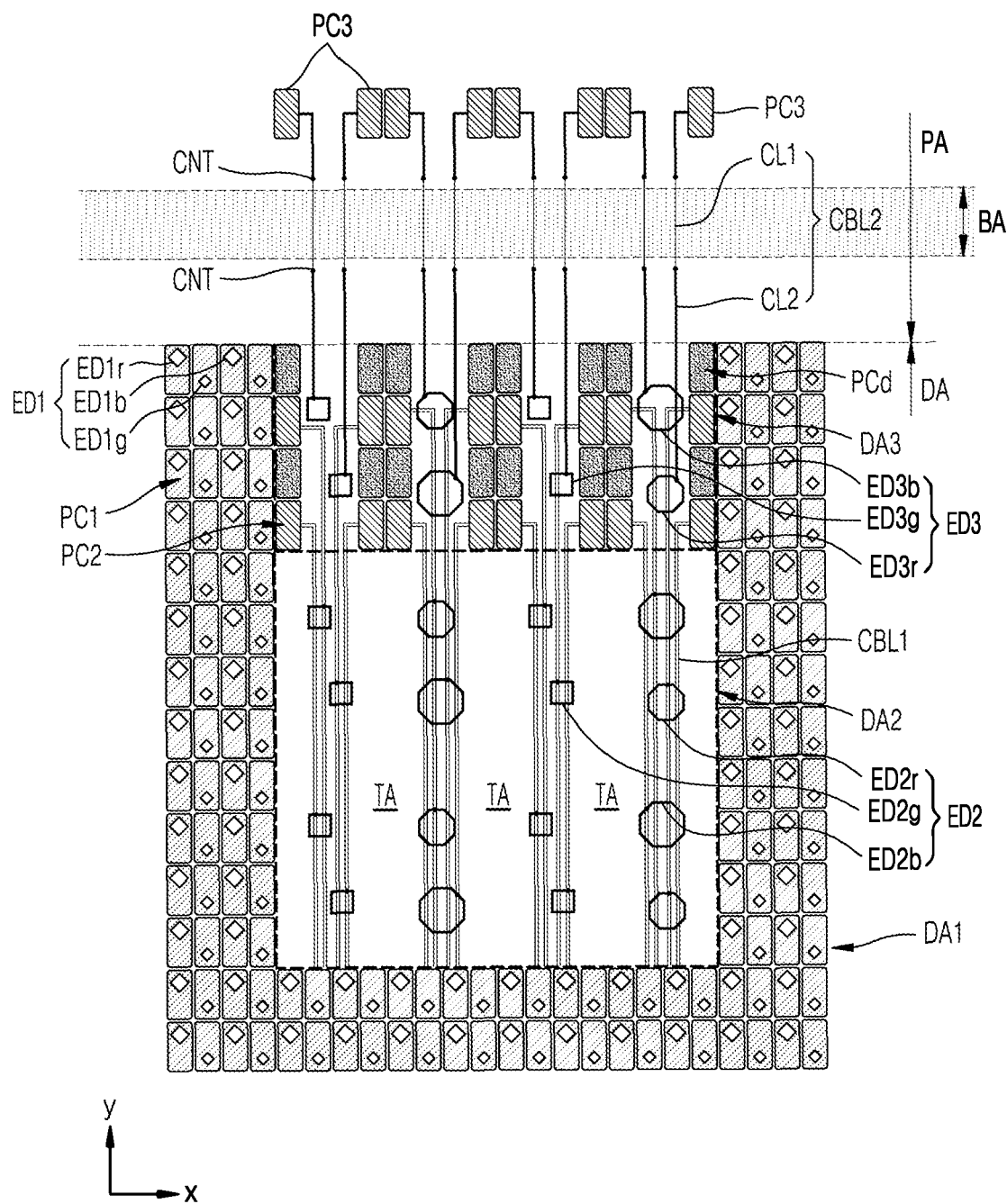
Figure 14:
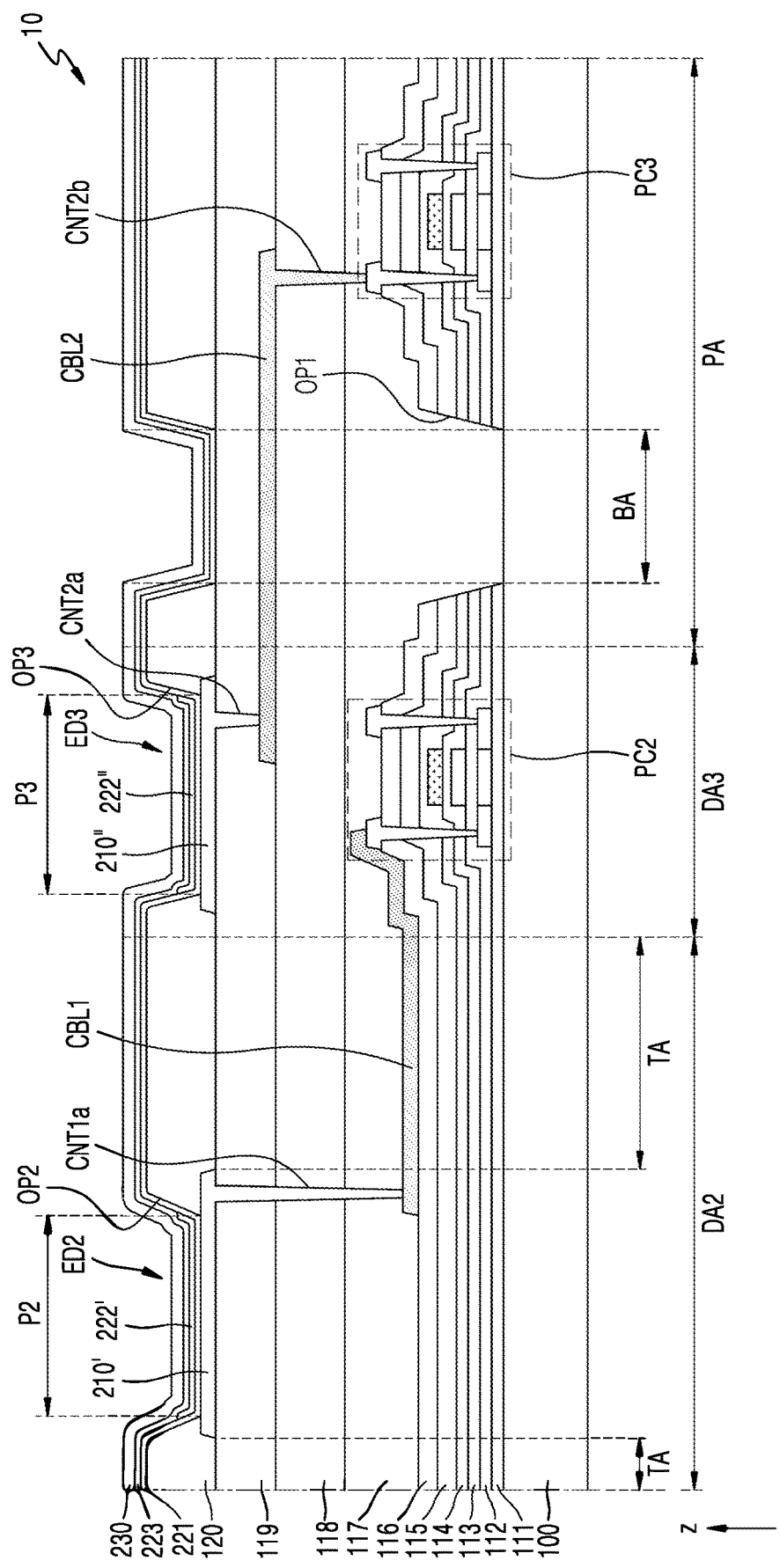
FIG. 14 is a cross-sectional view of a portion of a display panel, according to some embodiments.

FIGS. 12 and 13 are plan views of a portion of a display panel, according to some embodiments, and FIG. 14 is a cross-sectional view of a portion of a display panel, according to some embodiments.

Descriptions regarding FIGS. 12 and 13 are the same as those regarding FIG. 7 or 8 in that the bending area BA is on one side of the peripheral area PA and the conductive bus line CBL is arranged via the bending area BA. FIGS. 12 and 13 are different from the above embodiments in terms of a connection structure of the conductive bus line CBL. Hereinafter, the descriptions already provided will not be repeated, and a difference will be mainly described.

Referring to FIG. 12, the conductive bus lines CBL may include a first conductive bus line CBL1 and a second conductive bus line CBL2. The first conductive bus line CBL1 and the second conductive bus line CBL2 may connect a pixel circuit and a light-emitting element arranged in different areas.

As illustrated in FIG. 12, the first light-emitting element ED1 may be arranged in the first display area DA1, and the first sub-pixel circuit PC1 for allowing the emission of the first light-emitting element ED1 may be in the first display area DA1. Also, the second light-emitting element ED2 may be arranged in the second display area DA2, and the second sub-pixel circuit PC2 for allowing the emission of the second light-emitting element ED2 may be arranged in the third display area DA3. Also, the third light-emitting element ED3 may be arranged in the third display area DA3, and the third sub-pixel circuit PC3 for allowing the emission of the third light-emitting element ED3 may be arranged in the peripheral area PA.

According to some embodiments, the first conductive bus line CBL1 may be arranged over the second display area DA2 and the third display area DA3. The first conductive bus line CBL1 may electrically connect the second light-emitting element ED2 in the second display area DA2 to the second sub-pixel circuit PC2 in the third display area DA3. In other words, one side of the first conductive bus line CBL1 may be connected to the second light-emitting element ED2 in the second display area DA2, and the other side of the first conductive bus line CBL1 may be connected to the second sub-pixel circuit PC2 in the third display area DA3.

The second conductive bus line CBL2 may be in the peripheral area PA and the third display area DA3 across the bending area BA. The second conductive bus line CBL2 may connect the third light-emitting element ED3 in the third display area DA3 to the third sub-pixel circuit PC3 in the peripheral area PA. In other words, one side of the second conductive bus line CBL2 may be connected to the third light-emitting element ED3 in the third display area DA3, and the other side of the second conductive bus line CBL2 may be connected to the third sub-pixel circuit PC3 in the peripheral area PA.

FIG. 12 illustrates that the second conductive bus line CBL2 is one conductive layer extending in the second direction (e.g., the y direction), but one or more embodiments are not limited thereto.

According to some embodiments, as illustrated in FIG. 13, the second conductive bus line CBL2 may include a first conductive line CL1 and a second conductive line CL2. The first conductive line CL1 may be in the bending area BA, and the second conductive line CL2 may be in the peripheral area PA other than the bending area BA. Structures of the first conductive line CL1 and the second conductive line CL2 are the same as those described with reference to FIGS. 10 and 11.

The first conductive bus line CBL1 and the second conductive bus line CBL2 may be on the same layer or different layers. Also, the first conductive bus line CBL1 and the second conductive bus line CBL2 may include the same material or different materials.

According to some embodiments, the first conductive bus line CBL1 and the second conductive bus line CBL2 may include TCO arranged on different layers. FIG. 14 illustrates a cross-sectional structure in which the peripheral area PA including the bending area BA, the third display area DA3, and the second display area DA2 are continuously arranged.

Referring to FIG. 14, the first conductive bus line CBL1 may be arranged on the second interlayer insulating layer 116. One side of the first conductive bus line CBL1 may be connected to the second light-emitting element ED2, which is in the second display area DA2, through a contact hole CNT1a penetrating the first to third planarization layers 117 to 119, and the other side of the first conductive bus line CBL1 may be directly connected to the second sub-pixel circuit PC2 in the third display area DA3. The second conductive bus line CBL2 may be on the second planarization layer 118. One side of the second conductive bus line CBL2 may be connected to the third light-emitting element ED3, which is in the third display area DA3, through a contact hole CNT2a defined in the third planarization layer 119, and the other side of the second conductive bus line CBL2 may be connected to the third sub-pixel circuit PC3 in the peripheral area PA through a contact hole CNT2b penetrating the first and second planarization layers 117 and 118.

Figure 15:
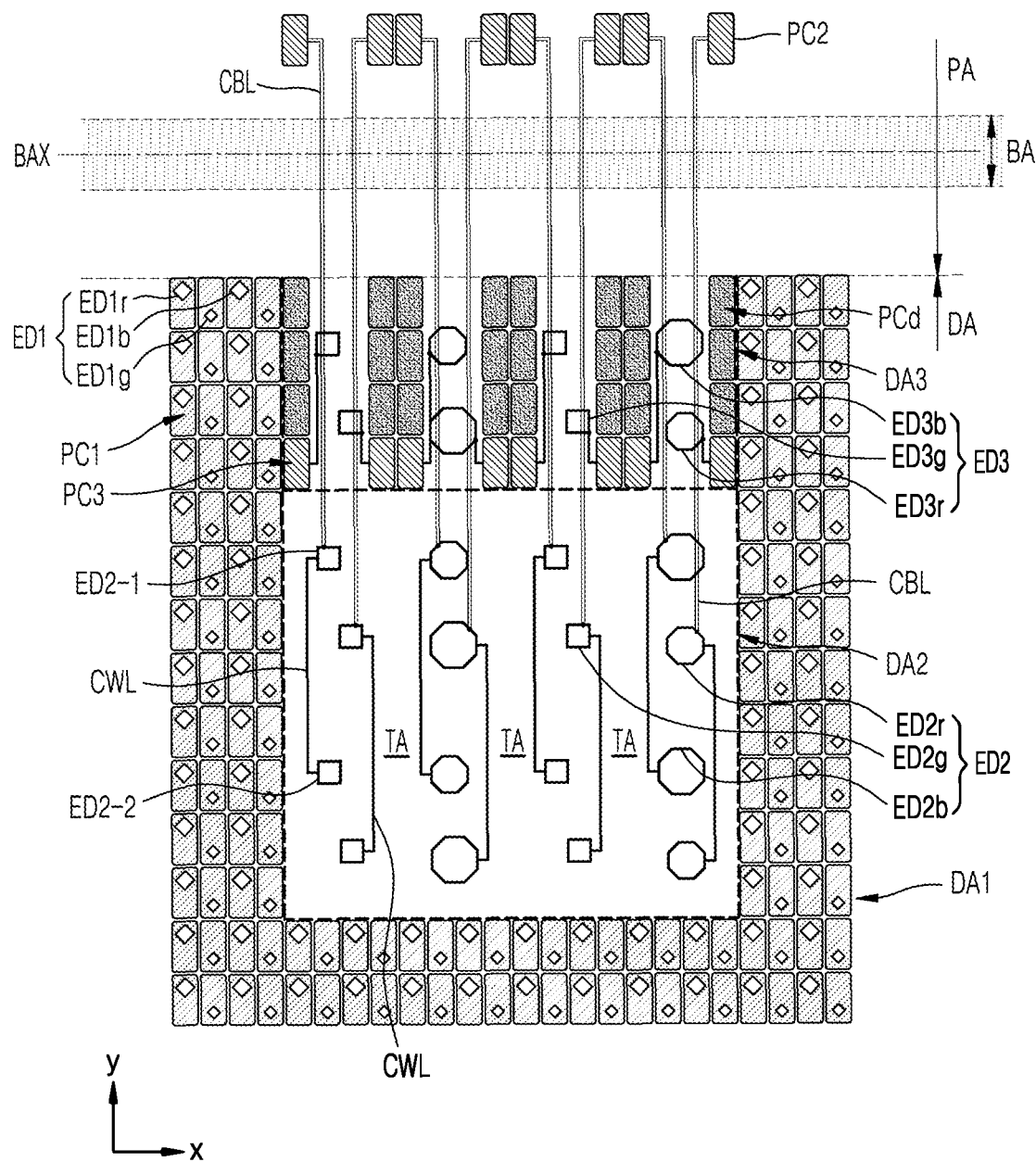
FIGS. 15 and 16 are plan views of a portion of a display panel, according to some embodiments.
Figure 16:
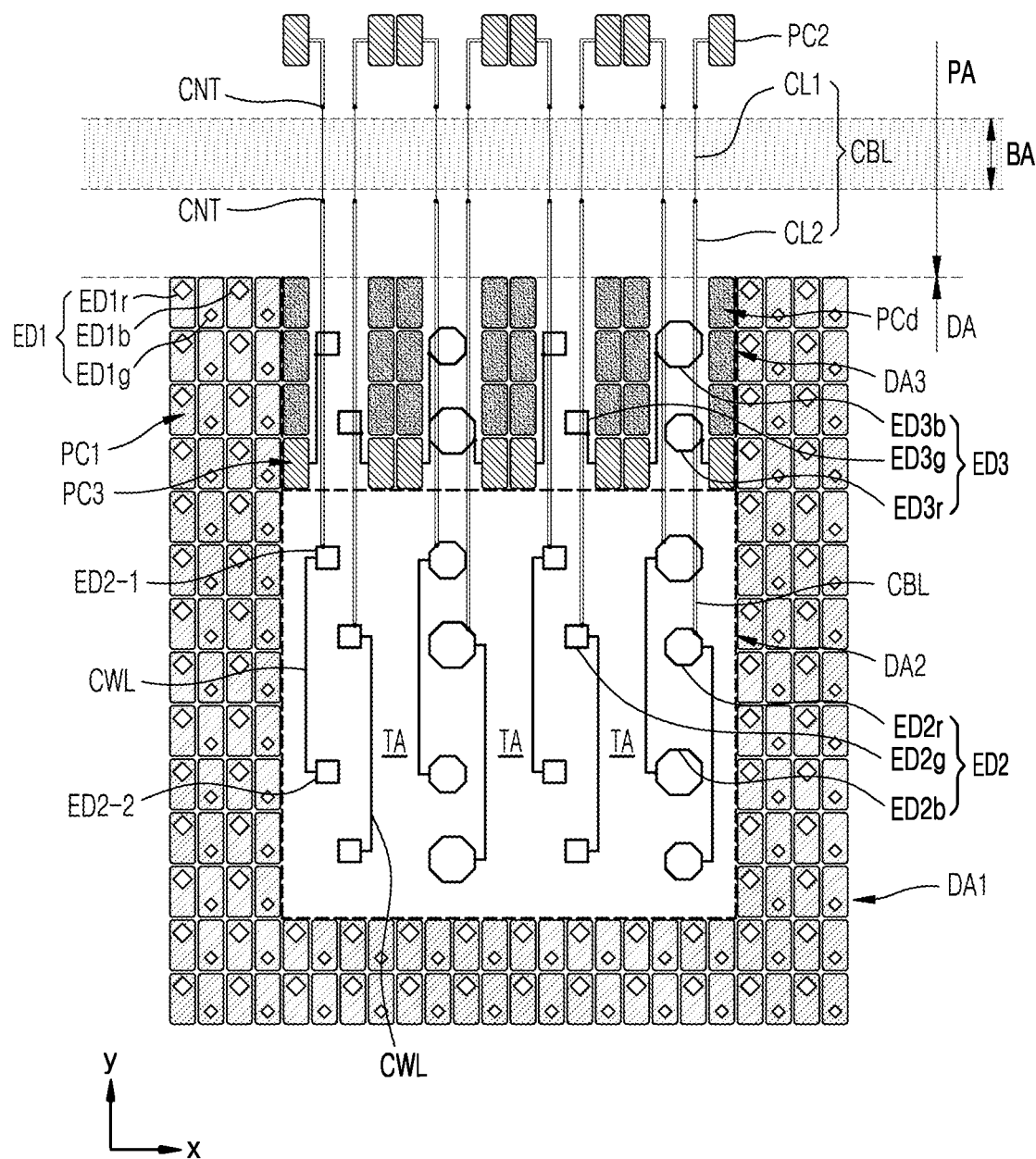

FIGS. 15 and 16 are plan views of a portion of a display panel, according to an embodiment Descriptions regarding FIGS. 15 and 16 are the same as those regarding FIG. 7 or 8 in that the bending area BA is on one side of the peripheral area PA and the conductive bus line CBL is arranged via the bending area BA. FIGS. 15 and 16 are different from the above embodiments in terms of a connection structure of the conductive bus line CBL and structures of the light-emitting elements (e.g., the second and third light-emitting elements ED2 and ED3) connected to the conductive bus line CBL. Hereinafter, the descriptions already provided will not be repeated, and a difference will be mainly described.

Referring to FIG. 15, the conductive bus line CBL may electrically connect the second sub-pixel circuit PC2 to the second light-emitting element ED2.

As illustrated in FIG. 15, the first light-emitting element ED1 may be arranged in the first display area DA1, and the first sub-pixel circuit PC1 for allowing the emission of the first light-emitting element ED1 may be arranged in the first display area DA1. Also, the second light-emitting element ED2 may be arranged in the second display area DA2, and the second sub-pixel circuit PC2 for allowing the emission of the second light-emitting element ED2 may be arranged in the peripheral area PA. Also, the third light-emitting element ED3 may be arranged in the third display area DA3, and the third sub-pixel circuit PC3 for allowing the emission of the third light-emitting element ED3 may be arranged in the third display area DA3.

According to some embodiments, the third light-emitting element ED3 may be arranged in the third display area DA3, and the third sub-pixel circuit PC3 for allowing the emission of the third light-emitting element ED3 may be divided and arranged in the third display area DA3 and the peripheral area PA. According to some embodiments, the third light-emitting element ED3 may be arranged in the third display area DA3, and the third sub-pixel circuit PC3 for allowing the emission of the third light-emitting element ED3 may be arranged only in the peripheral area PA. In this case, only the third light-emitting element ED3 is arranged in the third display area DA3, and thus, an area other than an area, where the third light-emitting element ED3 is arranged, may be used as a transmission area.

The conductive bus line CBL of FIG. 15 may connect one second light-emitting element ED2 to one second sub-pixel circuit PC2. One second light-emitting element ED2 (hereinafter, a 2-1 light-emitting element ED2-1) connected to the conductive bus line CBL in the second display area DA2 may be connected to an adjacent second light-emitting element ED2 (hereinafter, a 2-2 light-emitting element ED2-2). The 2-2 light-emitting element ED2-2 may not be directly connected to the conductive bus line CBL and may be configured to receive an electrical signal through the 2-1 light-emitting element ED2-1. The 2-1 light-emitting element ED2-1 may be electrically connected to the 2-2 light-emitting element ED2-2 through a connection wire CWL. For example, the connection wire CM may connect a pixel electrode of the 2-1 light-emitting element ED2-1 to a pixel electrode of the 2-2 light-emitting element ED2-2. Various modifications may be made to the connection wire CM. For example, the connection wire CM may be integrally formed with the pixel electrode of the 2-1 light-emitting element ED2-1 and the pixel electrode of the 2-2 light-emitting element ED2-2.

FIG. 15 illustrates that two light-emitting elements, for example, the 2-1 light-emitting element ED2-1 and the 2-2 light-emitting element ED2-2, are driven using one second sub-pixel circuit PC2, but one or more embodiments are not limited thereto. Three, four, or more light-emitting elements may be driven using one second sub-pixel circuit PC2.

FIG. 15 illustrates that the conductive bus line CBL includes one conductive layer extending in the second direction (e.g., the y direction), but one or more embodiments are not limited thereto.

According to some embodiments, as illustrated in FIG. 16, the conductive bus line CBL may include the first conductive line CL1 and the second conductive line CL2. The first conductive line CL1 may be in the bending area BA, and the second conductive line CL2 may be in the peripheral area PA other than the bending area BA. Structures of the first conductive line CL1 and the second conductive line CL2 are the same as those described with reference to FIGS. 10 and 11.

Figure 17:
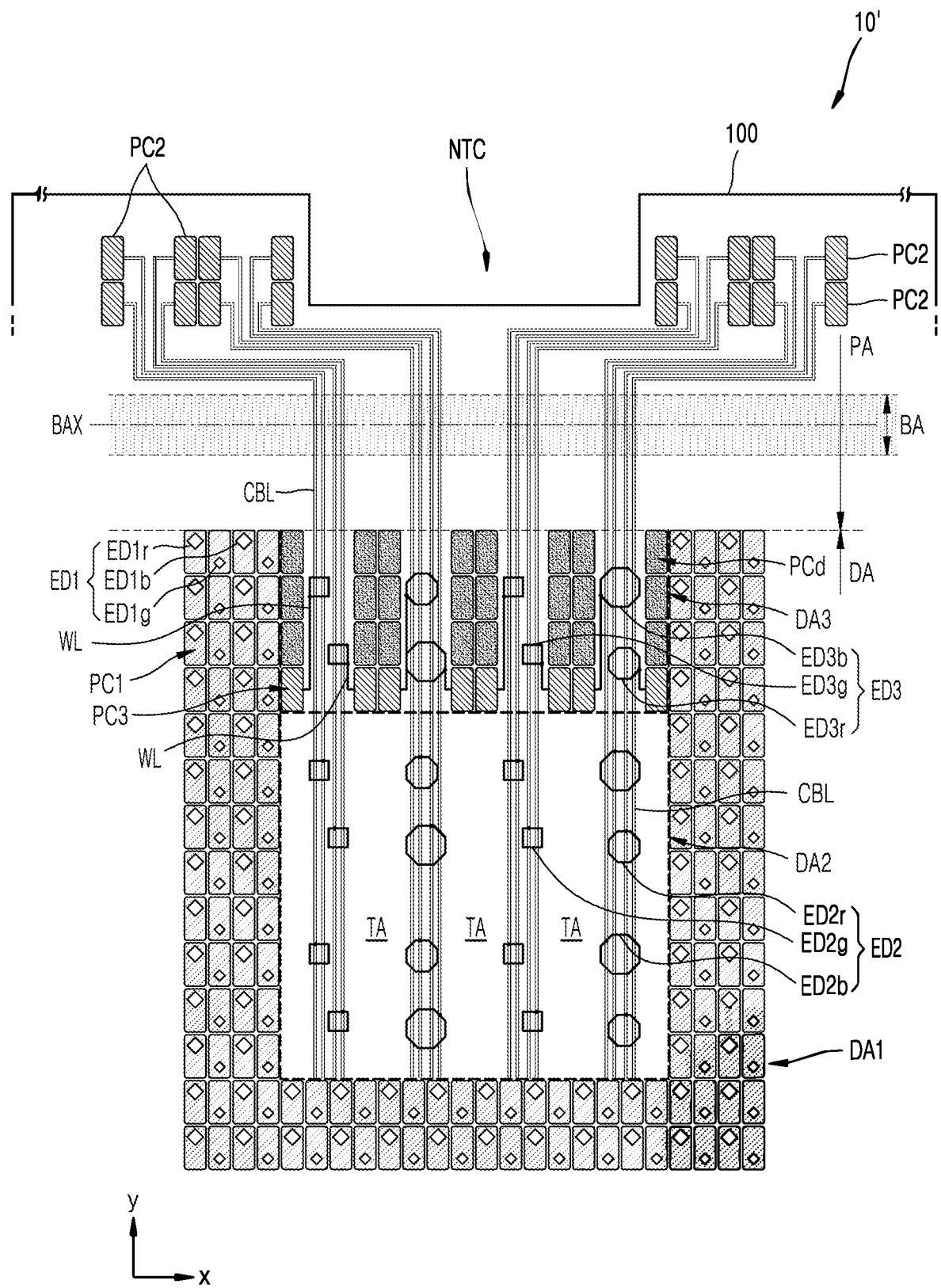
FIGS. 17 and 18 are plan views of a portion of a display panel, according to some embodiments.
Figure 18:
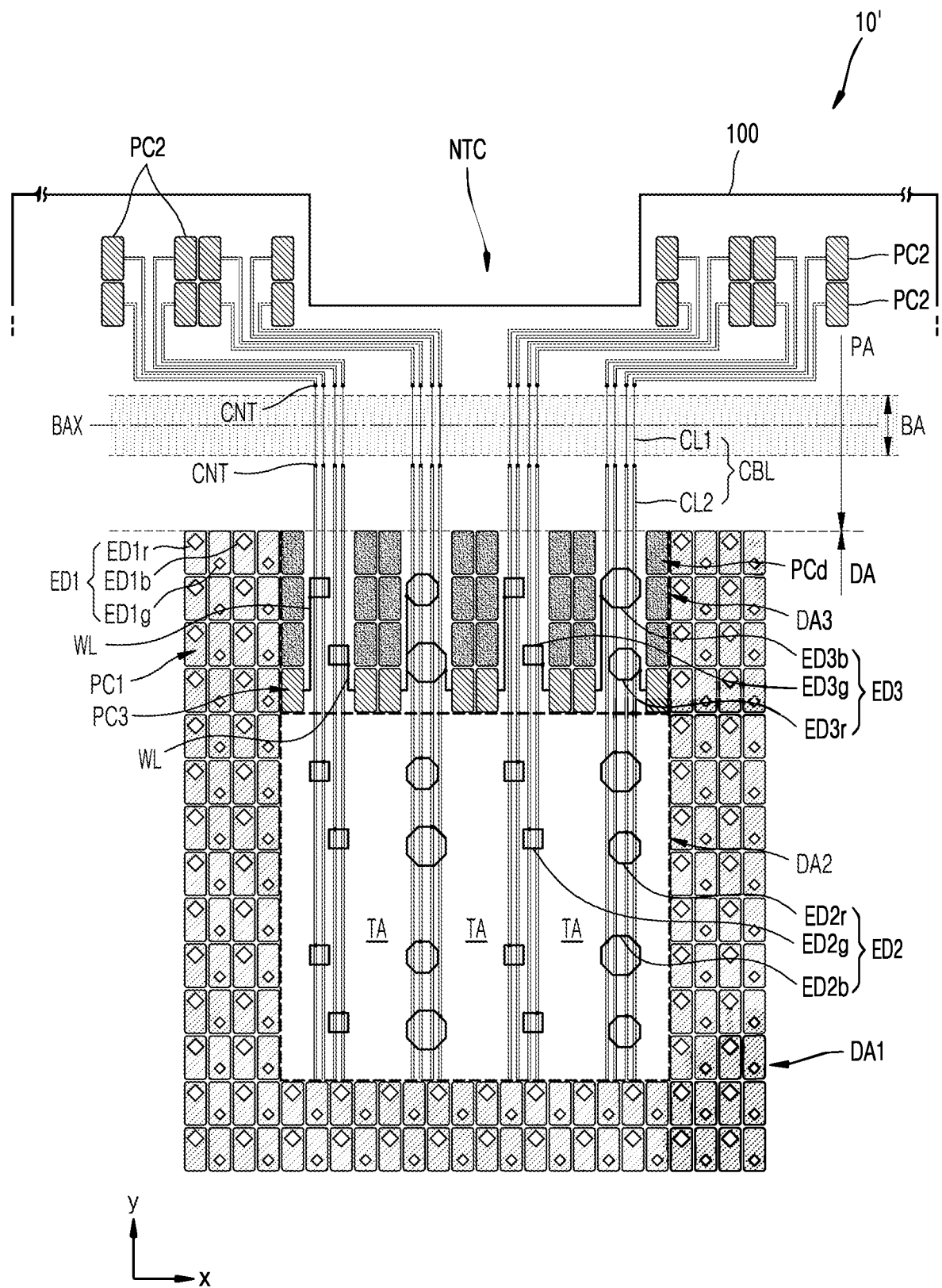
Figure 19:
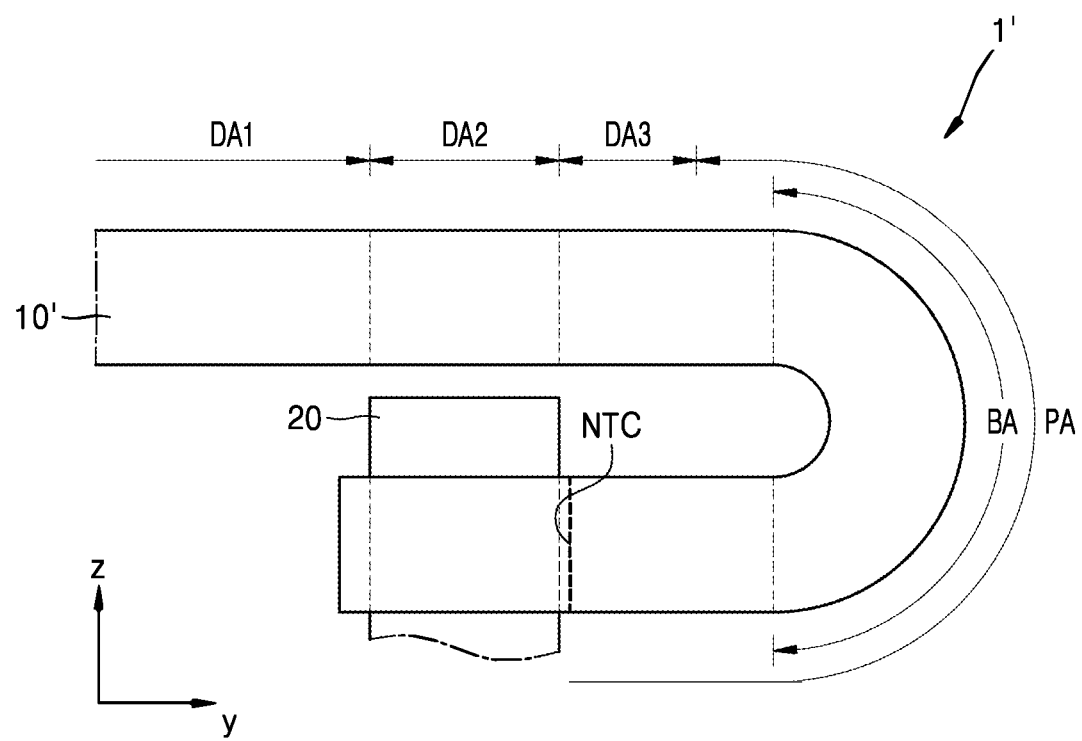
FIG. 19 is a schematic cross-sectional view of a portion of an electric apparatus including the display panel of FIG. 17 or 18.

FIGS. 17 and 18 are plan views of a portion of a display panel, according to some embodiments, and FIG. 19 is a schematic cross-sectional view of a portion of an electric apparatus including the display panel of FIGS. 17 and 18.

Descriptions regarding FIGS. 17 and 18 are the same as those regarding FIG. 7 or 8 in that the bending area BA is on one side of the peripheral area PA and the conductive bus line CBL is arranged via the bending area BA. FIGS. 17 and 18 are different from the above embodiments in terms of a structure of the substrate 100 and the arrangements of the second sub-pixel circuits PC2. Hereinafter, the descriptions already provided will not be repeated, and a difference will be mainly described.

Referring to FIG. 17, the substrate 100 may include a notch portion NTC on one side of the peripheral area PA. The notch portion NTC may have a structure in which part of an edge of the substrate 100 is drawn in a direction towards the display area DA (e.g., a −y direction in FIG. 17). FIG. 17 illustrates that the notch portion NTC is at the center of the peripheral area PA on an upper portion of a display panel 10', but the location of the notch portion NTC may change according to the necessity of a design. Also, FIG. 17 illustrates one notch portion NTC, but there may be two or more notch portions NTC.

The second sub-pixel circuits PC2 may be arranged on one side and the other side of the notch portion NTC with respect to the notch portion NTC. FIG. 17 illustrates a configuration in which the second sub-pixel circuits PC2 are arranged on the left side and the right side of the notch portion NTC with respect to the notch portion NTC, but one or more embodiments are not limited thereto. The second sub-pixel circuits PC2 may be arranged on either one side or the other side of the notch portion NTC.

As illustrated in FIG. 19, the notch portion NTC may overlap the component 20 when the display panel 10' is bent. That is, the component 20 may be in the notch portion NTC in an electric apparatus 1'. As a comparative example, in the case of a display panel that does not include a notch portion, when a portion of a peripheral area of a substrate is bent in a bending area, the bent portion of the substrate may interfere with a component. Therefore, to prevent the above problem, the substrate 100 may include the notch portion NTC on one side of the peripheral area PA. As a portion of the substrate100 is removed from a portion corresponding to the notch portion NTC, the portion of the substrate 100, which is folded when the display panel 10 is bent, may be prevented from interfering with the component 20, and the component 20 may be freely arranged.

FIG. 17 illustrates that the conductive bus line CBL includes one conductive layer extending in the second direction (e.g., the y direction), but one or more embodiments are not limited thereto.

According to some embodiments, as illustrated in FIG. 18, the conductive bus line CBL may include the first conductive line CL1 and the second conductive line CL2. The first conductive line CL1 may be arranged in the bending area BA, and the second conductive line CL2 may be arranged in the peripheral area PA other than the bending area BA. The structures of the first conductive line CL1 and the second conductive line CL2 are the same as those described with reference to FIGS. 10 and 11.

Figure 20:
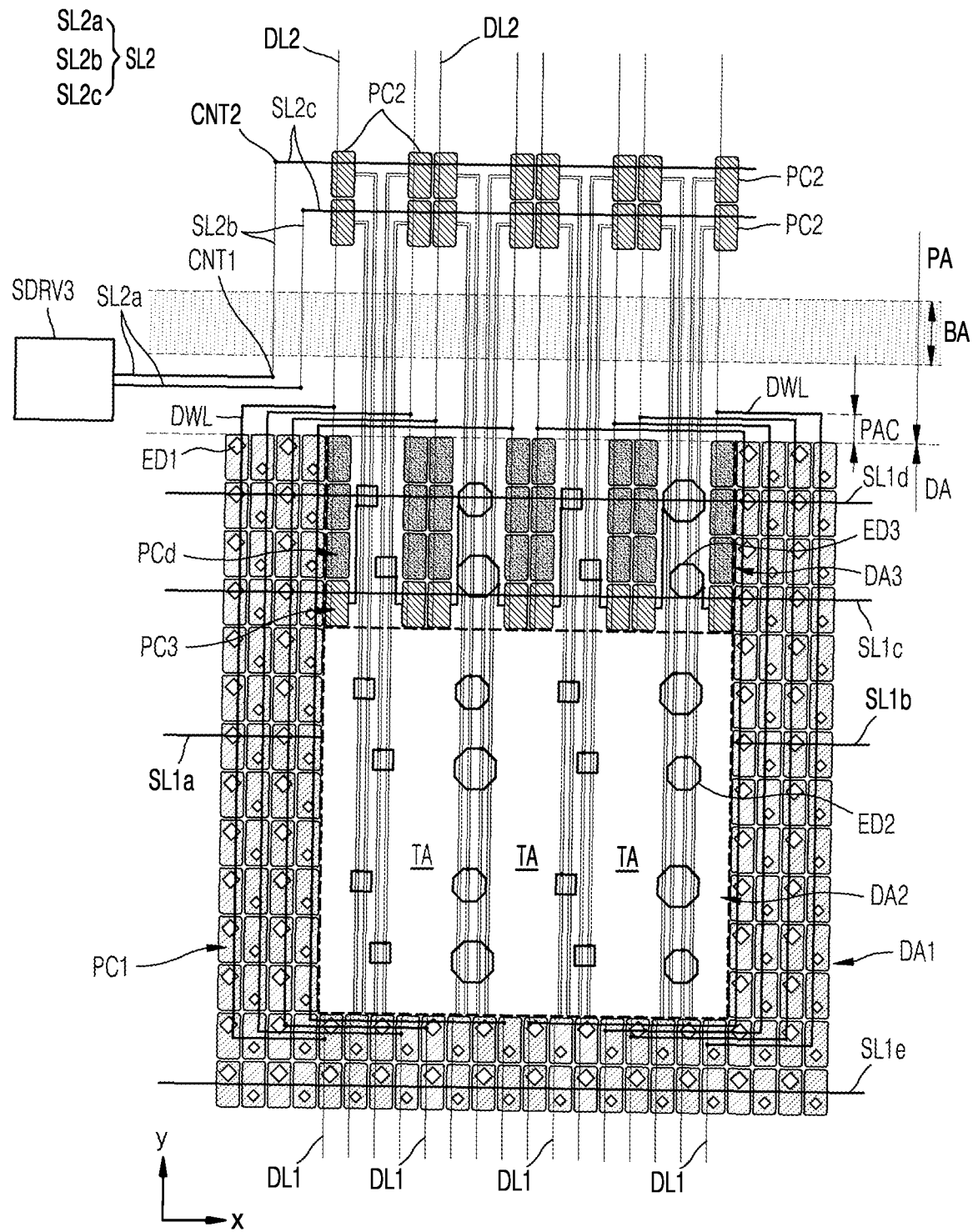
FIGS. 20 and 21 are plan views of a portion of a display panel, according to some embodiments.
Figure 21:
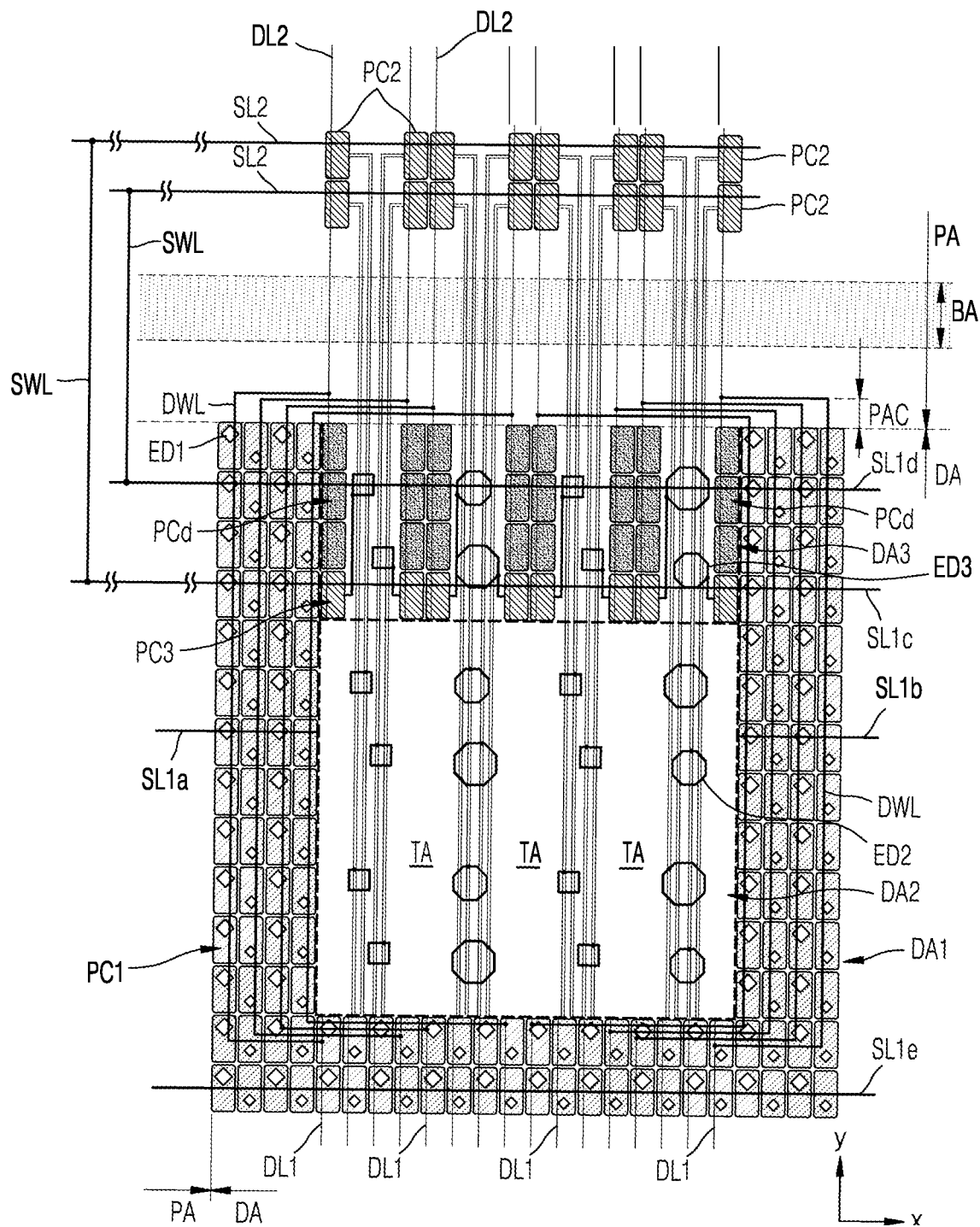

FIGS. 20 and 21 are plan views of a portion of a display panel, according to some embodiments.

Descriptions regarding FIGS. 20 and 21 are the same as those regarding FIG. 7 or 8 in that the bending area BA is on one side of the peripheral area PA and the conductive bus line CBL is arranged via the bending area BA. FIGS. 20 and 21 illustrate connection structures of data lines and scan lines in detail. Hereinafter, the descriptions already provided will not be repeated, and a difference will be mainly described.

The second sub-pixel circuit PC2 may be electrically connected to the third scan driving circuit SDRV3. A scan signal generated by the third scan driving circuit SDRV3 may be applied to the second sub-pixel circuit PC2 through a scan line electrically connected to the second sub-pixel circuit PC2. The second sub-pixel circuit PC2 may be electrically connected to any one of the data lines connected to the first sub-pixel circuit PC1 arranged in the first display area DA1.

The third sub-pixel circuit PC3 may be electrically connected to the first scan driving circuit SDRV1 and/or the second scan driving circuit SDRV2. The third sub-pixel circuit PC3 may share the scan line with the first sub-pixel circuits PC1 arranged in the same row. For example, the first scan driving circuit SDRV1 and/or the second scan driving circuit SDRV2 may be configured to respectively apply, through the scan line SL, scan signals to the first sub-pixel circuits PC1 and the third sub-pixel circuits PC3 arranged in the same row in the first direction. The third sub-pixel circuit PC3 may be electrically connected to any one of the data lines connected to the first sub-pixel circuit PC1 arranged in the first display area DA1.

FIG. 20 is a plan view of a portion of a display panel according to some embodiments and illustrates signal lines connected to the first to third sub-pixel circuits PC1 to PC3. FIG. 20 illustrates the same pixel arrangement as that illustrated in FIG. 7.

Referring to FIG. 20, the scan lines in the display area DA may extend in the first direction (e.g., the x direction) and may be electrically connected to pixel circuits arranged in the same row. Because the second display area DA2 includes the transmission area TA, some scan lines may be separated with respect to the second display area DA2.

The first sub-pixel circuits PC1, which are arranged on both sides of the second display area DA2 with respect to the second display area DA2 in the first display area DA1, may be electrically connected to different scan lines. For example, the first sub-pixel circuits PC1, which are arranged on the left side of the second display area DA2 and in the same row, may be electrically connected to a scan line (hereinafter, referred to as a first scan line SL1a) arranged on the left side of the second display area DA2. On the contrary, the first sub-pixel circuits PC1, which are arranged on the right side with respect to the second display area DA2 in the first display area DA1, may be electrically connected to a scan line (hereinafter, referred to as a second scan line SL1b) arranged on the right side of the display area DA2.

The first scan line SL1a and the second scan line SL1b may be separated and apart from each other with the second display area DA2 therebetween. The first scan line SL1a may be electrically connected to the first scan driving circuit SDRV1 (of FIG. 3) described with reference to FIG. 3, and the second scan line SL1b may be electrically connected to the second scan driving circuit SDRV2 (of FIG. 3).

The first and third sub-pixel circuits PC1 and PC3 arranged in the same row may be connected to the same scan line. The first and third sub-pixel circuits PC1 and PC3 arranged in the same row may be electrically connected to a scan line (hereinafter, a third scan line SL1c). The third scan line SL1c may pass the first display area DA1 and the third display area DA3.

Similarly, as described above with reference to FIG. 8, when the dummy sub-pixel circuits PCd are arranged in the third display area DA3, the first sub-pixel circuits PC1 and the dummy sub-pixel circuits PCd arranged in the same row may be connected to the same scan line. For example, the first sub-pixel circuits PC1 and the dummy sub-pixel circuits PCd arranged in the same row may be electrically connected to a scan line (hereinafter, a fourth scan line SL1d). The fourth scan line SL1d may pass the first display area DA1 and the third display area DA3.

Referring back to FIG. 20, a scan line (hereinafter, a fifth scan line SL1e) passing only the first display area DA1 may be electrically connected to the first sub-pixel circuits PC1 arranged in the same row and may be configured to provide a scan signal. It is illustrated that the fifth scan line SL1e arranged under the second display area DA2 of the display area DA and in the same row is electrically connected to the first sub-pixel circuits PC1 that are continuously arranged in the same row.

The second sub-pixel circuits PC2 arranged in the peripheral area PA and in the same row may be connected to the same scan line. FIG. 20 illustrates a scan line (hereinafter, a sixth scan line SL2) passing the peripheral area PA. Unlike the first to fifth scan lines SL1a, SL1b, SL1c, SL1d, and SL1e passing the display area DA and configured to receive signals from the first scan driving circuit SDRV1 or the second scan driving circuit SDRV2, the sixth scan line SL2 may be configured to receive a signal from the third scan driving circuit SDRV3.

The sixth scan line SL2 may include a first portion SL2a and a third portion SL2c extending in the first direction (e.g., the x direction) and a second portion SL2b extending in the second direction (e.g., the y direction). The first portion SL2a may be connected to the third scan driving circuit SDRV3, and the third portion SL2c may be connected to the second sub-pixel circuits PC2 arranged in the same row. The second portion SL2b may cross the bending area BA. One side of the second portion SL2b may contact the first portion SL2a, and the other side of the second portion SL2b may contact the third portion SL2c.

According to some embodiments, the first portion SL2a and the third portion SL2c may be on the same layer, and the second portion SL2b may be on a different layer with an insulating layer between the second portion SL2b and the first and third portions SL2a and SL2c. The second portion SL2b may be connected to the first portion SL2a and the third portion SL2c through contact holes CNT1 and CNT2 defined in the insulating layer. In this case, the first portion SL2a and the third portion SL2c may include the same material, and the second portion SL2b may include a different material from the first portion SL2a and the third portion SL2c. Because the second portion SL2b crosses the bending area BA, the second portion SL2b may include a material that is robust to the stress. For example, the first portion SL2a and the third portion SL2c may include the same material as the first gate electrode G1 or the upper electrode CE2 of the silicon thin film transistor S-TFT described with reference to FIG. 6, and the second portion SL2b may include the same material as the source electrode S1 and the drain electrode D1 of the silicon thin film transistor S-TFT described with reference to FIG. 6 or the same material as the contact metal CM.

The data lines may extend in the second direction (e.g., the y direction) and may be electrically connected to pixel circuits arranged in the same column. Because the second display area DA2 includes the transmission area TA, some data lines may be apart from each other with respect to the second display area DA2.

The data lines may include a first data line DL1 connected to the first sub-pixel circuits PC1 and a second data line DL2 connected to the second sub-pixel circuits PC2 and the third sub-pixel circuit PC3. The first data line DL1 may pass the first display area DA1, but the second data line DL2 may pass the third display area DA3 and the peripheral area PA.

The first data line DL1 may extend in the second direction (e.g., the y direction) and may be connected to the first sub-pixel circuits PC1 arranged in the same column. The second data line DL2 may extend in the second direction (e.g., the y direction) and may be connected to the second sub-pixel circuits PC2, the third sub-pixel circuits PC3, and the dummy sub-pixel circuits PCd arranged in the same column.

The first data line DL1 and the second data line DL2 may be separated and apart from each other with the second display area DA2 therebetween. The first data line DL1 and the second data line DL2 may be connected to a data connection wire DWL. Therefore, the same signal may be applied to the first sub-pixel circuit PC1, the second sub-pixel circuit PC2, and the third sub-pixel circuit PC3 arranged in the same column.

The data connection wire DWL may bypass the second display area DA2. The data connection wire DWL may electrically contact the first data line DL1 in the first display area DA1 and may electrically contact the second data line DL1 in a connection area PAC of the peripheral area PA that is the most adjacent to the third display area DA3. The connection area PAC may be between groups of the third sub-pixel circuit PC3 and the dummy sub-pixel circuits PCd, which are arranged in the third display area DA3, and a group of the second sub-pixel circuits PC2 arranged in the peripheral area PA.

The data connection wire DWL may be on a different layer from the first data line DL1 and the second data line DL2 and may be connected to each of the first data line DL1 and the second data line DL2 through a contact hole.

Referring to FIG. 21, the structures of the data lines are the same as those described above with reference to FIG. 20. The scan lines may include the first to fifth scan lines SL1a, SL1b, SL1c, SL1d, and SL1e passing the display area, and the structures of the scan lines are the same as those described above with reference to FIG. 20 (and FIG. 8). According to the embodiments described above with reference to FIG. 20, the display panel includes the third scan driving circuit SDRV3 (of FIG. 20) configured to transmit a signal to the sixth scan line SL2 passing the peripheral area PA, but according to the embodiments described with reference to FIG. 21, the display panel may not include a third scan driving circuit.

Referring to FIG. 21, the sixth scan line SL2, which is connected to the second sub-pixel circuits PC2 arranged in the same row in the peripheral area PA, may be electrically connected, by the scan connection line SWL, to a scan line passing the display area DA. FIG. 21 illustrates that the sixth scan line SL2 is connected to the third scan line SL1c by the scan connection line SWL. The scan connection line SWL may be arranged in the peripheral area PA.

Because the scan connection line SWL extends in the second direction (e.g., the y direction), the scan connection line SWL may cross the bending area BA. According to some embodiments, the scan connection line SWL may be on a different layer from the sixth scan line SL2, as described above with reference to FIG. 20. In this case, the scan connection line SWL may have the same structure as the second portion SL2b of the sixth scan line SL2 described above with reference to FIG. 20.

Figure 22:
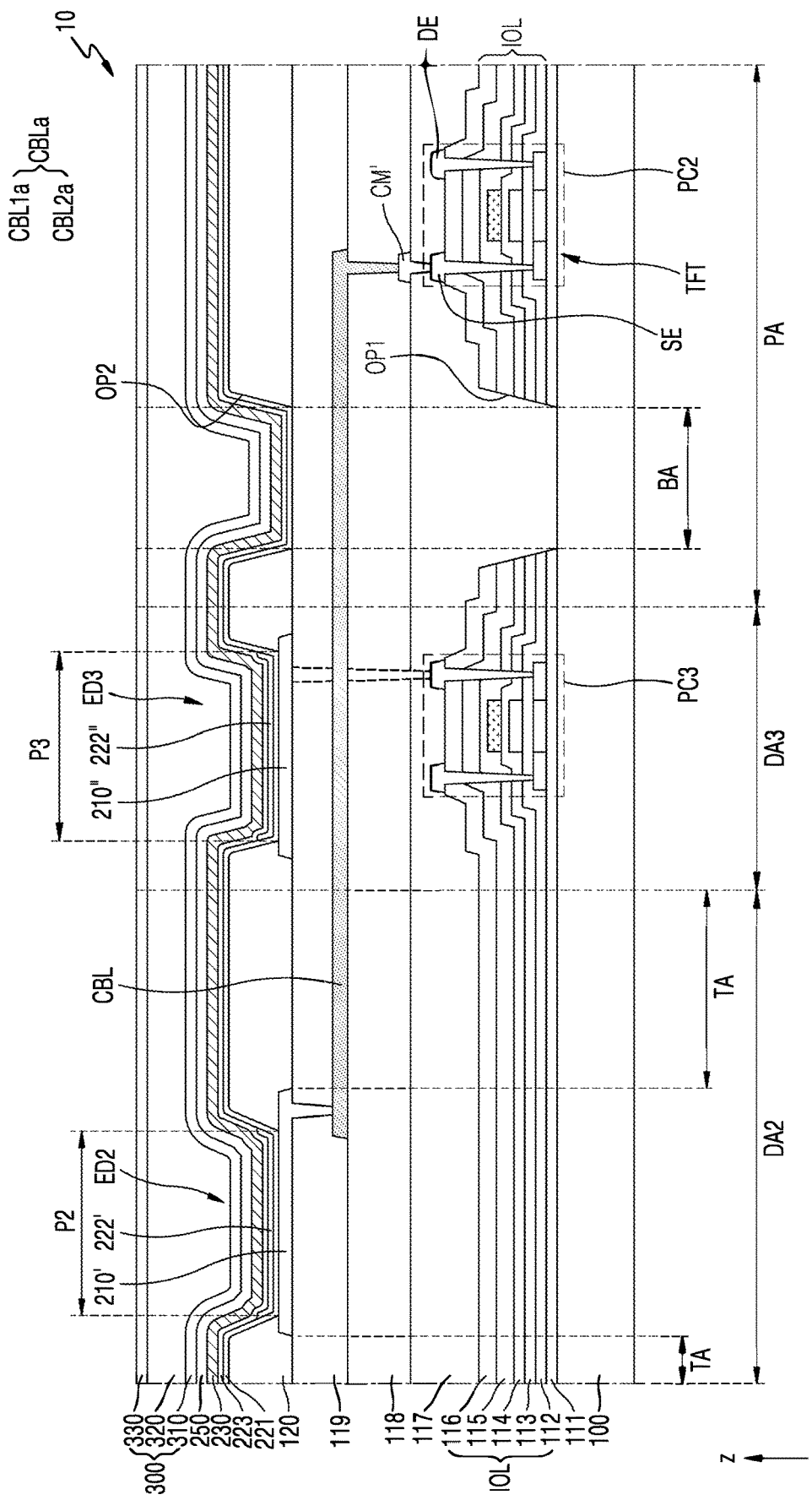
FIGS. 22 and 23 are cross-sectional views illustrating portions connected to a second display area, a third display area, and a peripheral area of a display panel, according to some embodiments.
Figure 23:
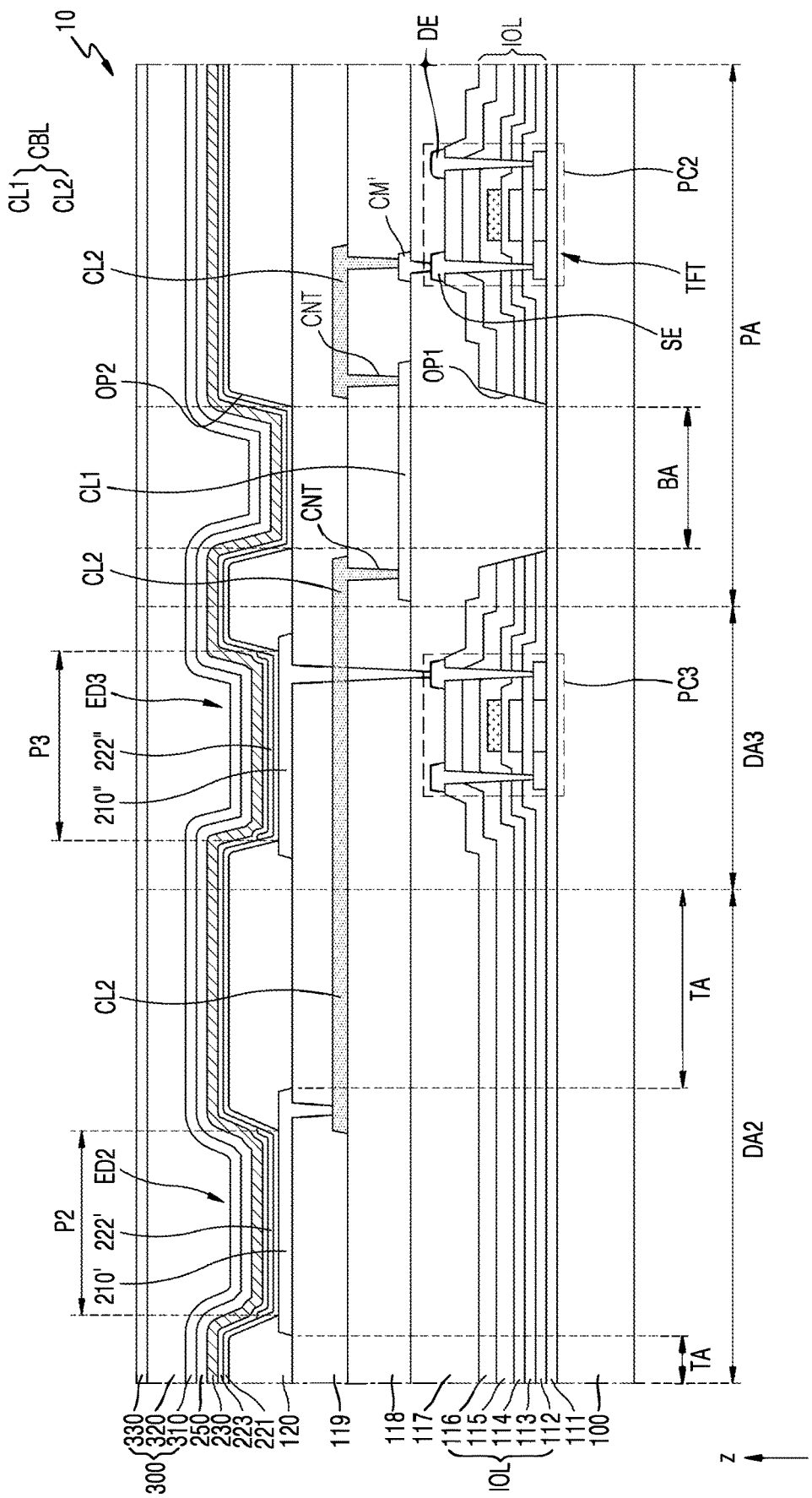

FIGS. 22 and 23 are cross-sectional views illustrating portions connected to a second display area, a third display area, and a peripheral area of a display panel, according to some embodiments.

FIG. 22 illustrates the second light-emitting element ED2, the second sub-pixel circuit PC2, the third light-emitting element ED3, and the third sub-pixel circuit PC3. Because a stack structure of FIG. 22 is the same as the structure described above with reference to FIG. 6, detailed descriptions of respective layers refer to the descriptions provided with reference to FIG. 6.

Referring to FIG. 22, various stack structures are arranged on the substrate 100, as described above with reference to FIG. 6. The second light-emitting element ED2 may be arranged in the second display area DA2, and the second sub-pixel circuit PC2 may be arranged in the peripheral area PA. The second sub-pixel circuit PC2 may be electrically connected to the second light-emitting element ED2 through the conductive bus line CBL.

The conductive bus line CBL may cross the bending area BA and may be arranged over the peripheral area PA, the third display area DA3, and the second display area DA2.

FIG. 22 illustrates that the conductive bus line CBL includes one conductive layer, and the illustration of FIG. 22 may correspond to the structure described above with reference to FIG. 7, 8, or the like.

Referring to FIG. 23, the conductive bus line CBL may include the first conductive line CL1 corresponding to the bending area BA and the second conductive line CL2 arranged in the peripheral area PA other than the bending area BA. The first conductive line CL1 may contact the second conductive line CL2 through the contact hole CNT. According to some embodiments, the first conductive line CL1 may partially extend from the bending area BA to the peripheral area PA, and the contact hole CNT may be in the peripheral area PA adjacent to the bending area BA.

According to some embodiments, the first conductive line CL1 may be on a different layer from the second conductive line CL2. FIG. 23 illustrates that the first conductive line CL1 may be on the first planarization layer 117, and the second conductive line CL2 may be on the second planarization layer 118. However, one or more embodiments are not limited thereto. For example, the first conductive line CL1 may be on the same layer and may include the same material as the source electrode SE or the drain electrode DE of the thin film transistor TFT included in one sub-pixel circuit (e.g., the second sub-pixel circuit PC2), or the first conductive line CL1 may include the same material as a contact metal CM' and the second conductive layer 1710 on the first planarization layer 117. Detailed configurations of the first conductive line CL1 and the second conductive line CL2 are the same as those described with reference to FIGS. 9A, 9B, and 11.

As described above with reference to FIG. 9A or 11, the first opening OP1 and the second opening OP2 may be included corresponding to the bending area BA. The first opening OP1 may be a portion from which the inorganic insulating layer IOL corresponding to the bending area BA is removed. To this end, the stress applied to the inorganic insulating layer IOL in the bending area BA may be relieved, and cracks may be prevented from appearing in the inorganic insulating layer IOL, wherein the cracks are generated because of the bending of the display panel.

The second opening OP2 may be a portion from which the pixel-defining layer 120 corresponding to the bending area BA is removed. According to some embodiments, as described above with reference to FIG. 9B, the second opening OP2 may not be included.

Referring to FIGS. 22 and 23, the encapsulation layer 300 is arranged on the upper layer 250. The encapsulation layer 300 may be arranged in the first display area DA1 described above with reference to FIG. 6 and may cover the entire display area DA. A portion of the encapsulation layer 300 may extend to the peripheral area PA. As illustrated in FIGS. 22 and 23, the encapsulation layer 300 may be in the bending area BA of the peripheral area PA. According to some embodiments, the encapsulation layer 300 may not be arranged in the bending area BA of the peripheral area PA.

According to the one or more embodiments, a configuration regarding a display panel including a transmission area in a display area and an electric apparatus including the display panel is provided. The scope of the present disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:
1. A display panel comprising:
a display area comprising:
a first display area, where a plurality of first light-emitting elements are arranged;
a second display area, where a plurality of second light-emitting elements and a transmission area are arranged; and
a third display area, where a plurality of third light-emitting elements are arranged;
a peripheral area at an outer side of the display area and comprising a bending area;
a plurality of first sub-pixel circuits in the first display area and electrically connected to the plurality of first light-emitting elements, respectively;
a plurality of second sub-pixel circuits electrically connected to the plurality of second light-emitting elements, respectively; and
a plurality of third sub-pixel circuits electrically connected to the plurality of third light-emitting elements, respectively,
wherein the plurality of second sub-pixel circuits are in the peripheral area, and the bending area is between the plurality of second sub-pixel circuits and the display area.
2. The display panel of claim 1, wherein the plurality of third pixel circuits are in the third display area.
3. The display panel of claim 1, wherein at least some of the plurality of third pixel circuits are in the peripheral area.
4. The display panel of claim 1, further comprising:
a buffer layer in the display area and the peripheral area;
an inorganic insulating layer on the buffer layer; and
a planarization layer on the inorganic insulating layer,
wherein the inorganic insulating layer comprises a first opening corresponding to the bending area.
5. The display panel of claim 4, wherein at least a portion of the planarization layer is buried in the first opening of the inorganic insulating layer.
6. The display panel of claim 4, further comprising a pixel-defining layer on the planarization layer and comprising a light-shielding material,
wherein the pixel-defining layer comprises a second opening corresponding to the bending area.
7. The display panel of claim 1, wherein the plurality of second sub-pixel circuits are electrically connected to the plurality of second light-emitting elements by a plurality of first conductive bus lines crossing the bending area, which is between the peripheral area and the second display area, and the third display area.
8. The display panel of claim 7, wherein the plurality of first conductive bus lines comprise a first conductive line in the bending area and a second conductive line other than the first conductive line, and
the first conductive line comprises a different material from the second conductive line.
9. The display panel of claim 8, wherein the first conductive line has a higher conductivity than the second conductive line, and
the second conductive line has a higher light transmittance than the first conductive line.

10. The display panel of claim 9, wherein the first conductive line comprises a metal material, and the second conductive line comprises transparent conducting oxide.

11. The display panel of claim 10, wherein the first conductive line comprises at least one of aluminum (Al) or titanium (Ti).

12. The display panel of claim 8, wherein the first conductive line and the second conductive line are on different layers with an insulating layer therebetween and are connected to each other through a contact hole defined in the insulating layer in the peripheral area that is adjacent to the bending area.

13. The display panel of claim 1, further comprising a notch portion on one side of the peripheral area.

14. The display panel of claim 13, wherein the notch portion is configured to correspond to the second display area with the bending area in a bent position.

15. A display panel comprising:
a display area comprising:
  a first display area, where a plurality of first light-emitting elements are arranged;
  a second display area, where a plurality of second light-emitting elements and a transmission area are arranged; and
  a third display area, where a plurality of third light-emitting elements are arranged;
a peripheral area at an outer side of the display area and comprising a bending area;
a plurality of first sub-pixel circuits in the first display area and electrically connected to the plurality of first light-emitting elements, respectively;
a plurality of second sub-pixel circuits electrically connected to the plurality of second light-emitting elements, respectively; and
a plurality of third sub-pixel circuits electrically connected to the plurality of third light-emitting elements, respectively,
wherein the plurality of first sub-pixel circuits are in the first display area,
the plurality of second sub-pixel circuits are in the third display area, and
the plurality of third sub-pixel circuits are in the peripheral area.

16. The display panel of claim 15, wherein the plurality of second sub-pixel circuits are electrically connected to the plurality of second light-emitting elements by a plurality of first conductive bus lines over the second display area and the third display area.

17. The display panel of claim 15, wherein the plurality of third sub-pixel circuits are electrically connected to the plurality of third light-emitting elements by a plurality of second conductive bus lines crossing the bending area that is between the peripheral area and the third display area.

18. An electric apparatus comprising:
a display panel comprising:
  a first display area, where a plurality of first light-emitting elements are arranged;
  a second display area, where a plurality of second light-emitting elements and a transmission area are arranged; and
  a third display area, where a plurality of third light-emitting elements are arranged; and
a component overlapping the transmission area of the display panel,
wherein the display panel comprises:
a plurality of first sub-pixel circuits in the first display area and electrically connected to the plurality of first light-emitting elements, respectively;
a plurality of second sub-pixel circuits electrically connected to the plurality of second light-emitting elements, respectively; and
a plurality of third sub-pixel circuits electrically connected to the plurality of third light-emitting elements, respectively,
wherein the plurality of second sub-pixel circuits are in a peripheral area, and a bending area is between the plurality of second sub-pixel circuits and the display areas.

19. The electric apparatus of claim 18, further comprising:
a buffer layer in a display area from among the display areas and the peripheral area;
an inorganic insulating layer on the buffer layer; and
a planarization layer on the inorganic insulating layer,
wherein the inorganic insulating layer comprises a first opening corresponding to the bending area.

20. The electric apparatus of claim 19, wherein at least a portion of the planarization layer is buried in the first opening.

21. The electric apparatus of claim 20, further comprising a pixel-defining layer on the planarization layer and comprising a light-shielding material,
wherein the pixel-defining layer comprises a second opening corresponding to the bending area.

22. The electric apparatus of claim 18, wherein the plurality of second light-emitting elements are electrically connected to the plurality of second sub-pixel circuits by a plurality of first conductive bus lines crossing the bending area that is between the peripheral area and the second display area.

23. The electric apparatus of claim 22, wherein the plurality of first conductive bus lines comprise a first conductive line in the bending area and a second conductive line other than the first conductive line, and
the first conductive line comprises a different material from the second conductive line.

24. The electric apparatus of claim 23, wherein the first conductive line has a higher conductivity than the second conductive line, and
the second conductive line has a higher light transmittance than the first conductive line.

25. The electric apparatus of claim 24, wherein the first conductive line comprises a metal material, and the second conductive line comprises transparent conducting oxide.

* * * * *